US006638686B2

(12) United States Patent
Sawada et al.

(10) Patent No.: US 6,638,686 B2
(45) Date of Patent: Oct. 28, 2003

(54) PLANOGRAPHIC PRINTING PLATE

(75) Inventors: Hirokazu Sawada, Shizuoka-ken (JP); Hisashi Hotta, Shizuoka-ken (JP); Akio Uesugi, Shizuoka-ken (JP); Hirokazu Sasaki, Shizuoka-ken (JP); Tadashi Endo, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/730,842

(22) Filed: Dec. 7, 2000

(65) Prior Publication Data

US 2001/0041305 A1 Nov. 15, 2001

(30) Foreign Application Priority Data

Dec. 9, 1999 (JP) .......................................... 11-349887
Dec. 9, 1999 (JP) .......................................... 11-349888
Mar. 17, 2000 (JP) ...................................... 2000-075486
Mar. 17, 2000 (JP) ...................................... 2000-075873

(51) Int. Cl.[7] .......................... B41N 1/08; C22C 21/00; G03F 7/09

(52) U.S. Cl. .................... 430/278.1; 430/944; 430/945; 430/964; 430/947

(58) Field of Search .............................. 430/278.1, 944, 430/945, 964, 947

(56) References Cited

U.S. PATENT DOCUMENTS 4,360,401 A * 11/1982 Gray .......................... 430/302
4,833,065 A * 5/1989 Nakanishi et al. ....... 430/278.1
4,861,396 A * 8/1989 Matsuo et al. .............. 101/459
5,756,258 A * 5/1998 Yamaoka et al. ........ 430/281.1
6,010,816 A * 1/2000 Nishio et al. ............ 430/278.1
6,305,283 B1 * 10/2001 Verschueren et al. ....... 101/453
6,305,383 B1 * 10/2001 Verschueren et al. ....... 101/453

FOREIGN PATENT DOCUMENTS

EP 0097318 A2 1/1984
EP 0158941 A2 10/1985
EP 0942071 A1 9/1999

* cited by examiner

*Primary Examiner*—Cynthia Hamilton
(74) *Attorney, Agent, or Firm*—Burns, Doane, Swecker & Mathis, LLP

(57) ABSTRACT

A planographic printing plate precursor comprising:

an aluminum substrate which has been subjected to a roughening treatment and an anodizing treatment; and a photosensitive layer which provided on a surface of said substrate, and which contains an infrared absorbing agent and a water-insoluble and alkali aqueous solution-soluble polymer compound, and whose solubility in an alkali developing solution varies by infrared laser exposure, wherein said substrate is obtained by electrochemically roughening an aluminum alloy plate which contains a trace amount of certain elements to an aluminum alloy of high purity.

11 Claims, 7 Drawing Sheets

PLANOGRAPHIC PRINTING PLATE

BACKGROUND OF THE INVENTION

1. Field of the Invention

The present invention relates to a planographic printing plate precursor, and more particularly, to a planographic printing plate for laser plate production.

2. Description of the Related Art

Recently, with development of image forming technologies, attention has been focused on technologies for forming letter manuscripts, images and the like directly on the surface of a plate, while scanning the plate with laser beams restricted narrowly, to produce a plate directly without using a film.

As such an image forming material, there are listed a so-called thermal type positive type planographic printing plate in which an infrared absorbing agent present in a photosensitive layer generates heat upon exposure by exhibiting its light-heat converting action, and exposed portions of the photosensitive layer are solubilized by the generated heat to form positive images, and a thermal type negative type planographic printing plate of in which a radical generator and an acid generator generate a radical and an acid due to heat, and a radical polymerization reaction and an acid crosslinking reaction occur, causing insolubilization of exposed portions of the photosensitive layer, to form negative images. In such thermal type image formation, laser light irradiation causes a light-heat converting substance in a photosensitive layer to generate heat which causes an image formation reaction.

A planographic printing plate precursor which enables laser plate printing (direct type planographic printing plate precursor) is generally manufactured by roughening the surface of an aluminum plate which is in the form of a wave, carrying out an anodizing treatment on the surface, and then applying thereon a photosensitive layer coating solution and drying it, to form a photosensitive layer. Then, the planographic printing plate precursor in the form of a wave is cut into a sheet of desired size, and a plurality of such sheet are stacked and then packed. Alternatively, after being stored in a state of being wound in roll form, the plate is cut into desired sizes. The packed and delivered planographic printing plate precursors are subjected to image printing by laser exposure and to developing processing, and are then set at a printer.

However, an aluminum substrate which has been roughened and on which an anodized film has been formed essentially has the problem of low sensitivity for the following reason. Because the substrate has heat conductivity which is extremely high as compared with that of the photosensitive layer, heat generated in a vicinity of the interface between the photosensitive layer and the substrate is diffused into the substrate before being used for forming images sufficiently, resultantly. As a result, the decomposition reaction of the positive photosensitive layer is insufficient at the interface between the photosensitive layer and the substrate, and a film remains at the non-image parts.

Further, there is also the problem that although such a thermal type recording layer must contain an infrared absorbing agent having light-heat converting ability, such agents have poor solubility due to their relatively large molecular weight, and adhere to micro openings in the anodized substrate and are difficult to be removed therefrom. Therefore, a film tends to remain in a developing process using an alkali developing solution.

For coping with this problem, various primers have been studied, for improving the developing property of the photosensitive layer at the interface between the substrate and the photosensitive layer, in the case of a positive photosensitive layer. However, a sufficiently satisfactory level has not been attained in any case.

When roughening of a substrate is non-uniform, the tight contact between the photosensitive layer and the substrate also decreases. When the close fit between the photosensitive layer and the substrate decreases, the ability to withstand repeated printings of a planographic printing plate after plate production is lowered. Particularly, with a photosensitive layer of a direct writing type planographic printing plate, it is difficult to ensure close contact with a substrate as compared with a photosensitive layer of a planographic printing plate requiring a plate production film in the production thereof. Thus, an improvement in the ability to withstand repeated printings is desired.

Further, recently, sensitive materials which are activated by a shorter wavelength as compared with conventional products which are activated by wavelengths around 500 nm have been studied for enabling work under a safe light of a bright red color. However, in the photosensitive printing plate which is activated by a short wavelength of 450 nm or less and is described in Japanese Patent Application No. 11-209822 and has been newly developed recently, light absorption of an anodized film at an exposure wavelength of 450 nm or less is low as compared with the absorption at wavelengths around 500 nm. Therefore, in conducting laser image writing on a printing plate, the plate tends to be affected by light diffusion, and a thin image portion called a fringe is formed around each halftone dot. Consequently, a problem occurs that the halftone dot on the whole becomes bolder, and the halftone dot area ratio increases.

In this case, it is advisable to further increase the light absorption of the anodized film, and to this end, it is necessary to raise the volume proportion of the anodized film itself by decreasing the pore diameter of fine pores called micropores existing in the anodized film, or by decreasing the number of pores per unit area. However, on the other hand, since the micropores of an anodized film of aluminum result in close contact by holding the photosensitive layer by an anchor effect, a decrease in the size of the micropores or a decrease in the number of micropores per unit area thus deteriorates the close contact with the photosensitive layer, such that the structure cannot be used in actual practice. Therefore, for obtaining close contact by the substrate, the presence of a certain amount of micropores is necessary. Until now, there has been no way other than sacrificing halftone dot quality and reproducibility in order to form an image and using it as a printing plate.

In addition, in the above-described packaging of direct writing type planographic printing plate precursors, it is necessary to precisely stack the plurality of planographic printing plate precursors cut to the same given size. To this end, it is necessary to precisely convey the plurality of planographic printing plate precursors cut into the same given size. For the conveying, a belt conveyer is usually used. However, there is the problem that a planographic printing plate precursor may slip, and accurate conveying and stacking are difficult. Further, though conveying belts and conveying rollers are used for laser image writing, development, printing and the like conducted by users, and also for the transfer of the planographic printing plate precursor to various processes, there is a problem that the planographic printing plate precursor may slip and accurate conveying and stacking are difficult with these conveying belts and conveying rollers as well. Particularly in laser exposure, extremely high positioning accuracy is required, and therefore, poor conveying invites not only a reduction in productivity but also a reduction in the quality of formed images. Also, in developing processing, a automatic conveying type developing machine are used in almost all cases, and there is a great demand to overcome the problem of poor conveying during the developing process as well.

SUMMARY OF THE INVENTION

An object of the present invention is to provide a direct writing type planographic printing plate precursor which can overcome the above-described various problems.

The present inventors conducted intensive studies, and found that the above-described object can be attained by using an aluminum substrate having specific properties, and thus arrived at the present invention.

A planographic printing plate precursor of the present invention comprises: an aluminum substrate which has been subjected to a roughening treatment and an anodizing treatment; and a photosensitive layer which is provided on a surface of the substrate, and which contains an infrared absorbing agent and a water-insoluble and alkali aqueous solution-soluble polymer compound, and whose solubility in an alkali developing solution varies by infrared laser exposure; wherein the substrate is obtained by electrochemically roughening an aluminum alloy plate which contains 0.05 to 0.5% by weight of Fe, 0.03 to 0.15% by weight of Si, 60 to 300 ppm of Cu, 100 to 400 ppm of Ti and 10 to 200 ppm of Mg, contains 1 to 100 ppm of at least one element selected from the group of elements consisting of Li, Na, K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po, and has an aluminum purity of 99.0% by weight or more.

As a result of various studies, the present inventors found that by adding a trace amount of at least one of the above-listed elements to an aluminum alloy of high purity, uniform roughening can be achieved when carrying out an electrochemical roughening treatment, and thus arrived at the present invention.

In a given aspect, in order to achieve the above-described object, the planographic printing plate of the present invention comprises the above-described substrate and the above-described photosensitive layer, and the substrate has at least one of following features (a) and (b):

(a) the substrate has an average roughness Ra at the center line of 0.5 $\mu$m or less, and has a surface area of 2 times to 30 times a unit surface area, (b) micropores present in an anodized film on the above-described substrate have a pore diameter of 1 to 5 nm and a pore density of $8\times10^{15}$ to $2\times10/m^2$.

The aluminum substrate (a) having a surface area which is 2 times to 30 times a unit surface area can be easily obtained by a method in which a micropore sealing treatment is conducted after the anodizing treatment, or other methods. According to the present invention, by decreasing the surface roughness Ra of a roughened substrate, the thickness of the coated photosensitive layer is uniform, local formation of the thick photosensitive layer regions in which heat generation by laser light absorption does not easily occur is prevented, and sensitivity can be efficiently enhanced.

Usually, a surface area obtained by actual measurement is from 40 to 100 times the apparent surface area of a surface which is used for printing and which has been roughened by anodized film used as a substrate for a planographic printing plate. However, in the present invention, by making the relation therebetween fall in a range from 2 to 30 times and thus decreasing the surface area, the depth and size of micropores in the anodized film layer are controlled. Absorption of an infrared absorbing agent having a large molecular weight, and formation of a photosensitive layer which invades into deep parts of the micropores and is not removed easily by a developing solution can be prevented. Generation of residual film is suppressed, and the micropores in the anodized film layer work as independent heat insulation layers respectively. Consequently, heat conductivity at the interface of the photosensitive layer and the substrate decreases, and generated heat is efficiently used for an image formation reaction, thus leading to enhancement of sensitivity.

Conventionally, there is also a method used in some cases, wherein the surface area of a substrate for a printing plate is decreased by a micropore sealing treatment using a pressurized water vapor treatment or a hot water treatment for the purpose of decreasing remaining color. However, the effect obtained by the present invention cannot be obtained merely by a micropore sealing treatment. In the present invention, the excellent effect of the present invention can be attained by controlling the surface area of the substrate to fall within a range of 2 to 30 times the apparent surface area, by use of a micropore sealing treatment or another treatment method. Further, it has been found that by controlling the surface roughness (Ra) to fall in the preferable range of less than 0.5 $\mu$m, local reduction in sensitivity due to non-uniform thickness of the photosensitive layer can be suppressed, and uniform high sensitivity over the entire region of the photosensitive layer can be attained.

Further, a given aspect of the planographic printing plate precursor of the present invention for attaining the above-described object is a planographic printing plate precursor comprising the substrate and the above-described photosensitive layer, wherein the reverse surface of the substrate has different average surface roughnesses Ra along the longitudinal direction and the transverse direction, and given that the average surface roughness Ra along the direction of the larger average surface roughness is represented by Ral and the average surface roughness Ra along the direction of the smaller average surface roughness is represented by Ras, Ral and Ras satisfy the following relational formula:

$$1.1 \leq Ral/Ras \leq 5.0$$

In the planographic printing plate precursor of the present aspect, the reverse surface of the substrate has average surface roughnesses Ra which are mutually different along the longitudinal direction and the transverse direction, and Ral and Ras satisfy the above-described relational formula. When the planographic printing plate precursor of the present aspect is conveyed by a conveyor belt or conveyor roller, different frictional forces act along the longitudinal direction and the transverse direction on the reverse surface of the substrate. Due to the action of the frictional forces which are mutually different along the longitudinal direction and the transverse direction on the reverse surface of a substrate, slipping and meandering in conveying can be effectively prevented. (Here, “meandering” means the precursor being conveyed at an angle with respect to the direction in which it should be conveyed.)

Furthermore, a given aspect of the present invention for attaining the above-described object is a planographic printing plate precusor comprising a substrate and photosensitive layer which has laser light sensitivity and id provided on the substrate, wherein the reverse surface of the substrate is subjected to a light degree of surface at least in a region located from the end of one side of the reverse surface of the substrate and having a width of 1 mm or more and 50 mm or less.

In the planographic printing plate precursor of this aspect, the reverse surface of a substrate has at least a lightly roughened region of a predetermined width at the end of one side. When the planographic printing plate precursor of this aspect is conveyed by a conveying belt or conveying roller, frictional forces which is mutually different at the lightly roughened region and non-roughened regions act on the reverse surface of the substrate. Due to the action of the large frictional force at the end of the reverse surface of the substrate, slipping and meandering during conveying can be effectively prevented.

In the planographic printing plate precursors of the above-described two aspects, when the photosensitive layer is a photosensitive layer which is scratched in a test by using a scratch tester (sapphire needle, 0.5 mmϕ) using a load of 30 g, it is preferable to form an anodized film of 0.1 $g/m^2$ or more on the reverse surface of the substrate.

When the planographic printing plate precursors of the above-described two aspects are stacked and stored, if the reverse surface comes into contact with a photosensitive layer, the photosensitive layer is not locally scratched, since the reverse surface has a certain degree of irregularity uniformly over the entire surface thereof. However, if a part of the reverse surface of one precursor is scratched, when the precursors are stacked and stored, the photosensitive layer tend to be locally scratched. The same tendency occurs also when a precursor is wound in the form of a roll and stored. Therefore, by forming an anodized film of 0.1 $g/m^2$ or more on the reverse surface, the surface hardness of the reverse surface increases, and as a result, the reverse surface is not scratched easily. When the precursors are stacked and stored or when wound in the form of a roll and stored, scratching of the photosensitive layer can be prevented.

BRIEF DESCRIPTION OF THE DRAWINGS

In FIG. 3, 20 is an anodizing treatment apparatus; 22 is a feeding part; 24 is an electrolysis part; 26 is an electrolyte; 28 is a feeding electrode; 30 is an aluminum web; 32 is an electrolyte; 34 is an electrolysis electrode; and 36 is a conveyance roller.

In FIG. 6, 1 is an aluminum plate; each of 2 and 4 is a rolling brush; 3 is a pumice or silica slurry; and each of 5, 6, 7 and 8 is a supporting roller.

In FIG. 7, 11 is an aluminum web; each of 62*a–b* is a feeding part; each of 63*a–b* is an electrolysis part; each of 64*a–b* is a pair of rollers; each of 65*a–b* is a feeding electrode; each of 66*a–d* is an electrolysis electrode; and each of 67*a–d* is an electric source.

DETAILED DESCRIPTION OF THE INVENTION

Figure 1A:
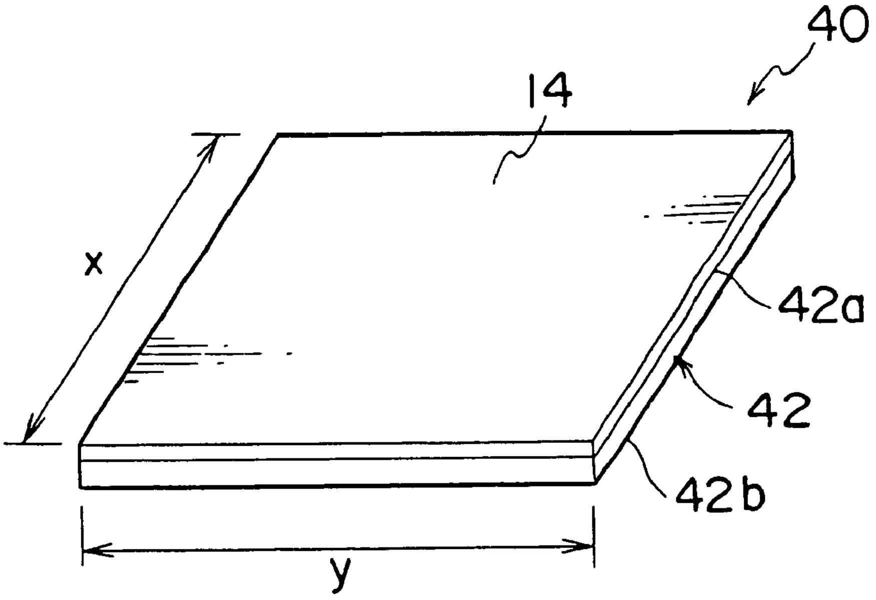
FIGS. 1A and 1B are perspective views of another embodiment of a planographic printing plate precursor of the present invention.

The present invention will be illustrated in detail below.

Aluminum Substrate

The aluminum substrate used in the present invention is a substrate containing a metal consisting essentially of aluminum stable in size, namely, aluminum or an aluminum alloy. In addition to a pure aluminum plate, this substrate is selected from alloy plates essentially composed of aluminum and containing a trace amount of a foreign element, and plastic films or paper laminated or vapor-deposited with aluminum (alloy). Further, it may also be a composite sheet made by bonding an aluminum sheet on a polyethylene terephthalate film as described in Japanese Patent Publication (JP-B) No. 48-18327.

In the following descriptions, substrates made of aluminum or aluminum alloys or substrates having a layer made of aluminum or aluminum alloys are generically called an aluminum substrate.

Here, the aluminum substrate constituting this substrate is obtained by electrochemically roughening an aluminum alloy plate which contains 0.05 to 0.5% by weight of Fe, 0.03 to 0.15% by weight of Si, 60 to 300 ppm of Cu, 100 to 400 ppm of Ti and 10 to 200 ppm of Mg, contains 1 to 100 ppm of at least one element selected from the group of elements consisting of Li, Na, K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po, and has an aluminum purity of 99.0% by weight or more. aqueous solution-soluble polymer compound, and whose solubility in an alkali developing solution varies by infrared laser exposure; wherein the substrate is obtained by electrochemically roughening an aluminum alloy plate which contains 0.05 to 0.5% by weight of Fe, 0.03 to 0.15% by weight of Si, 60 to 300 ppm of Cu, 100 to 400 ppm of Ti and 10 to 200 ppm of Mg, contains 1 to 100 ppm of at least one element selected from the group of elements consisting of Li, Na, K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po, and has an aluminum purity of 99.0% by weight or more.

The purity of aluminum is 99.0% by weight or more, preferably 99.3% by weight or more, more preferably 99.5% by weight or more. It is preferable that the materials in an aluminum alloy used as a substrate for a planographic printing plate precursor of the present invention are confined to the above-described elements of which content is defined except for inevitable impurities. As the inevitable impurities of the aluminum alloy, Ga, V, Ni and the like are listed. It is preferable to use an aluminum alloy having a content of inevitable impurities of 0.1% by weight or less.

It is preferable that the substrate for the planographic printing plate precursor of the present invention contains 0.10 to 0.40% by weight of Fe, 0.05 to 0.10% by weight of Si, 100 to 200 ppm of Cu, 150 to 300 ppm of Ti and 40 to 180 ppm of Mg, for obtaining close contact with a photosensitive layer.

A substrate for a planographic printing plate precursor of the present invention preferably contains 1 to 100 ppm of at least one element selected from the above-described element group. When the content of the above-described element is less than 1 ppm, an effect of obtaining a uniform electrolytic roughening form is insufficient, while a content over 100 ppm is not preferably from the economical standpoint. The content of the above-described element is preferable from 5 ppm to 100 ppm, more preferably from 10 ppm to 100 ppm.

When two or more elements selected from the above-described element group are added to an aluminum alloy, contents of respective elements are controlled so that the total content thereof in a substrate is from 1 to 100 ppm.

A substrate preferable in the present invention can be produced by performing molding work of a molten bath of an aluminum alloy containing element in the above-described range. For improving the purity of an aluminum alloy, it is preferable to purify a molten bath of an aluminum alloy. As the purification treatment, there are listed, for example, flux treatment aiming at removal of an unnecessary gas such as hydrogen and the like in a molten bath; de-gassing treatment using an Ar gas, Cl gas and the like; filtering treatment using a so-called rigid media filter such as a ceramic tube filter, ceramic foam filter and the like, a filter made of alumina flake, alumina ball and the like as a filter material, a glass filter and the like, aiming at removal of insoluble substances; and the like. Further, purification treatment composed of the above-described de-gassing treatment and filtering treatment in combination may be conducted.

Elements selected from the above-described element group (hereinafter, sometimes referred to as "trace element") can be added to the above-described molten bath so that the content thereof in an aluminum alloy is in the above-described range. If the purification treatment is conducted, addition of the trace elements is preferably conducted before the purification process.

Molding work of an aluminum alloy is conducted generally by casting. As the casting method, there are listed methods utilizing fixed casting typified by a DC casting method, and methods utilizing driving casting typified by a continuous casting method. In a method utilizing fixed casting, for example, the above-described molten bath of an aluminum alloy is poured into a fixed mold to obtain an ingot, then, the ingot can be subjected to rolling and the like to form a desired form. In a method utilizing driving casting, for example, the molten bath of an aluminum alloy can be subjected to casting and rolling continuously by using twin rolls and twin belts, to be molded into a desired form.

One example of the molding method of an aluminum alloy by DC casting is shown below.

First, a molten bath of the aluminum alloy is poured into a fixed mold, and an ingot having a thickness of 300 to 800 mm is produced. The resulted ingot is subjected to facing according to an ordinary method to cut 1 to 30 mm, preferably 1 to 100 mm depth of the surface layer. Then, if necessary, soaking treatment may be conducted. When soaking treatment is conducted, heating condition is preferably set so that an intermetallic compound does not become bulky, and it is preferable to perform heating treatment at 450 to 620° C. for 1 hour or more and 48 hours or less. When shorter than 1 hour, an effect of the soaking treatment may be insufficient.

After an ingot of the aluminum alloy is subjected to soaking treatment if necessary, hot rolling and cold rolling can be conducted to obtain a rolled plate of an aluminum alloy. The initiation temperature of hot rolling preferably ranges from 350 to 500° C. After hot rolling, cold rolling is further conducted usually. It is also possible to effect intermediate annealing treatment before, after or during the cold rolling. The intermediate annealing treatment can be effected using a batch-wise annealing furnace, and in this case, an ingot is usually heated at 280° C. to 600° C. for 2 to 20 hours, desirably at 350 to 500° C. for 2 to 10 hours. The intermediate annealing treatment may also be effected using a continuous annealing furnace, and in this case, an ingot is usually heated at 400° C. to 600° C. for 360 seconds or less, desirably at 450 to 550° C. for 120 seconds or less. Heating of an ingot under a condition of 10° C./second or more using a continuous annealing furnace is preferable since then crystal structure in the resulted molded article can be made fine. When crystal structure can be made fine in hot rolling, an intermediate annealing treatment may not be conducted. By cold rolling, an aluminum alloy plate having a thickness of 0.1 to 0.5 mm is finally obtained. When the resulted aluminum alloy plate is further treated by a correcting apparatus such as a roller leveler, tension leveler and the like, planeness of an aluminum alloy is preferably improved. Further, when the plate width is required to have given width, it can be controlled into given width through a slitter line.

When a molten bath of an aluminum alloy is cast continuously, a plate body having given thickness is obtained, for example, by passing a molten bath of an aluminum alloy through between a pair of twin belts or twin rolls. In the plate body of an aluminum alloy obtained by using twin belts. Thickness can also be further reduced by a hot rolling machine. After the hot rolling, the thickness can also be reduced, subsequently, by a cold roller. Thereafter, the plate body may further be treated by heat treatment or by using a correcting apparatus, if desired. While, in the plate body obtained by using twin rolls, the thickness can be reduced from the start by a cold rolling machine without conducting the subsequent hot rolling. If necessary, intermediate annealing and correction can further be conducted.

In the cold rolling process or correcting process, it is preferable that given average surface roughness is imparted to the reverse surface (opposite side surface to side on which a photosensitive layer is provided) of an aluminum alloy plate. In the cold rolling process, the reverse surface of an aluminum alloy can be endowed with the above-described average surface roughness by transferring a pattern of a rolling roll onto the reverse surface of the aluminum alloy. Also, in the correcting process, the pattern may be transferred onto the reverse surface of a substrate by using a roll having the pattern corresponding to given surface roughness. In the above-described method, establishment of given average surface roughness is preferable since processes such as roughening treatment and the like on the reverse surface are not required to be additionally provided and a procedure can be simplified. The average surface roughnesses different along the longitudinal direction and the transverse direction of the reverse surface of the substrate can be differed by, for example, conducting cold rolling and the like using a roll having a pattern in which the average surface roughness along the rotation direction of the roll is different from the average surface roughness along vertical direction to the rotation direction of the roll.

Figure 1B:
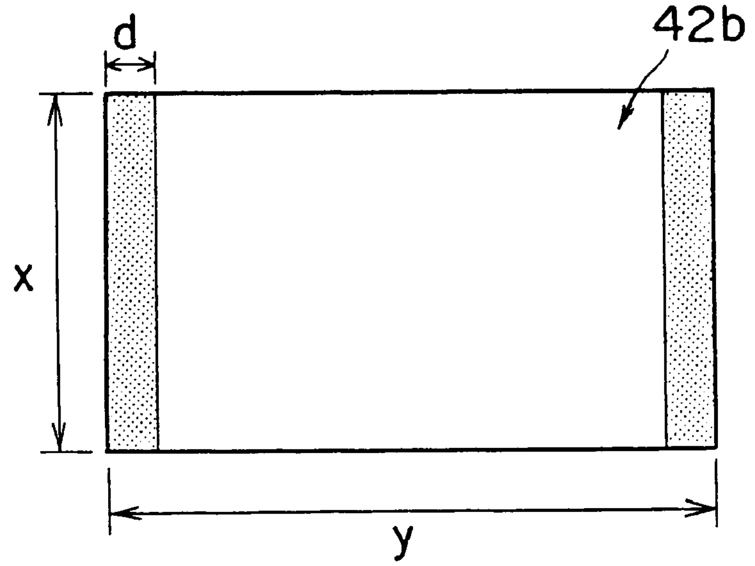

FIGS. 1A and 1B show perspective views of one embodiment of the present invention and the reverse surface of a substrate.

A planographic printing plate precursor 40 has a constitution comprising a substrate 42 and a photosensitive layer 14 of direct writing type provided on the surface 42*a* of the substrate 42. On the reverse surface 42*b* of the substrate 42, light degree of surface treatment in the form of a belt is performed, on two sides along the longitudinal direction (direction x in the figure) in regions of width d (1 mm≦d≦50 mm) from the end, as shown in FIG. 1(B). On the surface 42*a* of the substrate 42, roughening treatment and anodizing treatment have been performed, consequently, close contact between the photosensitive layer 14 and the substrate 42 is improved.

FIG. 1(B) shows an example in which light degree of surface roughening treatment is performed on both end portions at two sides along the longitudinal direction (direction x in the figure) on the reverse surface 42*b* of the substrate 42. However, the present invention is not limited to this constitution. For example, light degree of roughening treatment may be performed in a region of width d from the end only on one side along the longitudinal direction of the reverse surface 42*b*. Also, an example may be permissible in which light degree of roughening treatment in the form of a belt is performed in a region of width d from the end, on one side or two side along the transverse direction (direction y in the figure).

In a planographic printing plate precursor of this embodiment, since at least one side on the reverse surface of a substrate is roughened lightly in a region of given width from the end, troubles such as slipping, conveying failure and the like do not occur in transferring the precursor by a conveyor belt or conveyor roll to each process such as laser exposure, development, printing and the like, effected by users. Light degree of roughening treatment is performed in a region(s) located from one end or both ends along the longitudinal direction or the transverse direction on the reverse surface of a substrate and having a width of 1 mm or more and 50 mm or less. When the width is less than 1 mm, an effect of slipping prevention cannot be expected, and while, a width of over 50 mm is not economically preferable since then not only a mechanism for roughening the reverse surface becomes complicated but also cost for roughening increases. (Here, "light degree of roughening treatment" indicates the roughening treatment of more gentle condition at least as compared with that of the roughening treatment to the front surface (surface on the side on which a photosensitive layer is formed).) Namely, the average surface roughness of the region roughened on the reverse surface is at least smaller than the average surface roughness of the front surface roughened. The region which has been subjected to light degree of roughening treatment preferably has an average surface roughness (Ra) of 0.15 μm or more and 0.50 μm or less. The region which has been subjected to light degree of roughening treatment more preferably has an average surface roughness (Ra) of 0.15 μm or more and 0.40 μm or less, from the standpoint of prevention of scratching on the photosensitive layer 14 when the planographic printing plate precursor is wound in the form of a roll and stored or stacked and packed.

The aluminum alloy plate obtained by the above-described procedure is subsequently subjected to roughening treatment including electrochemical roughening treatment, then, used as the substrate for the planographic printing plate precursor. In the present invention, because the above-described trace elements are contained in given amount in an aluminum alloy, uniform electrochemical roughening treatment is possible, and close contact between the photosensitive layer and the substrate can be further improved. Electrochemical roughening treatment to the substrate is effective in improving close contact with a photosensitive layer since the treatment can form fine irregularity on the surface of a substrate, and particularly in the present invention, close contact with a photosensitive layer is further improved since fine irregularity is uniformly formed by addition of the trace elements. Further, when a planographic printing plate precursor of the present invention is applied to a writing type planographic printing plate precursor (for laser printing), close contact between a photosensitive layer and a substrate can be improved. Particularly, problems specific to direct describing type planographic printing plate precursor, such as halation and exposure failure, can be solved.

Generally, the thickness of the aluminum substrate used for the substrate of the present invention is approximately from 0.1 mm to 0.6 mm. This thickness can be varied appropriately depending on size of a printer, size of printing plate, and demands.

In order to obtain an aluminum substrate, various surface treatments described below are further applied to such an aluminum plate.

Sand Graining

An aluminum plate is treated by sand graining to give a preferable form. As the sand graining treatment method, there are mechanical sand graining, chemical etching, electrolytic grain and the like as disclosed in JP-A No. 56-28893. Further, there can be used electrochemical sand graining methods in which electrochemical sand graining is conducted in a hydrochloric acid or nitric acid electrolyte, and mechanical sand graining methods such as a wire brush grain method in which the surface of the aluminum plate is scratched by a metal wire, a ball grain method in which the surface of the aluminum plate is grained by an abrading ball and abrading agent, a brush grain method in which the surface is grained by a nylon brush and abrading agent. Those sand graining methods can be used alone or in combination.

A method for obtaining a sand-grained surface of the substrate usefully used in the present invention, among the above-described method, is the electrochemical method in which sand graining is conducted chemically in a hydrochloric acid or nitric acid electrolyte, and suitable current density is in a range of an electric quantity at an anode from 50 $C/dm^2$ to 400 $C/dm^2$. More specifically, this method is conducted in an electrolyte containing 0.1 to 50% hydrochloric acid or nitric acid under conditions of a temperature from 20 to 100° C., a treating time from 1 second to 30 minutes and a current density of 100 $C/dm^2$ to 400 $C/dm^2$, using direct current or alternating current. Electrochemical roughening is important also for improving close contact between the photosensitive layer and the substrate, since it can easily impart fine irregularity to the surface of the substrate.

By performing roughening treatment by this sand graining treatment, pits in the form of crater or honeycomb having an average diameter of about 0.5 to 20 μm can be produced on the surface of the aluminum plate at an area ratio of 30 to 100%. Pits herein provided have an effect to improve abilities of staining resistance ability and ability to withstand repeated printings of non-image parts.

In electrochemical roughening treatment, enough quantity of electricity required to providing sufficient pits onto the surface of the aluminum plate, namely, product of current and time length in which current is applied, is an important condition for the electrochemical roughening. It is also desirable from the standpoint of energy saving that sufficient pits being formed by a smaller electricity quantity. The surface roughness Ra after roughening treatment is preferably from 0.2 to 0.5 μm.

Etching Treatment

The aluminum plate thus subjected to sand graining is further chemically etched by an acid or an alkali. When an acid is used as an etching agent, longer time is required for decomposing a fine structure. This is a demerit in industrial application of the present invention. However, this problem can be improved by using an alkali as an etching agent.

As the alkali agent suitably used for the etching treatment in the present invention, for example, sodium hydroxide, sodium carbonate, sodium aluminate, sodium metasilicate, sodium phosphate, potassium hydroxide, lithium hydroxide and the like can be listed. When etching is conducted using these alkali agents, preferable ranges of concentration and temperature are from 1 to 50% and 20 to 100° C., respectively, and the condition wherein the dissolved amount of aluminum ranges from 5 to 20 g/$m^3$ is preferable.

Acid washing is conducted for removing stain (smut) remaining on the surface of the aluminum plate after etching. As the acid used for this purpose, a nitric acid, a sulfuric acid, a phosphoric acid, a chromic acid, a fluoric acid, a borohydrofluoric acid and the like are listed. Particularly, as a smut removal treatment method after the electrochemical roughening treatment, there are listed a method as described in JP-A No. 53-12739 in which the surface is allowed to contact with 15 to 65% by weight of sulfuric acid at a temperature from 50 to 90° C., and a method described in JP-B No. 48-28123 in which an alkali etching is conducted.

Anodizing Treatment

The aluminum plate treated as described above is further subjected to anodizing treatment. Anodizing treatment can be conducted according to a conventional method of the art. Specifically, an anodized film can be formed on the surface of the aluminum plate when direct current or alternating current is applied on aluminum in an aqueous solution or non-aqueous solution using sulfuric acid, phosphoric acid, chromic acid, oxalic acid, sulfamic acid, benzensulfonic acid and the like byalone or in combination. In this case, at least components usually contained in an Al alloy plate, electrode, tap water, underground water and the like may also be contained of course in an electrolyte. Further, a second and a third component can also be contained. As the second and third components herein referred to, there are listed, for example, ions of metals such as Na, K, Mg, Li, Ca, Ti, Al, V, Cr, Mn, Fe, Co, Ni, Cu, Zn and the like; positive ions such as an ammonium ion and the like; negative ions such as a nitrate ion, carbonate ion, chlorine ion, phosphate ion, fluorine ion, sulfite ion, titanate ion, silicate ion, borate ion and the like; and other components, and the concentration thereof maybe from 0 to 10000 ppm. Though condition of anodizing treatment is not generically determined since it varies depending on an electrolyte used, it is generally suitable that the concentration of an electrolyte ranges from 1 to 80%, the liquid temperature ranges from −5 to 70° C., the current density ranges from 0.5 to 60 A/$dm^2$, the voltage ranges from 1 to 100 V, and the electrolysis time ranges from 10 to 200 seconds.

Among these anodizing treatments, particularly a method in which anodizing is conducted under high current density in a sulfuric acid electrolyte described in GB Patent No. 1,412,768 is preferable.

In the present invention, the amount of an anodized film to be formed is generally in a range from 1 to 10 g/$m^2$. When the amount is less than 1 g/$m^2$, a plate is not easily scratched. When over 10 g/$m^2$, enormous amount of electric power is necessary for production thereof, meaning an economical demerit. The amount of the anodized film ranges preferably from 1.5 to 7 g/$m^2$, further preferably from 2 to 5 g/$m^2$.

Treatment For Surface Area Control

It is preferable to conduct treatment for raising the surface area of a substrate to a value 2 to 30 times the apparent surface area, after anodizing treatment. The apparent surface area referred herein indicates, in the case of a printing plate of 100 mm×100 mm, 10000 $mm^2$ when roughening treatment and anodizing treatment are performed only on one surface, and 20000 $mm^2$ when both surfaces are roughened and anodized and both surfaces are used for printing.

The surface area can be measured by utilizing an gas adsorption amount on the surface. In the present invention, values calculated from hypothesizing physical adsorption deduced from the measured adsorption amount of a mixed gas of helium and 0.1% krypton using KantaSorb (trade name) manufactured by Yuasa Ionics Inc.

As the most general methods for rendering the surface area to a desired value, there are listed the micropore sealing treatments of an anodized film by compressed water vapor and hot water, described in JP-A No. 4-176690 and described in JP-A No. 10-106819 suggested previously by the inventors of the present invention.

In addition, it can also be conducted by using known method such as a silicate treatment, a bichromate aqueous solution treatment, a nitrite treatment, an ammonium acetate salt treatment, an electro deposition micropore sealing treatment, a triethanolamine treatment, a barium carbonate treatment, a treatment using hot water containing an extremely slight amount of a phosphate, and the like. A micropore sealed film is formed when the electro deposition micropore sealing treatment is conducted, for example, from the bottom part of a pore. In this case, since depth of the micropores are controlled, adsorptions of an infrared absorbing agent and invasions of members of photosensitive layer into deep parts of the micropores, which cause poor removability of a photosensitive layer, are suppressed. Therefore, the effect of suppressing of film remaining is excellent. While, when water vapor micropore sealing treatment is conducted, a film is formed from the upper portions of micropores. In this case, heat insulating property is improved since gap is formed in the substrate. As described above, embodiments to form sealed films vary depending on micropore sealing treatment mode. Any micropore sealing treatment may be selected according to an object providing micropore sealing treatment is conducted as long as a substrate satisfying given surface area range is resultantly obtained.

In addition, methods to control depth and size of micropores can be applied to the surface. For example, impregnating treatment with a solution, spray treatment, coating treatment, deposition treatment, sputtering, ion plating, thermal spraying, plating and the like can be selected, though the method is not particularly restricted if the surface area can be controlled within given range. The method for controlling the surface area is not particularly restricted.

As a specific treating method, there are listed methods for providing, according to a coating method, a layer composed of a compound comprising at least one amino group and at least one group selected from the group consisting of a carboxyl group and salts thereof and sulfo group and salts thereof disclosed in JP-A No. 60-19491; a layer composed of a compound selected from compounds comprising at least one amino group and at least one hydroxyl group, and salts thereof disclosed in JP-A No. 60-232998; a layer comprising a phosphate salt disclosed in JP-A No. 62-19494; a layer composed of a polymer compound containing at least one monomer unit having a sulfo group as a repeating unit in the molecule disclosed in JP-A No. 59-101651; and the like.

There are also methods in which a layer comprising a compound is provided, the compound being selected from the group consisting of: carboxymethylcellulose, dextrin, gum arabic, phosphonic acids having an amino group such as 2-aminoethylphosphonic acid and the like; organic phosphonic acids such as phenylphosphonic acid, naphthylphosphonic acid, alkylphosphonic acid, glycerophosphonic acid, methylenediphosphonic acid and ethylenediphosphonic acid and the like, each optionally having a substituent; organic phosphates such as phenylphosphoric acid, naphthylphosphoric acid, alkylphosphoric acid, glycerophosphoric acid and the like, each optionally having a substituent; organic phosphinic acids such as phenylphosphinic acid, naphthylphosphinic acid, alkylphosphinic acid, glycerophosphinic acid and the like, each optionally having a substituent; amino acids such as glycine, β-alanine and the like; and hydrochlorides of amines having a hydroxyl group such as a hydrochloride salts of triethanolamine; and the like.

Further, a silane coupling agent having an unsaturated group may be applied, and examples of the silane coupling agent which can be used include N-3-(acryloxy-2-hydroxypropyl)-3-aminopropyltriethoxysilane, (3-acryloxypropyl)dimethylmethoxysilane, (3-acryloxypropyl) methyldimethoxysilane, (3-acryloxypropyl) trimethoxysilane, 3-(N-allylamino)propyltrimethoxysilane, allyldimethoxysilane, allyltriethoxysilane, allyltrimethoxysilane, 3-butenyltriethoxysilane, 2-(chloromethyl)allyltrimethoxysilane, methacrylamide propyltriethoxysilane, N-(3-methacryloxy-2-hydroxypropyl)-3-aminopropyltriethoxysilane, (methacryloxymethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris(methoxyethoxy)silane, methoxydimethylvinylsilane, 1-methoxy-3-(trimethylsiloxy)butadiene, styrylethyltrimethoxysilane, 3-(N-styrylmethyl-2-aminoethylamino)-propyltrimethoxysilane hydrochloride, vinyldimethylethoxysilane, vinyldiphenylethoxysilane, vinylmethyldiethoxysilane, vinylmethyldimethoxysilane, o-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane, and diallylaminopropylmethoxysilane. Among them, coupling agents containing a methacryloyl group and acryloyl group in which reactivity of an unsaturated group is quick are preferable, and a vinyl group and allyl group may be permissible providing the unsaturated group is bi-functional.

In addition, there can also be used sol-gel coating treatment described in JP-A No. 5-50779, coating treatment of phosphonic acids described in JP-A No. 5-246171, methods for coating the surface with a back coat material described in JP-A Nos. 6-234284, 6-191173 and 6-230563, treatment of phosphonic acids described in JP-A No. 6-262872, coating treatment shown in JP-A No. 6-297875, a method for effecting anodizing treatment described in JP-A No. 10-109480, further, immersion treatment methods described in Japanese Patent Application Nos. 10-252078 and 10-253411 suggested previously by the inventors of the present invention, and the like.

Treating conditions are preferably selected so that after anodizing treatment, an anodized film has a feature, for example, (a) surface area of 2 to 30 times the unit surface area and/or (b) micropores present in the anodized film have a pore diameter of 5 to 10 nm and a pore density of $8\times10^{15}$ to $2\times10^{16}/m^2$ by the above-described method. For controlling the surface area in a desired range, it is necessary to control the kind of a treating agent used and treating condition. For example, micropore sealing treatment with pressureized water vapor or hot water can be controlled by changing temperature and/or treatment time of water vapor or hot water. Further, in the case of immersion treatment using an aqueous solution, the surface area can be controlled by changing concentration of a solute, treating temperature and treating time. In the case of the electro deposition micropore sealing treatment, the surface area can be controlled by controlling current density, electrolytic voltage and electrolytic waveform in electro deposition in addition to the concentration of an electrolyte, treating temperature and treating time. On the other hand, when controlling is effected by coating treatment, the surface are can be controlled by changing coating amount, molecular weight of a compound used for coating, drying conditions (ex. temperature, time, heating method) after coating, coating methods (bar coat method, immersion lifting method, spin coating method and the like).

Photosensitive Layer

Following image formation layer is formed on a substrate of the present invention produced as described above. An image forming layer used in the present invention is not particularly restricted provided writing by irradiation with infrared laser is possible. Such a photosensitive layer on which direct recording by exposure to infrared laser is possible and solubility of the exposed part in an alkali developing solution varies will be referred to as a thermal type photosensitive layer below, for convenience.

As the laser direct writing type thermal type photosensitive layer for a planographic printing plate, conventionally known layers can be used. There are listed, for example, photosensitive layers, recording layers and the like described in JP-A Nos. 9-222737, 9-90610, 9-87245, 9-43845, 7-306528, and Japanese Patent Application Nos. 10-229099 and 11-240601 disclosed by the applicant of the present invention.

Such a thermal type photosensitive layer contains an infrared absorbing agent, water-insoluble and alkali aqueous solution-soluble polymer compound, and other optional components. A positive recording layer is solubilized in water and alkali aqueous solution by effects such as cancellation of a bond of polymer compounds forming the layer by an acid or heat energy itself generated by light irradiation and heating. And then the layer is removed by development to form a non-image part. In a negative layer, a compound constituting the recording layer polymerized and/or crosslinked, and is hardened to form an image part by utilizing a radical or acid generated by light irradiation and/or heat as an initiator or catalyst.

In the present invention, the water-insoluble and alkali aqueous solution-soluble polymer will be referred to as simply "alkali aqueous solution-soluble polymer", for convenience.

As such a polymer compound, it is preferable to use homopolymers containing acidic group(s) in the main chain and/or in the side chain in the polymer, copolymers thereof, or mixtures thereof.

Among them, those having acidic group(s) listed in the following (1) to (6) in the main chain and/or in the side chain of the polymer are preferable, from the standpoints of solubility in an alkaline developing solution, and manifestation of solution-suppressing ability.

(1) Phenol group (—Ar—OH)
(2) Sulfoneamide group (—$SO_2NH$—R)
(3) Substituted sulfone amide acid group (hereinafter, referred to as "active imide group")
(4) Carboxyl group (—$CO_2H$)
(5) Sulfonic group (—$SO_3H$)
(6) Phosphate group (—$OPO_3H_2$)

In the above-described (1) to (6), Ar represents a divalent aryl connecting group optionally having a substituent, and R represents a hydrocarbon group optionally having a substituent.

Among alkali aqueous solution-soluble polymers having an acidic group selected from the (1) to (6), alkali aqueous solution-soluble polymers having (1) a phenol group, (2) a sulfoneamide group and (3) an active imide group are preferable, and particularly, alkali aqueous solution-soluble polymers having (1) a phenol group and (2) a sulfoneamide group are most preferable for ensuring sufficient solubility in an alkaline developing solution, developing latitude, and film strength.

As the alkali aqueous solution-soluble polymer having group(s) selected from the above-described (1) to (3), there are listed below.

As the alkali aqueous solution-soluble polymer having a phenol group (1), there are listed, for example, novolak resins such as polycondensates of phenol and formaldehyde, polycondensates of m-cresol and formaldehyde, polycondensates of p-cresol and formaldehyde, polycondensates of m-/p-mixed cresol and formaldehyde, polycondensates of phenol, cresol (any of m-, p-, or m-/p-mixed) and formaldehyde, and the like, and polycondensates of pyrogallol and acetone. Further, copolymers obtained by copolymerizing compounds having phenol groups on the side chains can also be listed. Further, copolymers obtained by copolymerizing a compound having a phenol group on the side chain can also be used.

As the compound having a phenol group, acrylamide, methacrylamide, acrylates, methacrylates, hydroxystyrene and the like, each having a phenol group are listed.

It is preferable that alkali aqueous solution-soluble polymers have a weight-average molecular weight of $5.0\times10^2$ to $2\times10^4$, and a number-average molecular weight of $2.0\times10^2$ to $1.0\times10^4$, from the standpoint of image forming property. These polymers may be used by alone or in combination. When these polymers are combinantly used, there may be additionally used polycondensates of phenol and formaldehyde carrying as a substituent an alkyl group having 3 to 8 carbon atoms such as polycondensates of t-butylphenol and formaldehyde, and polycondensates of octylphenol and formaldehyde, as described in U.S. Pat. No. 4,123,279.

As the alkali aqueous solution-soluble polymer having a sulfoneamide group (2), there are listed, for example, polymers constituted of a minimum constituent unit derived from a compound having a sulfoneamide group, wherein the unit is used as a main constituent component. As the above-described compound, there are listed compounds containing in the molecule one or more sulfoneamide groups in which at least one hydrogen atom is bonded to a nitrogen atom, and one or more polymerizable unsaturated groups. Among them, lower molecular weight compounds containing in the molecule an acryloyl group, allyl group or vinyloxy group, and a substituted or mono-substituted aminosulfonyl group or substituted sulfonylimino group are preferable. There are listed, for example, compounds represented by the following general formulae 1 to 5.

General formula 1

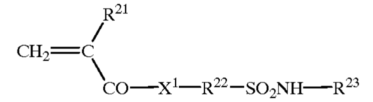

General formula 2

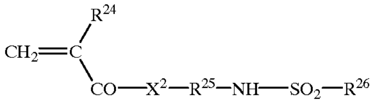

General formula 3

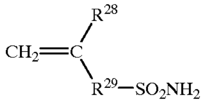

General formula 4

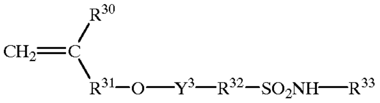

General formula 5

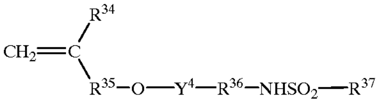

[wherein, each of $X^1$ and $X^2$ independently represents —O— or —$NR^{27}$—. Each of $R^{21}$ and $R^{24}$ independently represents a hydrogen atom or —$CH_3$. Each of $R^{22}$, $R^{25}$, $R^{29}$, $R^{32}$ and $R^{36}$ independently represents an alkylene group, cycloalkylene group, arylene group or aralkylene group, each having 1 to 12 carbon atoms and optionally having a substituent. Each of $R^{23}$, $R^{27}$ and $R^{33}$ independently represents a hydrogen atom, an alkyl group, cycloalkyl group, aryl group or aralkyl group, each having 1 to 12 carbon atoms and optionally having a substituent. Each of $R^{26}$ and $R^{37}$ independently represents an alkyl group, cycloalkyl group, aryl group or aralkyl group, each having 1 to 12 carbon atoms and optionally having a substituent. Each of $R^{28}$, $R^{30}$ and $R^{34}$ independently represents a hydrogen atom or —$CH_3$. Each of $R^{31}$ and $R^{35}$ independently represents a single bond, or an alkylene group, cycloalkylene group, arylene group or aralkylene group, each having 1 to 12 carbon atoms and optionally having a substituent. Each of $Y^3$ and $Y^4$ independently represents a single bond or —CO—.].

Among compounds represented by the general formulae 1 to 5, particularly, m-aminosulfonylphenyl methacrylate, N-(p-aminosulfonylphenyl)methacrylamide, N-(p-aminosulfonylphenyl)acrylamide and the like can be suitably used in a positive planographic printing material in the present invention.

As the alkali aqueous solution-soluble polymer having an active imide group (3), there are listed, for example, polymers constituted of a minimum constituent unit derived from a compound having an active imide group, wherein the unit is used as a main constituent component. As the above-described compound, there are listed compounds containing in the molecule one or more active imide groups represented by the following structural formula and one or more polymerizable unsaturated groups.

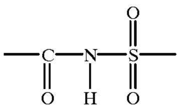

Specifically, N-(p-toluenesulfonyl)methacrylamide, N-(p-toluenesulfonyl)acrylamide and the like can be suitably used.

A minimum constituent unit having an acidic group selected from the above-described (1) to (6), constituting the alkali aqueous solution-soluble polymer used in the positive recording layer of the present invention is not especially required to be used alone, and those obtained by copolymerizing two or more minimum constituent units having the same acidic group or two or more minimum constituent units having different acidic groups can also be used.

As the copolymerization method, conventionally known method such as graft copolymerization method, block copolymerization method, random copolymerization methods and the like can be used.

As the above-described copolymer, those containing an amount of 10 mol % or more of the compound having acidic groups selected from (1) to (6) are preferable, and those containing the same in an amount of 20 mol % or more are more preferable. When the amount of contained compounds is less than 10 mol %, there is a tendency that developing latitude can not be sufficiently improved.

As the preferable polymer usable in a recording layer of a negative image forming material, polymers having an aromatic hydrocarbon ring on the side chain or the main chain wherein a hydroxyl group or alkoxy group is bonded directly to the aromatic hydrocarbon ring are listed. As the alkoxy group, those having 20 or less carbon atoms are preferable from the standpoint of sensitivity. As the aromatic hydrocarbon ring, a benzene ring, a naphthalene ring or an anthracene ring is preferable from availability of raw materials. These aromatic hydrocarbon ring may have substituents other than a hydroxyl group or an alkoxy group, for example, a halogen group, a cyano group and the like. However, it is preferable the ring does not have a substituent other than a hydroxy group or a alkoxy group, from the standpoint of sensitivity.

A binder polymer which can be suitably used in the present invention is a polymer having a constituent unit represented by the following general formula (III) or a phenol resin such as a novolak resin and the like.

General formula (III)

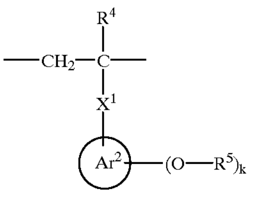

In the formula, $Ar^2$ represents a benzene ring, a naphthalene ring or an anthracene ring. $R^4$ represents a hydrogen atom or a methyl group. $R^5$ represents a hydrogen atom or an alkoxy group having 20 or less carbon atoms. $X^1$ represents a single bond or a divalent connecting group which contains one or more atoms selected from C, H, N, O and S and has 0 to 20 carbon atoms. k represents an integer from 1 to 4.

Examples of the constituent unit represented by the general formula (III) suitably used in the present invention ([BP-1] to [BP-6]) are listed below. However, the present invention is not limited to them.

[BP-1]

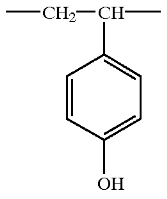

[BP-2]

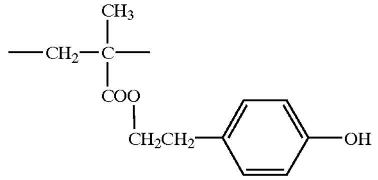

[BP-3]

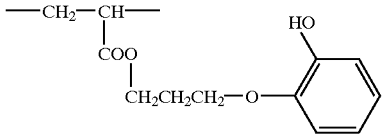

[BP-4]

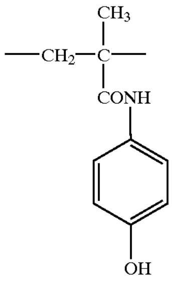

[BP-5]

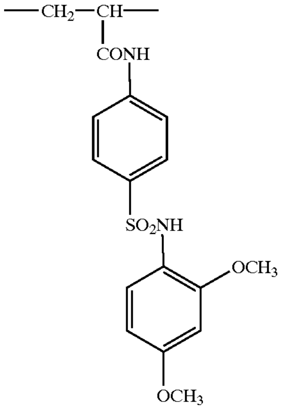

[BP-6]

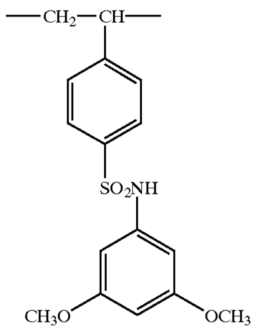

Polymers having these constituent units are obtained by radical polymerization according to a conventionally known method using their corresponding monomers.

Next, novolaks will be described. As the novolak resin suitably used in the present invention, phenol novolaks, various cresol novolaks of o-, m-, p-type, and copolymers thereof, novolaks obtained by using a phenol substituted with a halogen atom, alkyl group and the like, are listed.

These novolak resins have a weight-average molecular weight of preferably 1000 or more, more preferably from 2000 to 20000, and a number-average molecular weight of preferably 1000 or more, more preferably from 2000 to 15000. Degree of polydispersion is preferably 1 or more, more preferably in a range from 1.1 to 10.

An infrared absorbing agent contained in a recording layer in the present invention has an ability to convert absorbed infrared ray to heat, and causes a light-chemical reaction and the like by laser scanning, thus significantly raises solubility of the recording layer in a developing solution.

The infrared absorbing agent used in the present invention is a dye or a pigment effectively absorbing infrared ray having a wavelength of 760 nm to 1200 nm, preferably is a dye or pigment having the absorption maximum thereof in a wavelength range from 760 nm to 1200 nm.

As the dye, there can be used commercially available dyes, and known dyes described in literatures such as, for example, “Senryo Binran (Dye Handbook)” (issued by Yuki Gosei Kagaku Kyokai, 1970), and the like. Specifically, dyes are listed such as azo dyes, metal complex salt azo dyes, pyrazoline azo dyes, naphthoquinone dyes, anthraquinone dyes, phthalocyanine dyes, carbonium dyes, quinoneimine dyes, methine dyes, cyanine dyes, squarylium dyes, pyrylium salts, metal thiolate complexes and the like.

As the pigment used in the present invention, there can be utilized commercially available pigments and pigments described in Color Index (C. I.) Hand book, “Saishin Ganryo Binran (Novel Pigment Hand book)” (issued by Nihon Ganryo Gijutsu Kyokai, 1977), “Saishin Ganryo Oyo Gijutsu (Novel Pigment Application Technology)” (published by CMC, 1986), “Insatsu Inki Gijutsu (Printing Ink Technology)⇆(published by CMC, 1984).

Any of these infrared absorbing agents can be applied providing it has a light-heat converting function against an exposure wavelength, and specifically, those described in JP-A No. 11-985, [0038] to [0050], of the applicant of the present invention, for example, can be suitably applied.

The additional amount of these dyes or pigments is preferably about 0.01 to 30% by weight on the total solid content of a recording layer coating solution.

Further, anionic infrared absorbing agents described in Japanese Patent Application No. 10-237634 are listed as suitable examples.

In order to decrease alkali aqueous solution solubility of the alkali aqueous solution-soluble polymer compound at exposed part, the negative recording layer is allowed to contain an acid generator which is decomposed by light or heat to generate an acid, and an acid crosslinking agent which causes a crosslinking reaction by the generated acid, to harden binder polymers, or a compound which generates radicals by light or heat, and a compound which is polymerized and hardened by the generated radical, and the like.

In the recording layer of the present invention, various known additives can be used together in addition to the above-described compounds, if necessary.

A planographic printing plate precursor of the present invention can be obtained by dissolving these compounds in a suitable solvent to prepare a photosensitive layer coating solution, and coating it on an aluminum substrate having specific surface area described above.

The coating amount (solid component) of the recording layer in the present invention differs depending on usage, and controlled in a range from 0.01 to 3.0 g/m$^2$.

As the coating method, various methods can be used. There are listed, for example, bar coater coating, rotational coating, spray coating, curtain coating, dip coating, air knife coating, blade coating, roll coating and the like. When the coating amount decreases, the apparent sensitivity increases, while film property of the photosensitive layer decreases.

In order to obtain a photosensitive printing plate precursor which does not easily render halftone dots bolder by scattered light attributed to a substrate, particularly, it is preferable to provide a photosensitive layer having the following features on a substrate having the anodized film of the above-described feature (b).

In this case, a preferable photosensitive layer contains (i) at least one titanocene compound, (ii) an additional polymerizable compound having at least one ethylenically unsaturated double bond and (iii) at least one pigment having an optical property that transmittance at 500 nm is smaller than transmittance at 400 nm.

(i) Titanocene Compound

As the titanocene compound contained in the photosensitive layer of the present invention, any titanocene compound may be permissible providing it can generate active species on demands when irradiated with light in co-presence of a sensitizing pigment described later according. As such a titanocene compound, known compounds described, for example, in JP-A Nos. 59-152396, 61-151197, 63-41483, 63-41484, 2-249, 2-291, 3-27393, 3-12403 and 6-41170 can be appropriately selected and used.

More specifically, dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluoropheny-1-yl, dicyclopentadienyl-Ti-bis-2,4,6-trifluoropheny-1-yl, dicyclopentadienyl-Ti-bis-2,6-difluoropheny-1-yl, dicyclopentadienyl-Ti-bis-2,4-difluoropheny-1-yl, dimethylcyclopentadienyl-Ti-bis-2,3,4,5,6-pentafluorophen-1-yl, dimethylcyclopentadienyl-Ti-bis-2,3,5,6-tetrafluoropheny-1-yl, dimethylcyclopentadienyl-Ti-bis-2,4-difluoropheny-1-yl, bis(cyclopentadienyl)-bis(2,6-difluoro-3-(pyr-1-yl)phenyl)titanium and the like are listed.

Further, these titanocene compounds can be subjected to various chemical modifications in order to improve the properties of the photosensitive layer. For example, bonding with a sensitizing pigment described below, an additional polymerizable unsaturated compound or other activator parts, introduction of a hydrophilic site, introduction of a substituent for improving compatibility and suppressing crystal deposition, introduction of a substituent for improving close contact between the substrate and the photosensitive layer, polymer formation, and the like can be utilized.

Also, the use of above-described method can be appropriately set by designing of abilities of the intended photosensitive planographic printing plate. For example, compatibility with the photosensitive layer and the like can be enhanced by the use of two or more of compounds simultaneously. It is usually advantageous from the standpoint of photosensitivity that the use amount of a titanocene compound is high. Sufficient photosensitivity is obtained by using the titanocene compound in an amount from 0.5 to 80 parts by weight, preferably from 1 to 50 parts by weight on 100 pats by weight of the total components of the above-described photosensitive layer and the like. On the other hand, in the use under lights around 500 nm of wavelength such as a white lamp, yellow lamp and the like, it is preferable the use amount is smaller from the standpoint of fogging. Sufficient photosensitivity can be obtained even if the use amount thereof is reduced to 6 parts by weight or less, further 1.9 parts by weight or less, further, 1.4 parts by weight or less, by enhancing the photosensitibity of the light initiation system by the use of the titanocene compound combined with the use of a sensitizing pigment described below.

(ii) An Additional Polymerizable Compound Having at Least One Ethylenically Unsaturated Double Bond Next, an additional polymerizable compound having at least one ethylenically unsaturated double bond (hereinafter, may be referred to as additional polymerizable compound) contained in the photosensitive layer of the aspect of the present invention will be illustrated.

An additional polymerizable compound contained in the photosensitive layer is selected from compounds having at least one, preferably two or more ethylenically unsaturated bond ends. The groups of such compounds is well known in the art, and these can be used in the present invention without particular restriction. These have chemical forms such as, for example, a monomer, a prepolymer (namely, dimer, trimer and oligomer) a mixture thereof, a copolymer thereof, and the like. As examples of the monomer and copolymer thereof, there are listed unsaturated carboxylic acids (for example, acrylic acid, methacrylic acid, itaconic acid, crotonic acid, isocrotonic acid, maleic acid and the like), and esters and amides thereof, and preferably, esters of unsaturated carboxylic acids and aliphatic polyhydric alcohol compounds, and amides of unsaturated carboxylic acids and aliphatic polyvalent amine compounds are used. Further, unsaturated carboxylates having a hydroxyl group, and a nucleophilic substituent such as an amino group, mercapto group and the like, addition products of amides with monofunctional or polyfunctional isocyanates, or epoxy compounds, dehydrated condensed reaction products with monofunctional or polyfunctional carboxylic acids, and the like, can also be suitably used.

Further, unsaturated carboxylates having an isocyanato group, and an electrophilic substituent such as an epoxy group and the like; addition products of amides with monofunctional or polyfunctional alcohols, amines and thiols; unsaturated carboxylates containing a halogen group, and a releasable substituent such as a tosyloxy group and the like; substitution products of amides with monofunctional or polyfunctional alcohols, amines and thiols, are also suitable. As other examples, it is also possible to use a group of compounds in which the above-described unsaturated carboxylic acids are substituted by an unsaturated phosphonic acid, styrene, vinyl ether and the like.

Specific examples of monomers of esters of aliphatic polyhydric alcohol compounds with unsaturated carboxylic acids include acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane acrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers and the like, methacrylates such as, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, his [p-(3-methacryloxy-2-hydroxypropoxy)phenyl] dimethylmethane, bis [p-(methacryloxyethoxy)phenyl] dimethylmethane and the like, itaconates such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate and the like, crotonates such as ethylene glycol dicrotonate, tetramethylene glycol dicrotonate, pentaerythritol dicrotonate, sorbitol tetradicrotonate and the like, isocrotonates such as ethylene glycol diisocrotonate, pentaerythritol diisocrotonate, sorbitol tetraisocrotonate and the like, and maleates such as ethylene glycol dimaleate, triethylene glycol dimaleate, pentaerythritol dimaleate, sorbitol tetramaleate and the like.

As other examples of the esters, for example, aliphatic alcohol esters described in JP-B Nos. 46-27926, 51-47334, JP-A No. 57-196231, esters having an aromatic skeleton described in JP-A Nos. 59-5240, 59-5241 and 2-226149, esters containing an amino group described in JP-A No. 1-165613, and the like, are suitably used.

Further, the above-described ester monomers can be used as a mixture.

Specific examples of monomers of amides obtained from aliphatic polyhydric amines and unsaturated carboxylic acids include methylenebis-acrylamide, methylenebis-methacrylamide, 1,6-hexanemethylenebis-acrylamide, 1,6-hexamethylene bis-methacrylamide, diethylenetriaminetris-acrylamide, xylylenebisacrylamide, xylylenebismethacrylamide and the like.

As examples of other preferable amide monomers, those having a cyclohexylene structure described in JP-B No. 54-21726 are listed.

Urethane additional polymerizable compounds produced by using an addition reaction of an isocyanate with a hydroxyl group are also suitable. Specific examples thereof include, for example, vinylurethane compounds containing two or more polymerizable vinyl groups in one molecule, obtained by adding a vinyl monomer containing a hydroxyl group represented by the following formula (I) to a polyisocyanate compound having two or more isocyanate groups in one molecule, as is described in JP-B No. 48-41708.

$$CH_2{=}C(R)COOCH_2CH(R')OH \qquad \text{formula (I)}$$

(wherein, R and R' represent H or $CH_3$)

Moreover, urethane acrylates as described in JP-A No. 51-37193, JP-B Nos. 2-32293 and 2-16765, and urethane compounds having an ethylene oxide skeleton described in JP-N Nos. 58-49860, 56-17654, 62-39417 and 62-39418, are also suitable.

Further, a photosensitive composition having extremely excellent photosensitizing speed can be obtained by using additional polymerizable compounds having in the molecule an amino structure or a sulfide structure, described in JP-A Nos. 63-377653, 63-260909 and 1-105238.

Further, polyfunctional acrylates and methacrylates such as polyester acrylates as described in JP-B Nos. 48-64183, 49-43191 and 52-30490, epoxy acrylates obtained by reacting epoxy resins and (meth) acrylic acid; and the like can be used. Also, specific unsaturated compounds described in JP-B Nos. 46-43946, 1-40337 and 1-40336, vinylphosphonic acid compounds described in JP-A No. 2-25493; and the like, can be listed. In some cases, structures containing a perfluoroalkyl group described in JP-A No. 61-22048 are suitably used. Further, those introduced as a light hardening monomer and oligomer in Nippon Secchaku Kyokai Shi (Journal of Japan Adhesive Institution) vol. 20, No. 7, pp. 300 to 308 (1984) can also be used.

Details of the method of use of an additional polymerizable compounds, such as the kind of a structure used, single use or co-use, and an amount of addition, are set appropriately according to design of intended ability of the photosensitive planographic printing plate precursor. For example, the details are selected according to the following standpoints. A structure having larger content of unsaturated groups per one molecule is preferable from the standpoint of photosensitizing speed, and in many cases, a di- or more-functional structure is preferable. For increasing strength of an image part, namely, a hardened film, a tri- or more-functional structure is preferable, and further, it is also effective to control both of photosensitivity and strength by simultaneously using compounds having different functional number and different polymerizable groups (for example, acrylates, methacrylates, styrene compound, and vinyl ether compounds). A compound having large molecular weight and a compound having higher hydrophobicity may sometimes not be preferable from the standpoints of developing speed and deposition in a developing solution, though they are excellent in standpoints of photosensitizing speed and film strength. Further, regarding dispersibility and compatibility with other components (for example, binder polymer initiator, coloring agent and the like) in the photosensitive layer, selection and method of use of an additional polymerizable compound are important factors. For example, compatibility can be improved in some cases by the use of a compound of lower purity and the additional use of two or more compounds. Further, for the purpose of improving close contact of the photosensitive layer with the substrate, a specific structure such as a cover coat layer and the like described later may also be selected. Regarding compounding ratio of an additional polymerizable compound in the photosensitive layer, higher ratio is advantageous from the viewpoint of sensitivity. However, when the ratio is too high, undesirable phase-separation may occur, and problems on production process due to stickiness of the photosensitive layer (for example, a production failure derived from transfering and adhesion of a photosensitive components) and problems such as deposition in a developing solution may occur. From these viewpoints, the preferable compounding ratio is, in may cases, from 5 to 80% by weight, preferably from 25 to 75% by weight on the total amount of components in a photosensitive layer. These maybe used alone or in combination of two or more. In the method of using an additional polymerizable compound, suitable structures, suitable compounding ratios and suitable amounts of additional compounds can be selected arbitrarily from the standpoints of an extent of polymerization inhibition against oxygen, resolution, fogging property, refractive index change, surface close contact and the like. Further, in some cases, layer constitutions and coating methods such as primer coating and finish coating can also be carried out.

(iii) Pigment Having an Optical Property That Transmittance at 500 nm is Smaller Than Transmittance at 400 nm A pigment having an optical property that transmittance at 500 nm is smaller than transmittance at 400 nm that can be contained in the photosensitive layer of the present invention will be illustrated.

The pigment in one aspect of the present invention can be used without particular restriction providing it has an optical property that transmittance at 500 nm is smaller than transmittance at 400 nm. Optical properties of this pigment can be controlled by appropriately selecting a chemical structure, and dispersion conditions (particle size, diluted condition, and the like) of coloring substances constituting the pigment. Further, the optical property thereof can be easily checked by, for example, producing a pigment dispersed film on an optically transparent substrate, and adopting a transmittance measuring method using a generally used spectrophotometer. Even in the case of the dispersed film being formed on an opaque substrate, the optical property can be measured as an inverse number to the refractive index obtained by a regular reflection measuring method and a diffusion reflection measuring method.

Preferable pigments used in the present invention will be described below with C. I. Number described in Colour Index (Published by The Society of Dyes and Colurists, Third Edition)

Azo Pigments:

For example,

Pigment Orange 13, 16. 2, 24, 31,

Pigment Red 1, 22, 3, 38, 4, 48, 49, 60, 63, 9, 166, 144

Pigment Brown 23, and the like.

Perylene Pigments:

For example,

Pigment Orange 7,

Pigment Red 123, 178, 179, 224, 149, 190,

Pigment Violet 29, and the like.

Pyrazoloquinazolone Pigments:

For example,

Pigment Red 251, 252,

Pigment Orange 67, and the like.

Aminoanthraquinone Pigments:

For example,

Pigment Red 177, and the like.

Quinacridone Pigments:

For example,

Pigment Violet 19,

Pigment Red 122, 202, and the like.

Acidic Dye Lake Pigments:

For example,

Pigment Blue 61, 56, 57, and the like.

Basic Dye Lake Pigments:

For example,

Pigment Violet 1,

Pigment Red 81, and the like.

Other Pigments:

For example,

French Ultramarine, and the like.

When a coloring compound constituting a pigment in the aspect of the present invention is present not in solid dispersed condition but in molecule dispersed condition (solution) in the photosensitive layer, a reverse influence such as increase or sharp decrease in fogging occurs. Therefore, it is preferable to use a pigment which causes such an influence to an extent as lower as possible. Assuitable pigments in the present invention from the standpoints of absorption spectrum property and solubility ascribed to the chemical structure of a pigment component, azo pigments, perylene pigment, pyrazoloquinazolone pigments, pyrazoloquinazolone pigments, aminoanthraquinone pigment, quinacridone pigments, acidic dye lake pigments and basic dye lake pigments are listed. Further, azo pigments, acidic dye lake pigment, pyrazoloquinazolone pigments and quinacridone pigments are more preferable.

Chemical structural formulae of coloring substances constituting preferable pigments will be shown below.

(P-1)

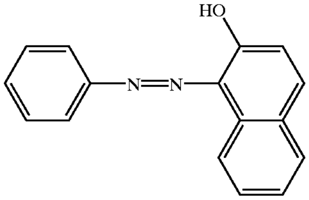

(P-2)

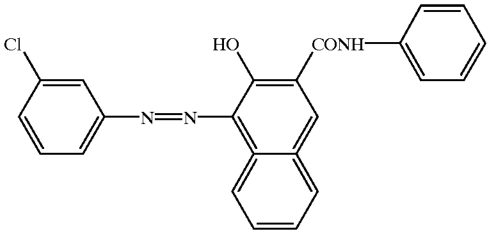

(P-3)

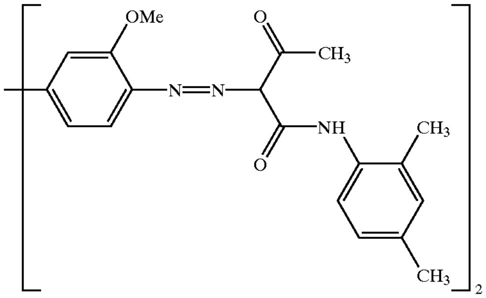

(P-4)

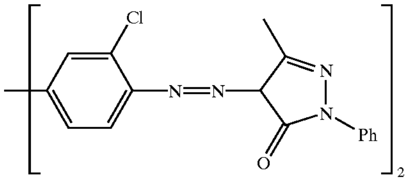

(P-5)

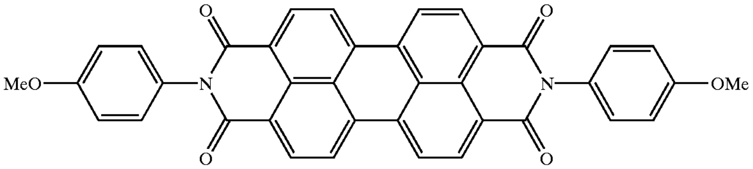

(P-6)

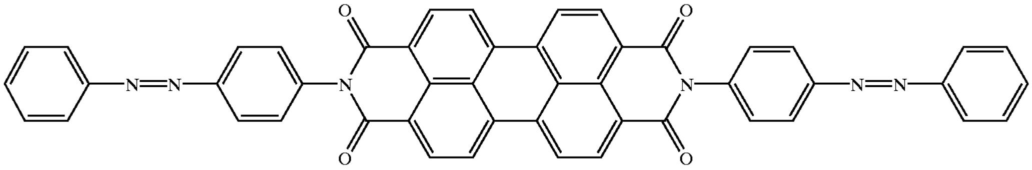

(P-7)

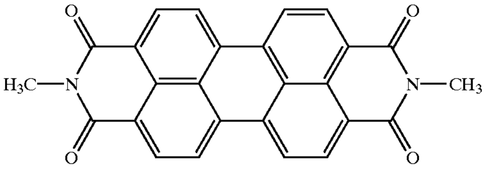

(P-8)

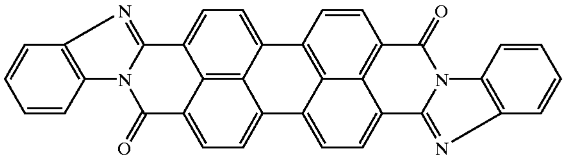

(P-9)

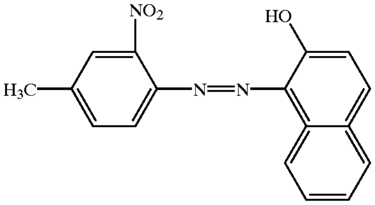

(P-10)

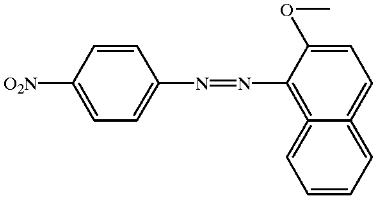

-continued
(P-11)
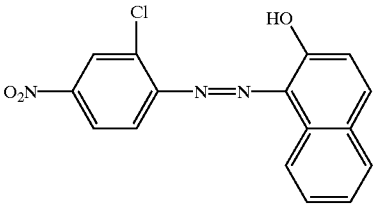
(P-12)
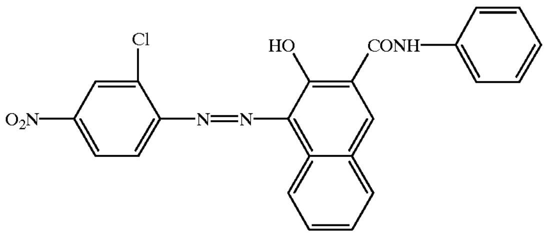
(P-13)
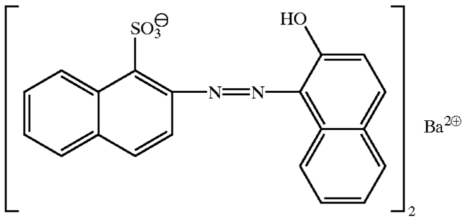
(P-14)
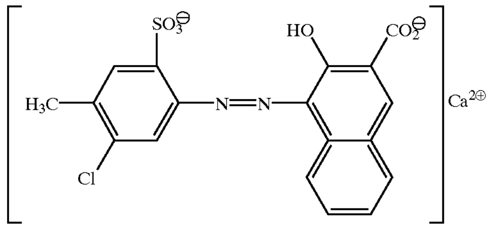
(P-15)
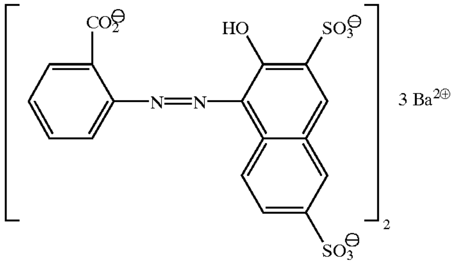
(P-16)
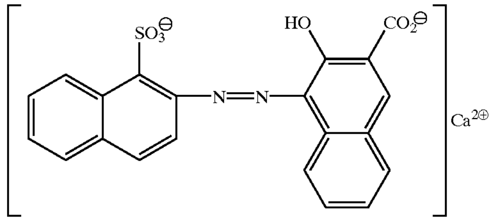
(P-17)
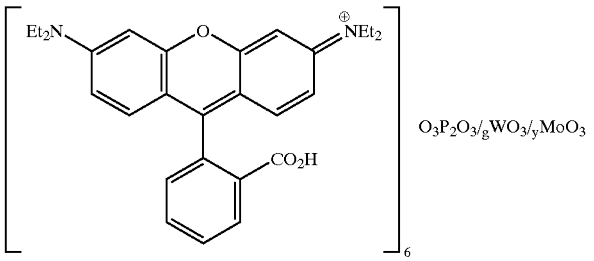
(P-18)
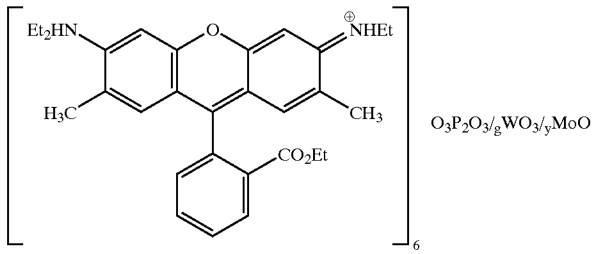
(P-19)
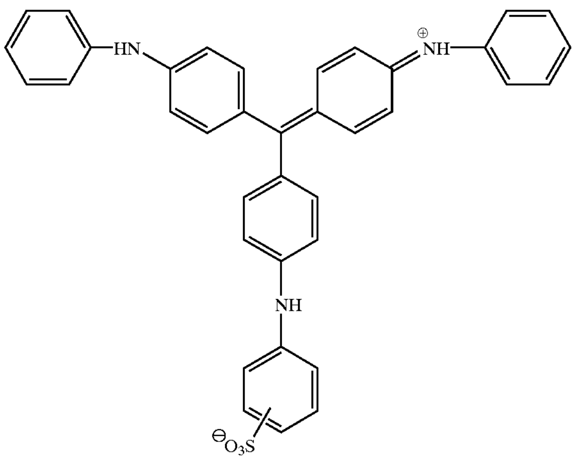
(P-20)
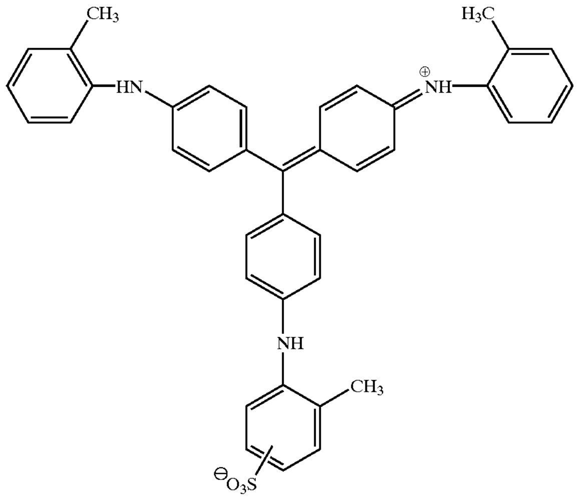

-continued (P-21)

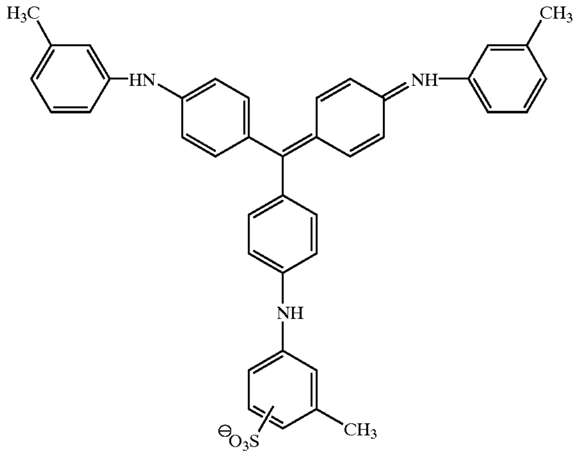

(P-22)

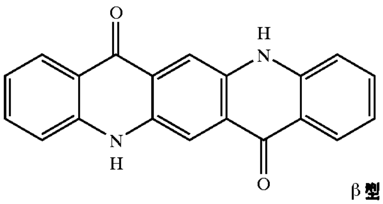

β型

(P-23)

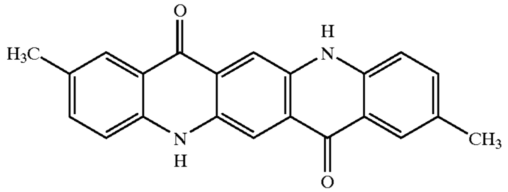

(P-24)

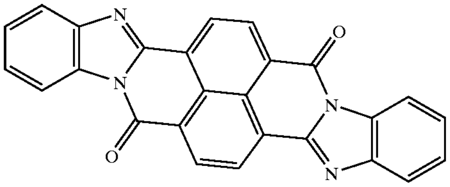

(P-25)

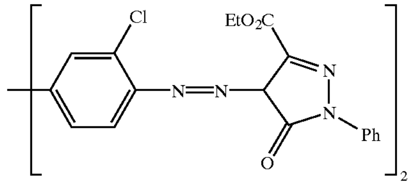

(P-26)

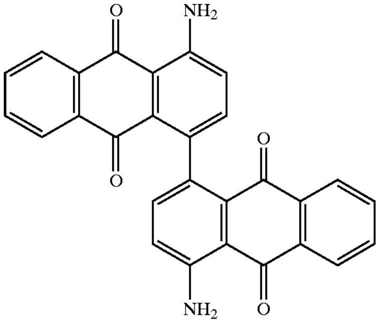

(P-27)

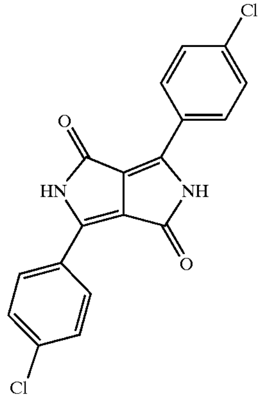

Next, a general method for dispersing a pigment will be described. However, the present is not restricted by these description.

In general, the pigments are supplied by drying through various methods after synthesis. Usually, the pigments are dried from a water medium and supplied as a powder body. However, since drying of water requires enormous evaporation latent heat, large heat energy is necessary for drying in order to obtain a powder. Therefore, it is usual that pigments form coagulated bodies (secondary particles) obtained by aggregating primary particles.

It is not easy to disperse pigments that form such coagulated bodies into fine particles. Therefore, it is preferable to treat pigments previously with various resins. As these resins, binding resins described later are listed. As the treating method, there are flushing treatment, and kneading methods using a kneader, extruder, ball mill, twin or triple roll mill, and the like. Among them, flushing treatment, and kneading methods using a twin or triple roll mill are suitable for making fine particles.

The flushing treatment is usually a method in which a water dispersion of a pigment and a resin solution prepared by dissolving in a solvent immiscible with water are mixed, the pigment is extracted from the water medium into an organic medium, and the pigment is treated with a resin. According to this method, coagulation of a pigment can be prevented, and dispersion becomes easy, since drying of a pigment is not effected. The kneading with a twin or triple roll mill is a method in which a pigment and a resin of a resin solution are mixed. Then the resin is coated on the surface of the pigment by kneading the pigment and the resin together while applying higher shear (searing force). The coagulated pigment particles in this process are dispersed into from lower order coagulated bodies to primary particles.

Further, processed pigments previously treated with an acryl resin, vinyl chloride-vinyl acetate resin, maleic acid resin, ethylcellulose resin, nitrocellulose resin and the like can also be advantageously used. As a form of the processed pigments treated with the above-described various resins, a powder form, paste form, pellet form and paste form in which a resin and a pigment are dispersed uniformly are preferable. A non-uniform bulky form obtained by gelling of a resin is not preferable.

For obtaining a pigment dispersion having fine particle size distribution, first, a pigment is treated by flushing, or kneaded with a binding resin by a kneader, extruder, ball mil, twin or triple roll mill. As a preferable kneading method, there is a method in which, first, a solvent is added to a pigment and a binding resin. And they are mixed uniformly, then, kneaded by a twin or triple roll, while heating if necessary, for allowing the pigment and the binding resin conformable each other, to obtain a uniform colored body. Then, it is mixed with other constituent components containing a pigment, and a pigment dispersing agent of the present invention, and the resulted mixture is wet-dispersed (primary dispersion). The resulted dispersion is subjected again to wet dispersion (secondary dispersion) using finer beads, until the intended particle size distribution is obtained. Alternatively, in order to obtain particles having the intended particle size and size distribution, the wet-dispersed dispersion is separated by centrifugal separation or by decantation which removes bulky particles. When a tertiary amine compound is allowed to co-exist, for example as a dispersing agent, in the above-described kneading process and dispersing process, finer particle-forming dispersion of a pigment is promoted. This is advantageous for obtaining that having the particle size distribution of the present invention. Particularly, a tertiary amine compound having at least one polymer group as described below is preferable. Any group can be used as the at least one polymer group in a tertiary amine, providing it is a group having at least one polymer. As such a polymer group, a lower alkyleneoxy group is preferable. Here, polyoxyethylene, polyoxypropylene are listed as the lower alkyleneoxy group. Further preferably, those in which polyoxyethylene and polyoxypropylene form a block copolymer are listed. Any number from 1 to 3 of these polymer groups may be bonded to the tertiary amine.

Further, in order to improve the dispersibility of pigments, conventionally known pigment dispersing agents and surfactants can be added. As such dispersing agents, many kinds of compounds are used, and there are listed, for example, cationic surfactants such as a phthalocyanine derivative (trade name: EFK-745, manufactured by Morishita Sangyo K.K.), organosiloxane polymer (trade name: KP-341, manufactured by Shine-Etsu Chemical Co., Ltd.), (meth)acrylic acid (co)polymers (trade name: Polyflow No. 75, No. 90, No. 95, manufactured by Kyoei Sha Yushi Kagaku Kogyo), W001 (trade name, manufactured by Yusho K.K.), and the like; nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty ester and the like; fluorine surfactants such as F Top EF 301, EF303, EF352 (trade name, manufactured by Shin Akita Kasei), Megafak F171, F172, F173 (trade name, manufactured by Dainippon Ink & Chemicals, Inc.), Florad FC430, FC431 (trade name, manufactured by Sumitomo 3 M K.K.), Asahi Guard AG710, Surflon S382, SC-101, SC-102, SC-103, SC-104, SC-10S, SC-1068 (trade name, manufactured by Asahi Glass Co., Ltd.); anion surfactants such as W004, W005, W017 (trade name, manufactured by Yusho K.K.); polymer dispersing agents such as EFKA-46, EFKA-47, EFKA-47EA, EFKA-polymer 100, EFKA-polymer 400, EFKA-polymer 401, EFKA-polymer 450 (trade name, manufactured by Morishita Sangyo K.K.), Disperse Aid 6, Disperse Aid 8, Disperse Aid 15, Disperse Aid 9100 (trade name, manufactured by Sun Nopko), and the like; various dispersing agents such as Solsperse 3000, 5000, 9000, 12000, 13240, 13940, 17000, 24000, 26000, 28000 (trade name, manufactured by Geneka K.K.); Adeka Pluronic L31, F38, L42, L44, L61, L64, F68, L72, P95, F77, P84, F87, P94, L101, P103, F108, L121, P-123 (trade name, manufactured by Asahi Denka Kogyo K.K.) and Isonet S-20 (trade name, manufactured by Sanyo Chemical Industries, Ltd.).

Next, preferably used embodiments of the pigment dispersion thus obtained will be described.

The average particle size (average size) of a pigment is very important. When the average particle size is large, undesirable light scattering occurs, and resultantly, when used as a sensitive material, transmittance thereof decreases, and light necessary for photo polymerization can not be imparted into a photosensitive layer. Scattering is particularly remarkable when light of shorter wavelength is used as a light source. Therefore, in the case of a photosensitive planographic printing plate precursor aiming at use of a light source of relatively shorter wave length as in the aspect of the present invention, it is preferable that the average particle size of a pigment is as smaller as possible. The influence of reduction in transmittance by scattering depending on a particle size as described above is remarkable. Even if a structure of a pigment colored substance is selected and absorption property is suitably set so that a transmittance at 400 nm increases, when the particle size is large, the transmittance at 400 nm decreases, inviting substantial reduction in sensitivity of the photosensitive layer. On the other hand, when the particle size is too small, dispersion stability tends to be deficient, and undesirable problems such as coagulation, precipitation and the like occur in a photosensitive layer. From these standpoints, it is desirable that the pigment used in the present invention has an average particle size from 0.01 to 0.7 $\mu$m, more desirably, from 0.01 to 0.4 $\mu$m. More particularly, the proportion of particles having a particle size of 0.4 $\mu$m or less is 70% by weight or more, more preferably 80% by weight or more on the total particle amount, and the average particle size is preferably from 0.01 to 0.4 $\mu$m, more preferably from 0.02 to 0.35 $\mu$m.

The amount of a pigment to be used in the present invention is controlled to have the upper limit so as not to remarkably decrease polymerization reactivity of photosensitive layer components and developing processing property of the photosensitive planographic printing plate precursor. On the other hand, the lower limit thereof is so set as to obtain a sufficient effect for improving fogging property. These differ depending on optical property of each pigment. It is usually from 0.001 to 5 $g/m^2$, preferably from 0.05 to 4 $g/m^2$, more preferably from 0.1 to 2 $g/m^2$. On the other hand, judging from optical property, absorption at 500 nm ascribed to a pigment in the photosensitive layer, having excellent fogging property, is 0.1 or more, preferably 0.3 or more, more preferably 0.5 or more.

Further, various conventionally known methods are also applicable for desirable use of pigments. Particularly, if a polymer having an aliphatic double bond on the main chain or side chain is allowed to co-exist in dispersing a pigment, as described in JP-A No. 8-101498, a photosensitive layer having higher sensitivity can be obtained. In addition, as conventional suggestions in use of a pigment in a optical polymerization system, there are JP-A No. 10-282647, and 9-230601 and the like.

Other Components

In a photosensitive layer of a photosensitive planographic printing plate precursor, other components suitable for use, production method and the like thereof can be appropriately used.

Sensitizing Pigment

In a photosensitive layer of a photosensitive planographic printing plate precursor of one aspect of the present invention, a sensitizing pigment is suitably used, if necessary, for the purpose of enhancing sensitivity. This sensitizing pigment is used together with the above-described titanocene compound and called an optical initiation system. A preferable sensitizing pigment has an absorption property in a photosensitive layer, in which absorbance at 400 nm is higher than absorbance at 500 nm. A further preferable sensitizing pigment has an optical sensitivity property in which the maximum photosensitive wave length is shorter than 450 nm, more preferably shorter than 430 nm, and longer than 300 nm, more preferably, longer than 350 nm. A sensitizing pigment in the present invention can be used without restriction providing it satisfies these properties.

As a sensitizing pigment having such properties, there are listed, for example, merocyanine pigments represented by the following general formula (1), styryl pigments represented by the following general formula (2), benzopyranes represented by the following general formula (3), coumarins, aromatic ketones represented by the following general formula (4), anthracenes represented by the following general formula (5) and the like.

General formula (1)

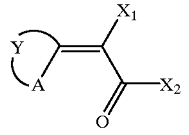

(wherein, A represents an S atom or $NR_1$, $R_1$ represents a monovalent non-metal atom group; Y represents an adjacent A and non-metal atom group which forms a basic nucleus of a pigment together with an adjacent carbon atom; each of $X_1$ and $X_2$ independently represents a monovalent non-metal atom group; and $X_1$ and $X_2$ may be mutually bonded to form an acidic nucleus of a pigment.)

General formula (2)

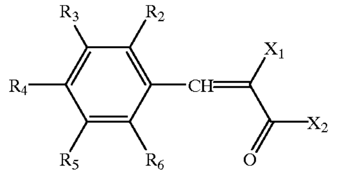

(wherein $X_1$ and $X_2$ are as defined in the general formula (1) each of $R_2$ to $R_6$ independently represents a monovalent non-metal atom group, and preferably, at least one of $R_2$ to $R_6$ is an electron donative substituent having negative Hammett's substituent constant.)

General formula (3)

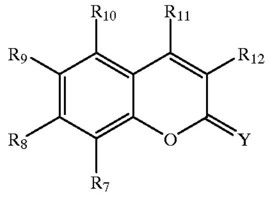

Partial structural formula (1)

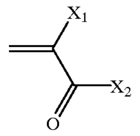

(wherein =Y represents a carbonyl group, thiocarbonyl group, imino group or, an alkylidene group represented by the above-described partial structure formula (1); $X_1$ and $X_2$ are as define in the general formula (1); and each of $R_7$ to $R_{12}$ independently represents a monovalent non-metal atom group.)

General formula (4)

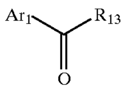

(wherein $Ar_1$ represents an aromatic group or hetero aromatic group optionally having a substituent; $R_{13}$ independently represents a monovalent non-metal atom group. Preferably, $R_{13}$ represents an aromatic group or hetero aromatic group, and $Ar_1$ and $R_{13}$ may be mutually bonded to form a ring.)

General formula (5)

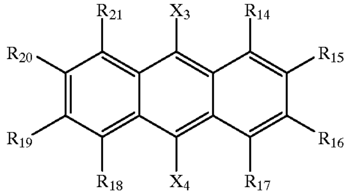

(wherein each of $X_3$, $X_4$, $R_{14}$ to $R_{21}$ independently represents a monovalent non-metal atom group. Preferably, $X_3$ and $X_4$ represent an electron donative group having negative Hammett's substituent constant.)

In the general formulae (1) to (5), preferable examples of the monovalent non-metal atom group represented by $X_1$ to $X_4$, and $R_1$ to $R_{12}$ include a hydrogen atom, alkyl groups (for example, a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, 2-norbornyl group, chloromethyl group, bromomethyl group, 2-chloroethyl group, trifluoromethyl group, methoxymethyl group, methoxyethoxyethyl group, allyloxymethyl group, phenoxymethyl group, methylthio group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carbonylpropyl group, methoxycarbonylethyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl) carbamoylethyl group, N-methyl-N-(sulfophenyl) carbamoylmethyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonophenyl) sulfamoyloctyl group, phosphonobutyl group, phosphonatohexyl group, diethylphosphonobutyl group, diphenylphosphonopropyl group, methylphosphonobutyl group, methylphosphanatobutyl group, tolylphosphonohexyl group, tolylphosphanatohexyl group, phosphonooxypropyl group, phosphanatooxybutyl group, benzyl group, phenetyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propinyl group, 2-butinyl group, 3-butinyl group), aryl groups (for example, a phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxyphenylcarbonyl group, phenoxycarbonylphenyl group, N-phenylcarbamoylphenyl group, phenyl group, cyanophenyl group, sulfophenyl group, sulfonatophenyl group, phosphonophenyl group, phosphanatophenyl group and the like), heteroaryl groups (for example, thiophene, thiathrene, furan, pyrane, isobenzofuran, curomene, xanthene, phenoxazine, pyrrole, pyrazole, isothiazole, isooxazole, pyrazine pyrimidine, pyridazine, indolidine, isoindolidine, indoyl, indazole, purine, quinolidine, isoquinoline, phthalazine, naphthylidine, phenanthrene, acridine, perymidine, phenanthroline, phthalazine, phenalzasine, phenoxazine, furazane, phenoxazine and the like), alkenyl groups (for example, a vinyl group, 1-propenyl group, 1-butenyl group, cinnamyl group, 2-chloro-1-etenyl group and the like), alkenyl groups (for example, an ethinyl group, 1-propinyl group, 1-butinyl group, trimethylsilylethinyl group and the like), halogen atoms (—Fr, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyl group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N-aryl-N-alkylureido group, N'-alkyl-N-aryl-N-arylureido group, alkoxycarbonylamino group, aryloxycarbonylamino group, N-alkyl-N-alkoxycarbonylamino group, N-alkyl-N-aryloxycarbonylamino, N-aryl-N-alkoxycarbonylamino, N-aryl-N-aryloxycarbonylamino, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo ($—SO_3H$), and conjugated basic groups (hereinafter, referred to as a sulfonato group), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, phosphono group ($—PO_3H_2$) and conjugated basic groups (hereinafter, referred to as a sulfonato group), dialkylphosphono group ($—PO_3(alkyl)_2$), diarylphosphono group ($—PO_3(aryl)_2$), alkylarylphosphono group ($—PO_3(alkyl)(aryl)$), monoalkyl phosphono group ($—PO_3(alkyl)$) and conjugated basic groups (hereinafter, referred to as a alkylphosphonato group), monoarylphosphono group ($—PO_3(aryl)$) and conjugated basic groups (hereinafter, referred to as a arylphosphonato group), phosphono group ($—OPO_3H_2$) and conjugated basic groups (hereinafter, referred to as a arylphosphonatooxy group), dialkylphosphonooxy group ($—OPO_3(alkyl)—$,), diarylphosphonooxy group ($—OPO_3(aryl)_2$), alkylarylphosphonooxy group ($—OPO_3(alkyl)(aryl)$), monoalkylphosphonooxy group ($-OPO_3H(alkyl)$) and conjugated basic groups (hereinafter, referred to as a alkylphosphonatooxy group), monoarylphosphonooxy group ($—OPO_3H(aryl)$) and conjugated basic groups (hereinafter, referred to as a arylphosphonatooxy group), cyano group, nitro group and the like, and among the above-described substituents, a hydrogen atom, alkyl group, aryl group, halogen atom, alkoxy group and acyl group are particularly preferable.

In the general formula (1), as a basic nucleus of a pigment formed by A adjacent to Y, and an adjacent carbon atom, 5, 6, 7-membered nitrogen-containing, or sulfur-containing heterocyclic rings are listed, and 5, 6-membered heterocyclic rings are preferable.

As examples of the nitrogen-containing heterocyclic ring, any of merocyanine pigments described in, for example, L. G. Brooker et at., J. Am. Chem. Soc., 73, 5326 to 5358 (1951) and references, and those known to constitute a basic nucleus, can be suitably used. Examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole and the like), benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxyethylenebenzothiazole, 5-hydroxybenzothiazole, 6-hydroxybenzothiazole, 6-dimethylaminobenzothiazole, 5-ethoxycarbonylbenzothiazole and the like), naphthothiazoles (for example, naphtho[1,2]thiazole, naphtho[2,1]thiazole, 5-methoxynaphtho [2,1]thiazole, 5-ethoxynaphtho [2,1] thiazole, 8-methoxynaphtho [1,2]thiazole, 7-methoxynaphtho [1,2]thiazole and the like), thianaphtheno-7',6',4,5-thiazoles (for example, 4'-methoxythianaphtheno-7',6',4,5-thiazole and the like), oxazoles (for example, 4-methyloxazole, 5-methyloxazole, 4-phenyloxazole, 4,5-diphenyloxazole, 4-ethyloxazole, 4,5-dimethyloxazole, 5-phenyloxazole and the like), benzooxazoles (benzooxazole, 5-chlorobenzooxazole, 5-methylbenzooxazole, 5-methylbenzooxazole, 5-phenylbenzooxazole, 6-methylbenzooxazole, 5,6-dimethylbenzooxazole, 4,6-dimethylbenzooxazole, 6-methoxybenzooxazole, 5-methoxybenzooxazole, 6-methoxybenzooxazole, 4-ethoxybenzooxazole, 5-chlorobenzooxazole, 6-methoxybenzooxazole, 5-hydroxybenzooxazole, 6-hydroxybenzooxazole and the like), naphthooxazoles (for example, naphthol[1,2]oxazole, naphtho[2,1]oxazole and the like), selenazoles (for example, 4-methylselenazole, 4-phenylselenazole and the like), benzoselanazoles (for example, benzoselenazole, 5-chlorobenzoselenazole, 5-methoxybenzoselenazole, 5-hydroxybenzoselenazole, tetrahydrobenzoselenazole and the like), naphthoselenazoles (for example, naphtho[1,2]selenazole, naphtho[2,1] selanazole and the like), thiazolines (for example, thiazoline, 4-methylthiazoline, and the like), 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-methoxyquinoline, 6-hydroxyquinoline, 8-hydroxyquinoline and the like), 4-quinolines (for example, quinoline, 6-methoxyquinoline, 7-methylquinoline, 8-methylquinoline and the like), 1-isoquinolines (for example, isoquinoline, 3,4-dihydroisoquinoline and the like), 3-isoquinolines (for example, isoquinoline and the like), benzimidazoles (for example, 1,3-diethylbenzimidazole, 1-ethyl-3-phenylbenzimidazole and the like), 3,3-dialkylindolenines (for example, 3,3-dimethylindolenine, 3,3,5-trimethylindolenine, 3,3,7-trimethylindolenine, and the like), 2-pyridines (for example, pyridine, 5-methylpyridine and the like), 4-pyridine (for example, pyridine and the like); and the like.

As examples of the sulfur-containing heterocyclic ring, there are listed, for example, dithiol partial structures in pigments described in JP-A No. 3-296759.

Specific examples thereof include benzothiazoles (for example, benzothiazole, 5-t-butylbenzothiazole, 5-methylbenzothiazole and the like), naphthodithiols (for example, naphtho[1,2]dithiol, naphtho[2,1]dithiol and the like), dithiols (for example, 4,5-dimethyldithiols, 4-phenyldithiols, 4-methoxycarbonyldithiols, 4,5-dimethoxycarbonylbenzodithiols, 4,5-ditrifluoromethyldithiol, 4,5-dicyanodithiol, 4-methoxycarbonylmethyldithiol, 4-carboxymethyldithiol and the like), and the like.

Though, names of heterocyclic mother skeletons are used customarily, for convenience, in descriptions for illustrating the heterocyclic rings described above, in the case of a basic skeleton partial structure of a sensitizing pigment, for example, a benzothiazole skeleton, is introduced in the form of a substituent form of alkylidene type wherein degree of unsaturation is lowered by one degree, like a 3-substituted-2(3H)benzothiazolylindene group.

More specific examples of the sensitizing pigments represented by the general formulae (1) to (5) will be shown below. However, the sensitizing pigment which can be used in the present invention is not limited to them.

(D1)

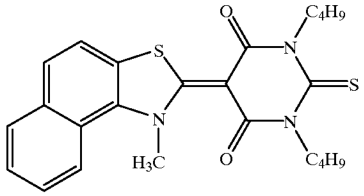

(D2)

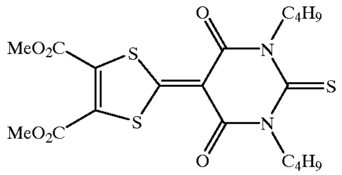

(D3)

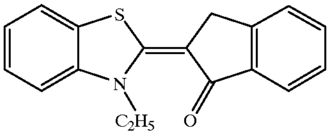

(D4)

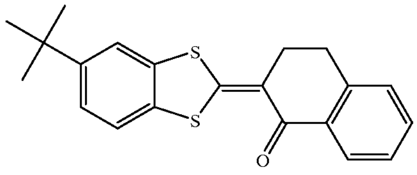

(D5)

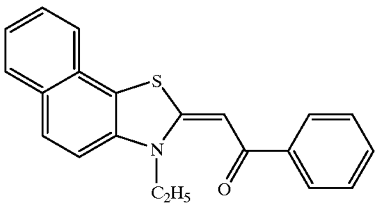

(D6)

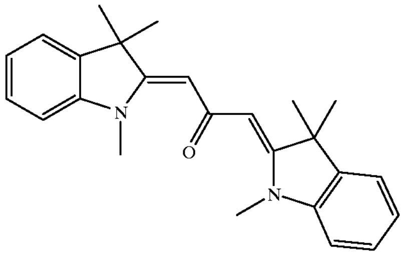

-continued
(D7)
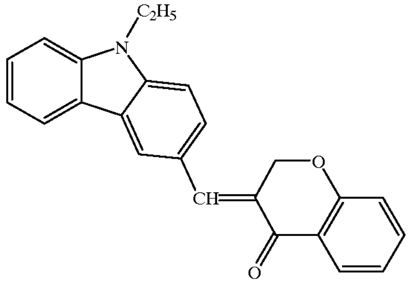
(D8)
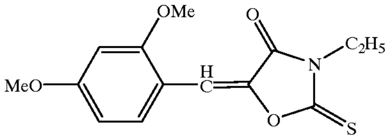
(D9)
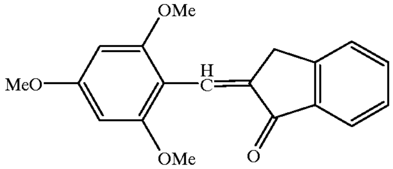
(D10)
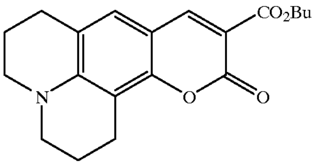
(D11)
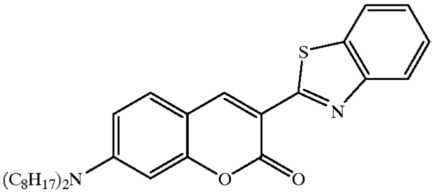
(D12)
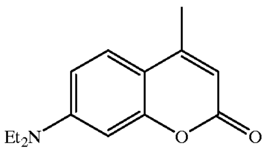
(D13)
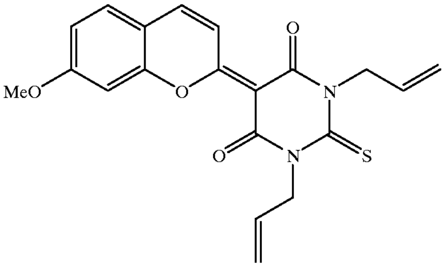
-continued
(D14)
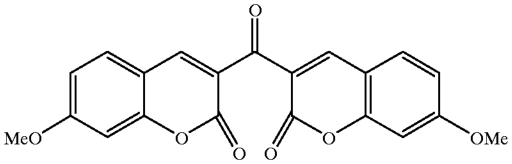
(D15)
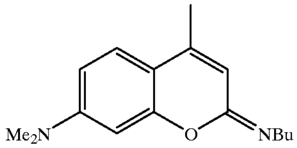
(D16)
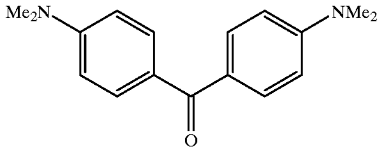
(D17)
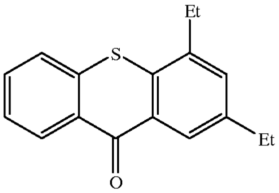
(D18)
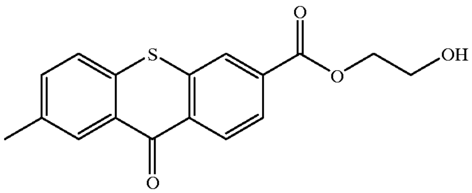
(D19)
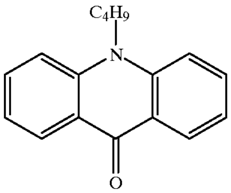
(D20)
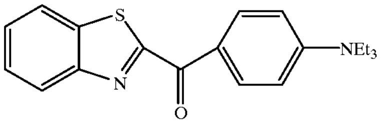
(D21)
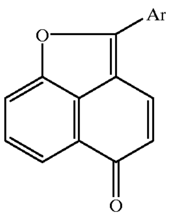

-continued (D22)

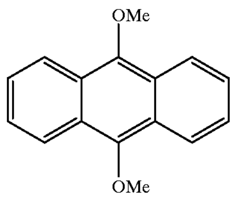

(D23)

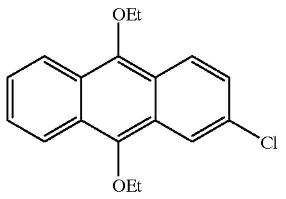

Regarding the sensitizing pigment of the present invention, various chemical modifications can be conducted for improving properties of the photosensitive layer. For example, strength of an exposed film can be highly increased and unnecessary separation of a pigment from the film after exposure can be suppressed by bonding the sensitizing pigment to the above-described additional polymerizable compound structure (for example, an acryloyl group, methacryloyl group) via a covalent bond, ion bond, hydrogen bond and the like. Further, photosensitivity can be remarkably enhanced under particularly low concentration of an optical initiation system, by bonding of a sensitizing pigment with the above-described titanocene compound and other radical generating parts (for example, reduction decomposable sites such as an alkyl halide, onium, peroxide, biimidazole, onium, biimidazole and the like, oxidation disintegrating sites such as a borate, amine, trimethylsilylmethyl, carboxymethyl, carbonyl, imine and the like). Further, for the purpose of enhancing suitability to be treated in an (alkali) aqueous developing solution, which is a preferable for the photosensitive layer, it is effective to introduce a hydrophilic site (acid groups or polar groups such as carboxyl groups and esters thereof, sulfonic group and esters thereof, ethylene oxide group and the like). Particularly, an ester type hydrophilic group has features that it is excellent in compatibility in the photosensitive layer due to a relatively hydrophobic structure and it generates an acid group by hydrolysis, increasing hydrophilicity, in a developing solution. Additionally, for example, a substituent can be appropriately introduced in order to improve compatibility in the photosensitive layer and to suppress crystal deposition. For example, in a certain kind of photosensitive system, unsaturated bonds such as an aryl group, allyl group and the like may extremely effecting in improving compatibility, and crystal deposition can be suppressed remarkably by introducing steric hindrance between pigment π planes according to a method such as introduction of a branched alkyl structure, and the like. Further, close contact of a metal, metal oxide and the like to an inorganic substance can be improved by introduction of phosphonate group, epoxy group, trialkoxysilyl group and the like. In addition, methods such as making a polymer of a sensitizing pigment, and the like can also be used, according to an intention.

Details of the method such as the kind of structures, single use or co-use of two or more, and an amount to be added, of these sensitizing pigments can be set appropriately according to the intended abilities of the sensitive material. For example, by using two or more sensitizing pigments together, compatibility of the photosensitive layer of the photosensitive planographic printing plate precursor of the present invention can be enhanced. In selection of a sensitizing pigment, molar absorption coefficient at the emission wave length of a light source used is an important factor, in addition to photosensitivity. Use of a pigment having large molar absorption coefficient is economical since addition amount of a pigment can be relatively reduced, and is advantageous also from film properties of a photosensitive layer. Since photosensitivity and resolution of a photosensitive layer of a photosensitive planographic printing plate precursor of the present invention, and physical properties of an exposed film exert large influence on absorbance at light source wave length, addition amount of a sensitizing pigment is appropriately selected in view of these factors. For example, sensitivity decreases in a region wherein absorbance is as low as 0.1 or less. Further, resolution lowers by an influence of halation. However, for hardening a thick film of 5 μm or more, such low absorbance may rather raise degree of hardening sometimes. In a region wherein absorbance is as high as 3 or more, most of lights are absorbed on the surface of the photosensitive layer, hardening in more inner portions is inhibited, and for example, when used as a printing plate, film strength and close contact with a substrate are insufficient. In use at relatively smaller thickness, it is preferable that addition amount of a sensitizing pigment is so controlled that absorbance of a photosensitive layer thereof is in a range from 0.1 to 1.5, preferably from 0.25 to 1. It is usually from 0.05 to 30 parts by weight, preferably from 0.1 to 20 parts by weight, further preferably from 0.2 to 10 parts by weight on 100 parts by weight of components of the photosensitive layer.

Binder Polymer

It is preferable to use a binder polymer in the photosensitive layer of the photosensitive planographic printing plate precursor of the present invention. As the binder, a linear organic polymer having higher molecular weight is preferably contained. As such a "linear organic polymer" having higher molecular weight, any one may be used. Preferably, there are selected linear organic polymers having higher molecular weight, which have water-solubility or weak alkali aqueous solution-solubility or swellability, enabling water development or weak alkali aqueous solution development. The linear organic polymer having higher molecular weight is selected and used according to use not only as a film forming agent for a photosensitive layer but also as water, weak alkali aqueous solution or organic solvent developing agent. For example, when a water-soluble organic polymer having higher molecular weight is used, water development is made possible. As such a linear organic polymer having higher molecular weight, there are additional polymers having a carboxyl group on the side chain, for example, those described in JP-A No. 59-44615, JP-B Nos. 54-34327, 58-12577, 54-25957, JP-A Nos. 54-92723, 59-53836 and 59-71048, namely, methacrylic acid copolymers, acrylic acid copolymers, itaconic acid copolymers, crotonic acid copolymers, maleic acid copolymers, partial ester maleic acid copolymers and the like. Likewise, there are acidic cellulose derivatives having a carboxyl group on the side chain. In addition, those obtained by adding a cyclic acid anhydride to addition polymers having a hydroxyl group are useful.

Particularly, among them, [benzyl (meth)acrylate/(meth) acrylic acid/other addition polymerizable vinyl monomer, if necessary] copolymers and [allyl (meth)acrylate/(meth) acrylic acid/other addition polymerizable vinyl monomer, if necessary] copolymers are suitable since they are excellent in balance between film strength, sensitivity and developing property.

Urethane binder polymers containing an acid group described in JP-B Nos. 7-12004, 7-120041, 7-120042 and 8-12424, JP-A Nos. 63-287944, 63-287947 and 1-271741, and Japanese Patent Application No. 10-116232, are advantageous in ability to withstand repeated printings and lower exposure suitability since they are significantly excellent in strength.

Also, binders having an amide group described in JP-A No. 11-171907 are suitable since they have excellent developing property and excellent film strength simultaneously.

Further, additionally, as the water-soluble linear organic polymer, polyvinylpyrrolidone, polyethylene oxide and the like are useful. For enhancing strength of a hardened film, polyethers produced from alcohol-soluble nylon, or 2,2-bis-(4-hydroxyphenyl) propane and epichlorohydrin, and the like are also useful. These linear organic polymer having higher molecular weight can be blended in any amount on all components of a photosensitive layer. However, when it is over 90% by weight, preferable results are not obtained from the standpoints of strength of an image to be formed, and the like. It is preferably from 30 to 85% by weight. Weight ration of a compound having a photopolymerizable ethylenically unsaturated double bond to a linear organic polymer having higher molecular weight is preferably in a range from 1/9 to 7/3. In a preferable embodiment, a binder polymer that is substantially water-insoluble and alkali-soluble is used. By this, an organic solvent that is environmentally undesirable can be omitted or can be restricted to extremely smaller use amount, in a developing solution. In such a method, acid value of a binder polymer (acid content per 1 g of a polymer is represented in terms of chemical equivalence number) and molecular weight are appropriately selected from the standpoints of image strength and developing property. The acid value is preferably from 0.4 to 3.0 meq/g, the molecular weight is preferably from 3000 to 500000, and more preferably, the acid value is from 0.6 to 2.0 and the molecular weight is from 10000 to 300000.

Co-sensitizer

A photosensitive layer of a photosensitive planographic printing plate precursor of the aspect of the present invention can obtain further improved sensitivity by using a certain kind of additive (hereinafter, referred to as a co-sensitizer). Action mechanism thereof is not apparent, and is believed to be on the following chemical process, in may cases. Namely, it is hypothesized an active radical is newly produced by reaction of a co-sensitizer with various intermediate active species (radical, peroxide, oxidizer, reducing agent, and the like) occurred in processes of an optical reaction initiate by light absorption of the above-described optical initiation system and the subsequent addition polymerization reaction. These are roughly classified into (a) those which are reduced to produce an active radical, (b) those which are oxidized to produce an active radical, and (c) those which react with a radical having lower activity to be converted into a radical having higher activity, and a consensus is often lacking regarding belonging of each compound.

(a) Compound Which is Reduced to Produce Active Radical

Compound having carbon-halogen bond: It is believed that a carbon-halogen bond is broken reductively to generate an active radical. Specifically, for example, trihalomethyl-2-triazines, trihalomethyloxaziazoles and the like can be suitably used.

Compound having nitrogen-nitrogen bond: It is believed that a nitrogen-nitrogen bond is broken reductively to generate an active radical. Specifically, for example, hexaarylbiimidazoles and the like are suitably used.

Compound having oxygen-oxygen bond: It is believed that an oxygen-oxygen bond is broken reductively to generate an active radical. Specifically, for example, organic peroxides and the like are suitably used.

Onium compound: It is believed that a carbon-hetero bond and an oxygen-nitrogen bond are reductively broken to generate an active radical. Specifically, there are suitably used, for example, diaryl iodonium salts, triaryl sulfonium salts, N-alkoxypyridinium (azinium) salts, and the like.

Ferrocene, iron allene complexes: An active radical can be produced reductively.

(b) Compound Which is Oxidized to General an Active Radical

Alkylate complex: It is believed that a carbon-hetero bond is broken oxidatively to general an active radical. Specifically, triarylalkyl borates, for example, are suitably used.

Alkylamine compound: It is believed that a C—X bond on a carbon adjacent to nitrogen is broken by oxidation, to general an active radical. As X, there are listed a hydrogen atom, carboxyl group, trimethylsilyl group, benzyl group and the like are suitable. Specifically, there are listed, for example, ethanolamines, N-phenylglycines, N-trimethylsilylmethylalinines and the like.

Sulfur-containing, tin-containing compound: Those obtained by substituting a nitrogen atom of the above-described amines with a sulfur atom and tin atom can generate an active radical by the same action. Compounds having an S—S bond are also known to reveal sensitization by breaking of S—S.

α-Substituted methylcarbonyl compound: An active radical can be produced by breaking a carbonyl-α-carbon bond by oxidation. Further, those obtained by converting a carbonyl to an oxime ether show the same action. Specifically, there are listed 2-alkyl-1-[4-(alkylthio)phenyl]-2-morpholinopronone-1s, and oxime ethers obtained by reacting the pronones with hydroxyamines, then, converting N—OH into ether.

Sulfinic acid salts: An active radical can be produced reductively. Specifically, there are listed sodium arylsulfinate and the like.

(c) Compound Which Reacts With a Radical to Give a Highly Active Radical, or Acts as a Chain Transfer Agent:

For example, a group of compounds having SH, PH, SiH, GeH and the molecule is used. These impart hydrogen to low active radical species to produce a radical, or, can be oxidized, then, subjected to de-proton, to general a radical. Specifically, there are listed, for example, 2-mercaptobenzimidazole and the like.

As more specific examples of these co-sensitizer, a lot of compounds are described, for example, in JP-A No. 9-236913, as additives aiming at improvement in sensitivity. Parts of these compounds are listed below. However, the present invention is not limited to them.

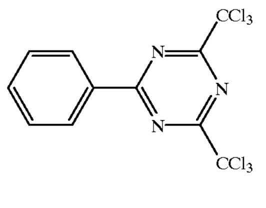

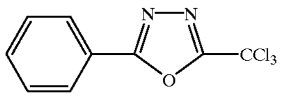

-continued

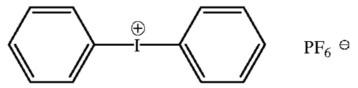

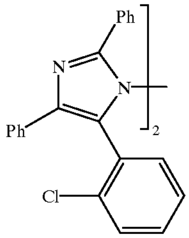

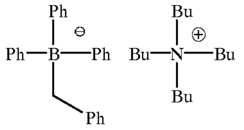

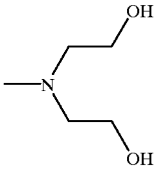

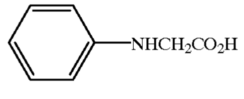

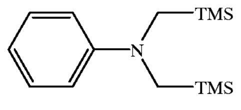

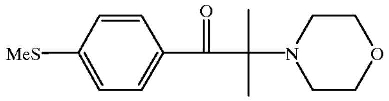

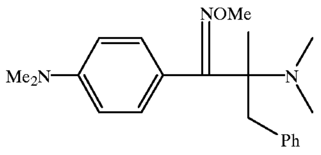

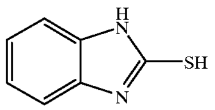

Regarding these co-sensitizers, various chemical modifications can be further conducted for improving properties of the aspect of the photosensitive layer of the photosensitive planographic printing plate precursor of the present invention, likewise in the above-described sensitizing pigment. For example, bonding with a sensitizing pigment, activating agent, addition polymerizable unsaturated compound and other parts, introduction of a hydrophilic site, introduction of a substituent for improving compatibility and suppressing crystal deposition, introduction of a substituent for improving close contact, polymer formation, and the like can be utilized.

These sensitizers can b used alone or in combination of two or more. The use amount is suitably from 0.05 to 100 parts by weight, preferably from 1 to 80 parts by weight, further preferably from 3 to 50 parts by weight on 100 parts by weight of a compound having an ethylenically unsaturated double bond.

Polymerization Inhibitor

Further, in the aspect of the present invention, it is desirable to add a small amount of a heat polymerization preventing agent for inhibiting unnecessary heat polymerization of a compound having a polymerizable ethylenically unsaturated double bond in production or storage of a photosensitive layer component composition, separately. As the suitable heat polymerization preventing agent, there are listed hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (I) salt, and the like. The addition amount of a heat polymerization preventing agent is preferably from about 0.01% by weight to about 5% by weight on the total weight of the composition. If necessary, it is also permissible that a higher fatty acid derivative such as behenic acid and behenic amide is added, and allowed to exist unevenly on the surface of a photosensitive layer in a drying process after coating of a photosensitive layer of a photosensitive planographic printing plate precursor of the present invention, for preventing polymerization inhibition by oxygen. The addition amount of the higher fatty acid derivative is preferably from about 0.5% by weight to about 10% by weight on the whole composition.

Coloring Agent

Further, coloring agents such as a dye or a pigment may be added for the purpose of coloring a photosensitive layer of a photosensitive planographic printing plate precursor of the present invention. By the addition of the coloring agent, so-called plate inspection properties such as visibility after plate production, image concentration measuring machine suitability, as a printing plate, can be improved. As the coloring agent, a pigment is particularly preferable since most dyes cause reduction in sensitivity of a photopolymerization type photosensitive layer. As specific examples thereof, there are, for example, phthalocyanine pigments, azo pigments, pigment such as carbon black, titanium oxide and the like, Ethyl Violet, crystal Violet, azo dyes, anthraquinone dyes, cyanine dyes and the like. The amount of a dye and a pigment to be added is preferably from about 0.5% by weight to about 5% by weight on the whole composition.

Other Additives

Further, known additives such as inorganic fillers, other plasticizers, sensitizers which can improve ink adhering property on the surface of a photosensitive layer and the like, may also be added for improving physical properties of a hardened film of a photosensitive layer of a photosensitive planographic printing plate of the aspect of the present invention.

Examples of the plasticizer include dioctyl phthalate, didodecyl phthalate, triethylene glycol dicaprylate, diethyl glycol phthalate, tricresyl phosphonate, dioctyl adipate, dibutyl sebacate, triacetylglycerine and the like. When a bonding agent is used, it can be added in an amount of 10% by weight or less on the total amount of a compound having an ethylenically unsaturated double bond and the bonding agent.

Moreover, an UV initiator, heat crosslinking agent and the like can also be added to reinforce an effect of heating and exposure after developing for the purpose of improving film strength (ability to withstand repeated printings) described later of the photosensitive layer of the photosensitive planographic printing plate precursor of the present invention.

In addition, additives can be used and an intermediate layer can be provided, for improving close contact of a photosensitive layer with a substrate of a photosensitive planographic printing plate precursor of the present invention, and enhancing developing removability of an unexposed photosensitive layer. For example, close contact can be improved and ability to withstand repeated printings can be enhanced by addition or by application of compounds having relatively strong mutual action with the substrate, such as compound having a diazonium structure, phosphone compounds and the like. The developing property of a non-image part and staining resistance property can be improved by the addition or application of hydrophilic polymers such as polyacrylic acid and polysulfonic acid as a primer.

In applying a photosensitive layer of the aspect of the photosensitive planographic printing plate precursor of the present invention on a substrate described later, the above-described photosensitive layer component composition is dissolved in various organic solvent and used. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, ethyl lactate and the like. These solvents can be used alone or in combination. The concentration of solid components in a coating solution is suitably from 2 to 50% by weight.

It is desirable to appropriately select the coating amount of the photosensitive layer on a substrate, according to use thereof, since the coating amount exerts an influence on sensitivity and developing property of a photosensitive layer and strength and ability to withstand repeated printings of an exposed film. When the coating amount is too small, printing resistant become insufficient. On the other hand, when too large, sensitivity lower, a longer time is required for exposure, and in addition, a longer time is required also for developing processing, undesirably. In a photosensitive planographic printing plate precursor of the present invention, the coating amount is suitably from about 0.1 $g/m^2$ to about 10 $g/m^2$ on weight after drying. It is more preferably from 0.5 to 5 $g/m^2$.

Protective Layer

In the aspect of the photosensitive planographic printing plate precursor of the present invention, it is preferable to further provide a protective layer on a photosensitive layer, since exposure is usually conducted in atmosphere. The protective layer prevents mixing into a photosensitive layer of a compound having lower molecular weight such as oxygen, a basic substance and the like present in atmosphere preventing an image formation reaction caused by exposure in the photosensitive layer, and enables exposure in atmosphere. Therefore, a property desired for such a protective layer is lower permeability of a compound having lower molecular weight such as oxygen and the like, and further, it is desired that the protective layer does not substantially inhibit transmission of light used for exposure, has excellent close contact with a photosensitive layer, and can be easily removed in a developing process after exposure.

Contrivances on a protective layer as described above have been effected conventionally, and described in detail in U.S. Pat. No. 3,458,311 and JP-A No. 55-49729.

Regarding materials which can be used in a protective layer, it is advantageous to use water-soluble polymer compounds having relatively excellent crystallinity, and specifically, water-soluble polymers such as polyvinyl alcohol, polyvinylpyrrolidone, acidic celluloses, gelatin, gum Arabic, polyacrylic acid and the like are known, and of them, if polyvinyl alcohol is used as a main component, most excellent results as basic property such as oxygen insulation property and development removability are obtained. Polyvinyl alcohol used in a protective layer may also be partially substituted with an ester, ether and acetal, providing it contains an unsubstituted vinyl alcohol unit for obtaining necessary oxygen insulation property and water-solubility. Likewise, other copolymerization components may also be partially contained. As specific examples of polyvinyl alcohol, there are listed those in which 71 to 100% have been hydrolyzed and which have a molecular weight from 300 to 2400. Specific examples there of include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 and the like (these are all trade names; manufactured by Kuraray Co., Ltd.).

Components of a protective layer (selection of PVA, use of additives), coating amount thereof, and the like are selected in view of fogging property, close contact and scratch resistance in addition to oxygen insulation property and development removability. In general, when hydrolysis ratio of PVA used is higher (when content of an unsubstituted vinyl alcohol unit in a protective layer is higher) and film thickness is larger, oxygen insulation property further increases, leading to an advantage from the standpoint of sensitivity. However, when oxygen insulation property is enhanced excessively, problems are caused that an unnecessary polymerization reaction occurs in production and storing, and unnecessary fogging and generation of bolder image lines occur in image exposing. Close contact with image parts, and scratch resistance are also extremely important for handling. Namely, if a hydrophilic layer made of a water-soluble polymer is laminated on a lipophilic polymerization layer, film peeling due to adhesion deficiency tends to occur, and peeled parts cause defects such as poor film hardening and the like by polymerization inhibition of oxygen. To solve this problem, various suggestion have been made for improving adhesion between these two layers. Any of these known technologies can be applied to a protective layer in a photosensitive planographic printing plate precursor of the present invention. A method for coating such a protective layer is described in detail in, for example, U. S. Pat. No. 3,458,311 and JP-A No. 55-49729.

Further, other functions can also be imparted to a protective layer. For example, safe light property can be further enhanced without causing reduction in sensitivity, by addition of a coloring agent (water-soluble dye and the like) which manifest excellent transmission property of lights from 350 nm to 450 nm and can effectively absorb lights of 500 nm or more.

A photosensitive planographic printing plate precursor of the present invention is usually image-wisely exposed, then, unexposed parts of a photosensitive layer are removed by a developing solution, to obtain images. As a preferable developing solution used in producing a planographic printing plate from this photosensitive planographic printing plate precursor, developing solutions as described in JP-B No. 57-7427 are listed, and aqueous solution of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, ammonia water and the like, and organic alkali agents such as monoethanolamine, diethanolamine and the like, are suitable. These alkali solutions are added so that concentration thereof is from 0.1 to 10% by weight, preferably from 0.5 to 5% by weight.

These alkali aqueous solutions can contain, if necessary, a small amount of surfactants, and organic solvents such as benzyl alcohol, 2-phenoxyethanol, and 2-butoxyethanol. For example, those described in U.S. Pat. Nos. 3,375,171 and 3,615,480 are listed. Further, developing solutions described in JP-A Nos. 50-26601, 58-54341, JP-B Nos. 56-39464 and 56-42860 are also excellent.

In addition, as a process for producing a planographic printing plate from the photosensitive planographic printing plate precursor of the present invention, if necessary, the entire surface may be heated before exposure, during exposure, or between exposure and development. By such heating, an image formation reaction in a photosensitive layer is promoted, and merits can occur such as improvements in sensitivity and ability to withstand repeated printings, and stabilization of sensitivity. Further, for the purpose of improving image strength and ability to withstand repeated printings, it is also effective to conduct post heating and exposure of the entire surface of images after development. It is usually preferable to conduct heating before development under a tender condition of a temperature of 150° C. or lower. When the temperature is too high, problems occur that fogging ranges also to non-image parts, and the like. An extremely severe condition is utilized for heating after development. Usually, it is in an range from 200 to 500° C. When the temperature is too low, sufficient image reinforcing action is not obtained, and when too high, problems occur such as deterioration of a substrate, thermal decomposition of image parts, and the like.

In a system such as CTP in which exposure and development are conducted on digitalized image information, that is the main system objected by the photosensitive planographic printing plate precursor of the present invention, particularly excellent development treatment methods are applicable. In the system, digitalized image information is previously obtained. Optimum development and treatment conditions comparable with the information are then transferred to a controlling apparatus of a plate treating apparatus such as an automatic developing machine and the like. Then treatment can be conducted while appropriately selecting most suitably development and treatment conditions (developing solution making up amount, development temperature, development time, post heating time, finisher condition, post exposure condition, and the like). By this procedure, treating stability can be significantly improved, and printing ability can be remained constant. For example, JP-A No. 11-15144 suggests a method in which area information A (m2) of no-image parts and plate information X are memorized in a control part of an automatic developing machine, making up amount according to the following definition corresponding to these informations is appropriately replenished, and treatment amount of a plate material is increased steeply while controlling the use amount of a developing solution at the minimum level.

Area making up amount with automatic development solution (ml)=area making up ratio Rx (ml/$m^2$)×area A ($m^2$)

Here, Rx represent a making up amount (ml) required when plate X is developed with entire surface of 1 $m^2$ thereof being non-image parts.

In exposure of a photosensitive planographic printing plate precursor of the aspect of the present invention, known methods can be used without limitation. Desirable wave length of a light source is from 350 nm to 450 nm, and specifically, an InGaN semiconductor laser is suitable. As the exposure mechanism, any of an inner surface drum method, outer surface drum method, flat bed method and the like is acceptable. Photosensitive layer components of a photosensitive planographic printing plate precursor of the present invention can be solubilized in neutral water and weak alkaline water by using those having high water-solubility, while, a planographic printing plate precursor having such constitution can also be installed on a printing machine, then, exposed and developed on the machine.

As an available laser light source of 350 nm to 450 nm, the following sources can be utilized.

Gas lasers such as an Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW).

Solid lasers such as a combination of Nd:YAG ($YVO_4$) and SHG crystal×2 (355 nm, 5 mW to 1 W) and a combination of Cr:LiSAF and SHG crystal (430 nm, 10 mW).

Semiconductor lasers such as $KnbO_3$ ring resonator (430 nm, 30 mW), a combination of a waveguide type wavelength converting element and AlGaAs, InGaAs semiconductos (380 nm to 450 nm, 5 mW to 100 mW), a combination of a waveguide type wavelength converting element and AlGaInP, AlGaAs semiconductos (300 nm to 350 nm, 5 mW to 100 mW) and AlGaInN (350 nm to 450 nm, 5 mW to 30 mW).

Others: pulse lasers such as an $N_2$ laser (337 nm, pulse 0.1 to 10 mJ), XeF (351 nm, pulse 10 to 250 mJ).

Of them, particularly an AlGaInN semiconductor laser (commercially available InGaN semiconductor laser 400 to 410 nm, 5 to 30 mW) is suitable from the standpoints of wavelength property nd cost.

Regarding a planographic printing plate precursor exposing apparatus of scanning exposure mode, an inner surface drum method, outer surface drum method, and flat bed method as an exposure mechanism, and all of the above-described light sources other than pulse lasers can be utilized as a light source. Actually, the following exposure apparatuses are particularly preferable from the standpoint of a relation between sensitive material sensitivity and plate production time.

A single beam exposure apparatus using one gas laser or solid laser light source according to an inner surface drum method.

A multi-beam exposure apparatus using a lot of (10 or more) semiconductor laser according to a flat bed method.

A multi-beam exposure apparatus using a lot of (10 or more) semiconductor laser according to an outer drum method.

In a planographic printing plate precursor of laser direct describing type as described above, usually the equation (eq1) is satisfied between sensitive material sensitivity X (J/$cm^2$), exposure area S of sensitive material ($cm^2$), power q (W) per one laser light source, laser number n, and total exposure time t (s).

$$X \cdot S = n \cdot q \cdot t \quad \text{(eq1)}$$

i) In the Case of Inner Surface Drum (Single Beam) Method

Usually, the equation (eq2) is satisfied between laser rotation f (radian/s), sub scanning length Lx (cm) of sensitive material, resolution Z (dot/cm) and total exposure time t (s)

$$f \cdot Z \cdot t = Lx \quad \text{(eq2)}$$

ii) In the Case of Outer Surface Drum (Multi Beam) Method

Usually, the equation (eq3) is satisfied between drum rotation F (radian/s), sub scanning length Lx (cm) of sensitive material, resolution Z (dot/cm), total exposure time t (s) and beam number (n).

$$F \cdot Z \cdot n \cdot t = Lx \quad \text{(eq3)}$$

iii) In the Case of Flat Bed (Multi Beam) Method

Usually, the equation (eq4) is satisfied between rotation H of a polygon mirror (radian/s), sub scanning length Lx (cm) of sensitive material, resolution Z (dot/cm), total exposure time t (s) and beam number (n).

$$F \cdot Z \cdot n \cdot t = Lx \quad \text{(eq4)}$$

By assigning resolution required for an actual printing plate (2560 dpi), plate size (A1/B1, sub scanning length 42 inch), exposure condition of 20 pieces/1 hour, and photosensitizing property of a photosensitive planographic printing plate precursor of the present invention (photosensitizing wavelength, sensitivity: about 0.1 mJ/$cm^2$) into the above-described formulae, it can be understood that in a sensitive material of the aspect of the present invention, a combination of a semiconductor beam with a multi beam method is more preferable. Further, by taking operability, cost and the like into consideration, a combination of an outer surface drum method with a semiconductor laser beam multi beam exposure apparatus is most preferable.

As other exposure light sources for a photosensitive planographic printing plate precursor of the aspect of the present invention, there can be used ultrahigh pressure, high pressure, middle pressure, low pressure mercury lamps, chemical lamp, carbon arc lamp, xenon lamp, metal halide lamp, visible and ultraviolet laser lamps, fluorescent lamp, tungsten lamp, sunlight and the like.

EXAMPLES

The following examples illustrate the present invention in detail below. However, the scope of the present invention does not limited to them.

Example 1

Molten baths of aluminum alloys having compositions (1) to (5) shown in the following Table 1-1 were allowed to contain trace elements as shown in the following Table 1-2, to prepare molten baths of aluminum alloys containing trace elements in given amounts, respectively. After filtration of the prepared molten baths, ingots having a thickness of 500 mm and a width of 1200 mm were made, respectively, by a DC casting method. The surfaces of the resulted ingots were cut by a facing machine at an average size of 10 mm, then, heated at 550° C. for about 5 hours, to carry out soaking treatments, respectively. When the temperature decreased to 400° C., the ingots were made into rolled plates having a thickness of 2.7 mm by using a hot roller. Further, heating treatment was conducted at 500° C. using a continuous annealing machine. Then the annealed plates were cold-rolled to obtain aluminum alloy plates having a thickness of 0.24 mm, respectively.

The resulted aluminum alloy plates were subjected to any treatment of A1 to A3 and B1 to B3 described in the following Tables 1 to 3. Roughening treatment with a brush conducted in the treatments B1 and B2, three No. 8 brush (brush hair diameter: 0.5 mm) and a pumice stone suspension were used. In alkali etching treatments (1) and (2), a solution of 2.6% by weight sodium hydroxide and 6.5% by weight aluminum ion having a solution temperature of 65° C. was used as an etching solution. In electrochemical roughening treatment, a solution of 1% by weight sulfuric acid and 0.5% by weight aluminum ion was used as an electrolyte, and the treatment was conducted by alternating current. In anodizing treatment, a 15% by weight sulfuric acid solution was used as an electrolyte, and the treatment was conducted by direct current. Further, surface control treatment using sodium silicate of Al, and a method for forming a primer layer containing a polymer compound having an acid group and an onium group were conducted according to methods described in EP0904954A2. A method for forming a primer layer of a sol gel solution of As was conducted according to a method disclosed in JP-A No. 9-236911.

Separately, photosensitive layer coating solutions a to j having the following compositions were prepared, and coated and dried on the above-described substrate, or subjected to the following method, to form photosensitive layers a to j.

| | |
|---|---|
| Composition of coating solution for photosensitive layer a | |
| Carbon black dispersion | 10.0 g |
| 4-Diazodiphenylamine-formaldehyde condensate phosphoric acid hexafluoride salt | 0.5 g |
| Radical copolymer of methacrylic acid, 2-hydroxyethyl acrylate, benzylmethacrylate and acrylonitrile (molar ratio, 15:30:40:15, weight-average molecular weight: 100000) | 5.0 g |
| Maleic acid | 0.05 g |
| Fluorine surfactant (trade name "FC-430"; manufactured U.S. 3M) | 0.05 g |
| 1-Methoxy-2-propanol | 80.0 g |
| Ethyl lactate | 15.0 g |
| Water | 5.0 g |
| Composition of coating solution for photosensitive layer b | |
| Capric acid | 0.03 g |
| Copolymer of monomer having phenolic hydroxyl group, and p-aminobenzenesulfoneamide (molar ratio, 50:50, weight-average molecular weight 500000) | 0.75 g |
| m, p-Cresol novolak resin (m, p ratio = 6/4) | 0.25 g |
| p-Toluenesulfonic acid | 0.003 g |
| Tetrahydrophthalic anhydride | 0.03 g |
| Cyanine dye | 0.017 g |
| Victoria Pure Blue (dye in which counter ion of BOH is 1-naphthalenesulfonic anion) | 0.017 g |

-continued

| | |
|---|---|
| Surfactant | 0.05 g |
| (surfactant, tradename "Megafack F-177", manufactured by Dainippon Ink & Chemicals Inc.) | |
| γ-Butyrolactone | 10.0 g |
| Methyl ethyl ketone | 10.0 g |
| 1-Methoxy-2-propanol | 1.0 g |
| Composition of coating solution for photosensitive layer c | |
| Capric acid | 0.03 g |
| m, p-Cresol novolak resin (m, p ratio = 6/4) | 1.0 g |
| p-Toluenesulfonic acid | 0.003 g |
| Tetrahydrophthalic anhydride | 0.03 g |
| Cyanine dye | 0.017 g |
| Victoria Pure Blue | 0.017 g |
| (dye in which counter ion of BOH is 1-naphthalenesulfonic anion) | |
| Surfactant | 0.05 g |
| (surfactant, tradename Megafack F-177, manufactured by Dainippon Ink & Chemicals Inc.) | |
| γ-Butyrolactone | 10.0 g |
| Methyl ethyl ketone | 10.0 g |
| 1-Methoxy-2-propanol | 1.0 g |
| Composition of coating solution for photosensitive layer d | |
| Photosensitive coating solution for optical polymerization layer | |
| Tetramethylolmethane tetraacrylate | 1.5 g |
| Linear organic polymer having higher molecular weight | 2.0 g |
| Sensitizing agent | 0.15 g |
| (λmax (THF solution) 479 nm, ε = 6.9 × 104) | |
| Light initiator | 0.2 g |
| "IRGACURE 907" | 0.4 g |
| (trade name, manufactured by Ciba-Geigy) | |
| ε-phthalocyanine/linear organic higher molecular weight polymer dispersion | 0.2 g |
| Fluorine nonionic surfactant | 0.03 g |
| (tradename "Megafack F-177", manufactured by Dainippon Ink & Chemicals Inc.) | |
| Methyl ethyl ketone | 9.0 g |
| Propylene glycol monomethyl ether acetate | 7.5 g |
| Toluene | 11.0 g |
| Coating solution for oxygen insulation layer | |
| 3% by weight aqueous solution of polyvinyl alcohol | |
| (saponification degree 98 mol %, polymerization degree 500) | |
| Composition of coating solution for photosensitive layer e | |
| Coating solution for polymerization layer | 2.5 g |
| Pentaerythritol tetraacrylate | |
| 20% by weight propylene glycol monomethyl ether solution of allyl methacrylate/methacrylic acid copolymer (copolymerization ratio = 80/20) | 37.5 g |
| Pigment dispersion | 13.0 g |
| Methyl ethyl ketone | 74.0 g |
| Coating solution for photosensitizing layer (coated after coating and drying of polymerization layer) | |
| 10% by weight aqueous solution of polyvinyl alcohol having a saponification degree of 79.5% (trade name "PVA-405", manufactured by Kuraray Co., Ltd.) | 10.5 g |
| Additive | 0.41 g |
| (0.11% by weight methanol solution of a compound described in JP-A No. 9-114043, p. 18, [Chemical formula 5]) | |
| Additive | 0.41 g |
| (0.11% by weight methanol solution of a compound described in JP-A No. 9-114043, p. 18, [Chemical formula 6]) | |
| Silver halide emulsion | 0.50 g |
| (silver halide emulsion described in JP-A No. 9-114043, p. 17, [0090] to [0093]) | |
| Surfactant | 0.40 g |
| (5% by weight aqueous solution of a compound described in JP-A No. 9-114043, p. 19, [Chemical formula 7]) | |
| Water | 7.80 g |
| Reducing agent dispersion | 1.20 g |
| Coating solution for oxygen insulation layer (coated after coating and drying of photosensitizing layer) | |
| 10% by weight aqueous solution of polyvinyl alcohol having a saponification degree of 98.5% (trade name "PVA-105", manufactured by Kuraray Co., Ltd.) | 200.0 g |

-continued

| | |
|---|---|
| Base precursor dispersion (dispersion of a compound described in JP-A No. 9-114043, p. 19, [Chemical formula 9]) | 1.25 g |
| Aqueous solution of surfactant | 4.0 g |
| Composition of coating solution for photosensitive layer f | |
| Coating solution for resin layer | |
| Naphthoquinone-1,2-diazide-(2)-5-sulfonate ester of acetone-pyrogallol solution resion | 5.0 g |
| Cresol-formaldehyde resin | 10.0 g |
| Methyl ethyl ketone | 150.0 g |
| Cyclohexanone | 122.0 g |
| Coating solution for photosensitizing layer (coated after coating and drying of resin layer) | |
| Silver chloride bromide gelatin emulsion (Cl: 70 mol %, Br: 30 mol %, average particle size: 0.28 μm, amount of gelatin per 1 kg of emulsion: 55 g, silger halide content: 0.85 mol) | 1000.0 g |
| 0.1% methanol solution of 1,3-diethyl-5-[2-(3-(3-sulfopropyl)benzoxazol-2-ylidene)ethylidene]thiohydantoin sodium salt | 50.0 ml |
| 0.5% alkali aqueous solution of 4-hydroxy-6-methyl-1,3,3a,7-tetraazaindene | 100.0 ml |
| 2% aqueous solution of 4-dichloro-6-hydroxy-s-triazine | 35.0 g |
| Physical development nucleus layer | |
| A silver sol prepared by Carey Lea method was coated in a dry weight of 5 $mg/m^2$ in terms of silver amount. | |
| Silver halide layer (coated on physical development nucleus layer) | |
| A silver chloride bromide emulsion having an average particle size of 0.3 μm composed of 40 mol % of a chloride and 60 mol % of a bromide (silver salt:gelatin (by weight) = 1:1) was coated at an amount of 2.0 $g/m^2$. | |
| Composition of coating solution for photosensitive layer h | |
| Coating solution for photoconductive layer | |
| Fastogen Blue 8120 (trade name, non-metal phthalocyanine, manufactured by Dainippon Ink & Chemicals, Inc.) | 1.0 parts by weight |
| Copolymer of methyl methacrylate and methacrylic acid (methacrylic acid 20 mol %) | 10.0 parts by weight |
| Tetrahydrofuran | 60.0 parts by weight |
| Cyclohexanone | 40.0 parts by weight |
| Coating solution for protective layer (coated on photoconductive layer) | |
| Polyvinylbutyral (2000-L, trade name, manufactured by Denki Kagaku Kogyo K.K.) | 2.0 parts by weight |
| Stearic acid | 0.5 parts by weight |
| Ethanol | 97.5 parts by weight |
| Composition of coating solution for photosensitive layer i | |
| Polymer compound having functional group generating sulfonic acid on side chain (compound described in JP-A No. 10-207068, p. 16 (1)) | 1.0 g |
| o-naphtoquinonediazide-4-Sulfonic acid chloride | 0.1 g |
| Dye in which counter ion of Victoria Pure Blue BOH is substituted with 1-naphthalenesulfonic anion | 0.05 g |
| Fluorine surfactant (tradename "Megafack F-176PF", manufactured by Dainippon Ink & Chemicals Inc.) | 0.06 g |
| Methyl ethyl ketone | 10.0 g |
| γ-Butyrolactone | 10.0 g |

Composition of Coating Solution For Photosensitive Layer j

A photosensitive layer j on which a silver film had been exposed was formed in the same manner as described in JP-A No. 11-139023, p. 6, [0049] and following.

As shown in the following Table 1-2, planographic printing plate precursors of Examples 1-1 to 1-48 and Comparative Examples 1-1 to 1-16 were produced by combining substrates on which various treatments had been performed with photosensitive layers a to j, respectively. Then, on the planographic printing plate precursors, images were formed using various lasers, then, subjected to a printing test. The printed images were observed, and exposure failure of non-image parts were evaluated (shown as exposure result evaluation, in the table). Further, on these printed plates, ability to withstand repeated printings was evaluated on the number of plates by which printing without reduction in image quality was possible. Further, uniformity of pits formed on the surface of the substrate by roughening treatment was also evaluated. Uniformity of pits was judged by removing a photosensitive layer from the substrate, and observing the surface of the substrate by SEM. The results are shown in the following Tables 1-3 to 1-5.

Exposure results, ability to withstand repeated printings and uniformity of pits in the examples were evaluated in comparison with exposure results, ability to withstand repeated printings and uniformity of pits in comparative examples in which plates were produced in the same manner as in the examples except that trace elements were not contained. In the following Tables 1-3 to 1-5, numerical value in the column of evaluation of ability to withstand repeated printings shows ability to withstand repeated printings in examples when ability to withstand repeated printings (number of plates by which printing was possible) of corresponding comparative examples is represented by 100.

TABLE 1-1

| Component | Al % by weight | Si % by weight | Fe % by weight | Cu % by weight | Mn % by weight | Mg % by weight | Zn % by weight | Ti % by weight |
|---|---|---|---|---|---|---|---|---|
| (1) | 99.620 | 0.06 | 0.30 | 0.017 | 0.001 | 0.001 | 0.001 | 0.03 |
| (2) | 99.452 | 0.15 | 0.35 | 0.006 | 0.001 | 0.010 | 0.001 | 0.03 |
| (3) | 99.537 | 0.1 | 0.3 | 0.02 | 0.001 | 0.015 | 0.001 | 0.03 |
| (4) | 99.796 | 0.03 | 0.10 | 0.03 | 0.001 | 0.002 | 0.001 | 0.01 |
| (5) | 99.268 | 0.15 | 0.5 | 0.03 | 0.001 | 0.02 | 0.001 | 0.03 |

TABLE 1-2

| Treating method | Brush roughening | Alkali etching treatment (1) | Death matt treatment | Electrochemical roughening treatment | Alkali etching treatment (2) | Death matt treatment | Anodizing treatment | Surface control treatment | Primer layer |
|---|---|---|---|---|---|---|---|---|---|
| A1 | None | Al solution amount 5.5 $g/m^2$ | Nitric acid spray | Electricity quantity 270 $C./dm^2$ | Al solution amount 0.2 $g/m^2$ | Sulfuric acid spray | Coated amount 2.6 $g/m^2$ | Sodium silicate treatment | Polymer containing onium group and acid group |
| A2 | Same as above | Same as above | Same as above | Same as above | Same as above | Same as above | Same as above | None | Sol gel solution |
| A3 | Same as above | Same as above | Same as above | Same as above | Same as above | Same as above | Same as above | None | None |
| B1 | Done | Al solution amount 8 $g/m^2$ | Nitric acid spray | Electricity quantity 180 C. $/dm^2$ | Al solution amount 1.0 $g/m^2$ | Sulfuric acid spray | Coated amount 2.4 $g/m^2$ | None | Siliatin |
| B2 | Done | Same as above | Same as above | Same as above | Same as above | Same as above | Same as above | None | β-alanine |

TABLE 1-3

| | Basic component | Trace element: Kind of element | Trace element: Addition amount (ppm) | Condition to treat substrate | Photo-sensitive layer | Evaluation of exposure result | Evaluation of ability to withstand repeated printings | Close contact of photosensitive layer | Uniformity of pit |
|---|---|---|---|---|---|---|---|---|---|
| Example 1-1 | (1) | Li | 10 | A1 | b | Excellent | 110 | Excellent | Excellent |
| Example 1-2 | (1) | Na | 10 | A1 | b | Excellent | 112 | Excellent | Excellent |
| Example 1-3 | (1) | K | 10 | A1 | b | Excellent | 108 | Excellent | Excellent |
| Example 1-4 | (1) | Rb | 10 | A1 | b | Excellent | 110 | Excellent | Excellent |
| Example 1-5 | (1) | Cs | 10 | A1 | b | Excellent | 110 | Excellent | Excellent |
| Example 1-6 | (1) | Ca | 10 | A1 | b | Excellent | 112 | Excellent | Excellent |
| Example 1-7 | (1) | Sr | 10 | A1 | b | Excellent | 110 | Excellent | Excellent |
| Example 1-8 | (1) | Ba | 10 | A1 | b | Excellent | 108 | Excellent | Excellent |
| Example 1-9 | (1) | Sc | 10 | A1 | b | Excellent | 110 | Excellent | Excellent |
| Example 1-10 | (1) | Y | 10 | A1 | b | Excellent | 108 | Excellent | Excellent |
| Example 1-11 | (1) | Nb | 10 | A1 | b | Excellent | 111 | Excellent | Excellent |
| Example 1-12 | (1) | Ta | 10 | A1 | b | Excellent | 110 | Excellent | Excellent |
| Example 1-13 | (1) | Mo | 10 | A1 | b | Excellent | 109 | Excellent | Excellent |
| Example 1-14 | (1) | W | 10 | A1 | b | Excellent | 108 | Excellent | Excellent |
| Example 1-15 | (1) | Tc | 10 | A1 | b | Excellent | 108 | Excellent | Excellent |
| Example 1-16 | (1) | Re | 10 | A1 | b | Excellent | 110 | Excellent | Excellent |
| Example 1-17 | (1) | Ru | 10 | A1 | b | Excellent | 110 | Excellent | Excellent |
| Example 1-18 | (1) | Os | 10 | A1 | b | Excellent | 110 | Excellent | Excellent |
| Example 1-19 | (1) | Rh | 10 | A1 | b | Excellent | 108 | Excellent | Excellent |
| Example 1-20 | (1) | Ir | 10 | A1 | b | Excellent | 108 | Excellent | Excellent |
| Example 1-21 | (1) | Pd | 10 | A1 | b | Excellent | 110 | Excellent | Excellent |
| Example 1-22 | (1) | Pt | 10 | A1 | b | Excellent | 112 | Excellent | Excellent |
| Example 1-23 | (1) | Ag | 10 | A1 | b | Excellent | 112 | Excellent | Excellent |
| Example 1-24 | (1) | Au | 10 | A1 | b | Excellent | 112 | Excellent | Excellent |
| Example 1-25 | (1) | C | 10 | A1 | b | Excellent | 109 | Excellent | Excellent |
| Example 1-26 | (1) | Ge | 10 | A1 | b | Excellent | 110 | Excellent | Excellent |
| Example 1-27 | (1) | P | 10 | A1 | b | Excellent | 111 | Excellent | Excellent |
| Example 1-28 | (1) | As | 10 | A1 | b | Excellent | 110 | Excellent | Excellent |
| Example 1-29 | (1) | S | 10 | A1 | b | Excellent | 108 | Excellent | Excellent |

TABLE 1-3-continued

| | Basic component | Trace element Kind of element | Trace element Addition amount (ppm) | Condition to treat substrate | Photo-sensitive layer | Evaluation of exposure result | Evaluation of ability to withstand repeated printings | Close contact of photosensitive layer | Uniformity of pit |
|---|---|---|---|---|---|---|---|---|---|
| Example 1-30 | (1) | Se | 10 | A1 | b | Excellent | 110 | Excellent | Excellent |
| Example 1-31 | (1) | Te | 10 | A1 | b | Excellent | 108 | Excellent | Excellent |
| Example 1-32 | (1) | Po | 10 | A1 | b | Excellent | 112 | Excellent | Excellent |
| Example 1-33 | (1) | Mo | 100 | A1 | b | Excellent | 115 | Excellent | Excellent |
| Example 1-34 | (2) | Mo | 10 | A1 | b | Excellent | 111 | Excellent | Excellent |
| Comparative Example 1-1 | (1) | None | — | A1 | b | Poor | 100 | Relatively poor | Relatively poor |
| Comparative Example 1-2 | (2) | None | — | A1 | b | Poor | 95 | Relatively poor | Relatively poor |

TABLE 1-4

| | Basic component | Trace element Kind of element | Trace element Addition amount (ppm) | Condition to treat substrate | Photo-sensitive layer | Evaluation of exposure result | Evaluation of ability to withstand repeated printings | Close contact of photosensitive layer | Uniformity of pit |
|---|---|---|---|---|---|---|---|---|---|
| Example 1-35 | (1) | Na, W | Total amount 3 | A1 | b | Excellent | 110 | Excellent | Excellent |
| Example 1-36 | (2) | Na, W | Total amount 3 | A1 | b | Excellent | 105 | Excellent | Excellent |
| Example 1-37 | (3) | Na, W | Total amount 3 | A1 | b | Excellent | 115 | Excellent | Excellent |
| Example 1-38 | (4) | Na, W | Total amount 3 | A1 | b | Excellent | 102 | Excellent | Excellent |
| Example 1-39 | (5) | Na, W | Total amount 3 | A1 | b | Excellent | 115 | Excellent | Excellent |
| Comparative Example 1-3 | (1) | None | — | A1 | b | Poor | 100 | Relatively poor | Relatively poor |
| Comparative Example 1-4 | (2) | None | — | A1 | b | Poor | 95 | Relatively poor | Relatively poor |
| Comparative Example 1-5 | (3) | None | — | A1 | b | Poor | 105 | Relatively poor | Relatively poor |
| Comparative Example 1-6 | (4) | None | — | A1 | b | Poor | 90 | Poor | Non-uniform |
| Comparative Example 1-7 | (5) | None | — | A1 | b | Poor | 90 | Poor | Non-uniform |

TABLE 1-5

| | Basic component | Trace element Kind of element | Trace element Addition amount (ppm) | Condition to treat substrate | Photo-sensitive layer | Evaluation of exposure result | Evaluation of ability to withstand repeated printings | Close contact of photosensitive layer | Uniformity of pit |
|---|---|---|---|---|---|---|---|---|---|
| Example 1-40 | (3) | Na, W | Total amount 3 | B1 | a | Excellent | 115 | Excellent | Excellent |
| Comparative Example 1-8 | (3) | None | — | B1 | a | Poor | 100 | Relatively poor | Relatively poor |
| Example 1-41 | (3) | Na, W | Total amount 3 | A2 | d | Excellent | 110 | Excellent | Excellent |
| Comparative Example 1-9 | (3) | None | — | A2 | d | Poor | 100 | Relatively poor | Relatively poor |
| Example 1-42 | (3) | Na, W | Total amount 3 | B2 | h | Excellent | 110 | Excellent | Excellent |
| Comparative Example 1-10 | (3) | None | — | B2 | h | Poor | 100 | Relatively poor | Relatively poor |
| Example 1-43 | (3) | Na, W | Total amount 3 | A1 | c | Excellent | 115 | Excellent | Excellent |
| Comparative Example 1-11 | (3) | None | — | A1 | c | Poor | 100 | Relatively poor | Relatively poor |
| Example 1-44 | (3) | Na, W | Total amount 3 | A3 | e | Excellent | 110 | Excellent | Excellent |
| Comparative Example 1-12 | (3) | None | — | A3 | e | Poor | 100 | Relatively poor | Relatively poor |
| Example 1-45 | (3) | Na, W | Total amount 3 | A3 | g | Excellent | 105 | Excellent | Excellent |
| Comparative Example 1-13 | (3) | None | — | A3 | g | Poor | 100 | Relatively poor | Relatively poor |
| Example 1-46 | (3) | Na, W | Total amount 3 | B2 | f | Excellent | 110 | Excellent | Excellent |
| Comparative Example 1-14 | (3) | None | — | B2 | f | Poor | 100 | Relatively poor | Relatively poor |
| Example 1-47 | (3) | Na, W | Total amount 3 | B2 | i | Excellent | 110 | Excellent | Excellent |

TABLE 1-5-continued

| | Basic component | Trace element: Kind of element | Trace element: Addition amount (ppm) | Condition to treat substrate | Photo-sensitive layer | Evaluation of exposure result | Evaluation of ability to withstand repeated printings | Close contact of photosensitive layer | Uniformity of pit |
|---|---|---|---|---|---|---|---|---|---|
| Comparative Example 1-15 | (3) | None | — | B2 | i | Poor | 100 | Relatively poor | Relatively poor |
| Example 1-48 | (3) | Na, W | Total amount 3 | A3 | j | Excellent | 108 | Excellent | Excellent |
| Comparative Example 1-16 | (3) | None | — | A3 | j | Poor | 100 | Relatively poor | Relatively poor |

Example 2

Examples 2-1 to 2-8 and Comparative Examples 2-1 to 2-2

Molten baths of aluminum alloys containing the following elements in addition to aluminum were prepared.

| | |
|---|---|
| Si: | 0.06% by weight |
| Fe: | 0.30% by weight |
| Cu: | 0.017% by weight |
| Mn: | 0.001% by weight |
| Mg: | 0.001% by weight |
| Zn: | 0.001% by weight |
| Ti: | 0.03% by weight |

After purification by the above-described Al molten bath filtration, ingots having a thickness of 500 mm and a width of 1200 mm were made by a DC casting method. The surfaces of the resulted ingots were cut by a facing machine at an average size of 10 mm. Then, they were soaked at 550° C. for about 5 hours, and when the temperature decreased to 400° C., the ingots were made into rolled plates having a thickness of 2.7 mm by using a hot roller. Further, heating treatment was conducted at 500° C. using a continuous annealing machine, then, the annealed plates were made into aluminum alloy plates having a thickness of 0.24 mm by a cold rolling machine. As the rolling roll of the cold rolling machine, rolls having various surface roughnesses were used, aluminum alloy plates having various average roughnesses on the reverse surface (opposite surface to the surface on which photosensitive layer is formed) were produced by conducting cold rolling.

Then, the front surfaces (surface which had not been roughened in the above-described cold rolling treatment) of various aluminum alloy plates were subjected to alkali etching treatment (aluminum solution amount: 5.5 $g/m^2$), subsequently subjected to Death matt treatment by nitric acid spray. Alternating current electrolysis roughening treatment was conducted at an electricity quantity of 270 $C/dm^2$ to roughen the surface. Then, alkali etching treatment (aluminum solution amount: 0.2 $g/m^2$), and Death matt treatment by nitric acid spray were again conducted. Further, an anodized film was formed on the front surface and the reverse surface of the aluminum alloy using an anodizing treatment apparatus having constitution shown in FIG. 0.3 (film amount on front surface: 2.6 $g/m^2$, film amount on reverse surface: 0.1 $g/m^2$). Then, interface treatment was conducted using sodium silicate, then, a primer layer was formed on the front surface using a polymer containing an onium group and an acid group (according to a method described in EP0904954A2).

Thus, substrates for planographic printing plate precursors were produced, the reverse surface of the substrate having various surface roughnesses.

Then, a photosensitive layer coating solution having the following composition was coated and dried on a primer layer of the produced substrates for planographic printing plate precursors, to obtain planographic printing plate precursors. The planographic printing plate precursor had a size of 650 mm×550 mm.

Composition of Coating Solution For Photosensitive Layer

| | |
|---|---|
| Capric acid | 0.03 g |
| Copolymer of monomer having phenolic hydroxyl group, and p-aminobenzenesulfoneamide (molar ratio, 50:50, weight-average molecular weight 500000) | 0.75 g |
| m, p-Cresol novolak resin (m, p ratio = 6/4) | 0.25 g |
| p-Toluenesulfonic acid | 0.003 g |
| Tetrahydrophthalic anhydride | 0.03 g |
| Cyanine dye | 0.017 g |
| Victoria Pure Blue (dye in which counter ion of BOH is 1-naphthalenesulfonic anion) | 0.017 g |
| Surfactant (surfactant, tradename "Megafack F-177", manufactured by Dainippon Ink & Chemicals Inc.) | 0.05 g |
| γ-Butyrolactone | 10.0 g |
| Methyl ethyl ketone | 10.0 g |
| 1-Methoxy-2-propanol | 1.0 g |

Each sample of the produced planographic printing plate precursors was conveyed by a conveyor belt, and occurrence of slipping and presence or absence of meander in conveying were evaluated. The evaluation results are shown in the following Table 2-1. The average surface roughness along the transverse direction and the average surface roughness along the longitudinal direction on the reverse surface of the substrate were measured by "Surfcom" (trade name) manufactured by Tokyo Seimitsu K.K. (the same in the following Example 2-9 and following). In Table 2-1, "○" in the column of slipping evaluation indicates no occurrence of slipping, "Δ" indicates that slight slipping occurred, however, it was in a permissible range, and "×" indicates frequent occurrence of slipping. "○" in the column of meander evaluation indicates no occurrence of meander, "Δ" indicates that slight meander occurred, however, it was in a permissible range, and "×" indicates frequent occurrence of meander. The same marks are applied in the following Table 2-2.

TABLE 2-1

| | Average surface roughness (Ra) μm | | | | |
|---|---|---|---|---|---|
| | Transverse direction (Ral) | Longitudinal direction (Ras) | Ral/Ras | Slipping evaluation | Meander evaluation |
| Example 2-1 | 0.19 | 0.17 | 1.12 | Δ | Δ |
| Example 2-2 | 0.40 | 0.35 | 1.14 | ○ | ○ |
| Example 2-3 | 0.40 | 0.21 | 1.90 | ○ | ○ |
| Example 2-4 | 0.30 | 0.18 | 1.67 | ○ | ○ |
| Example 2-5 | 0.16 | 0.14 | 1.14 | ○ | ○ |
| Example 2-6 | 0.24 | 0.10 | 2.40 | ○ | ○ |
| Example 2-7 | 0.30 | 0.10 | 3.00 | ○ | ○ |
| Example 2-8 | 0.17 | 0.11 | 1.55 | ○ | ○ |
| Comparative Example 2-1 | 0.25 | 0.24 | 1.04 | X | X |
| Comparative Example 2-2 | 0.28 | 0.28 | 1.00 | X | X |

Examples 2-9 to 2-11 and Comparative Examples 2-3

Molten baths of aluminum alloys containing the following elements in addition to aluminum were prepared.

| | |
|---|---|
| Si: | 0.10% by weight |
| Fe: | 0.30% by weight |
| Cu: | 0.02% by weight |
| Mn: | 0.001% by weight |
| Mg: | 0.015% by weight |
| Zn: | 0.001% by weight |
| Ti: | 0.03% by weight |

After purification by the above-described Al molten bath filtration, ingots having a thickness of 500 mm and a width of 1200 mm were made by a DC casting method. The surfaces of the resulted ingots were cut by a facing machine at an average size of 10 mm. Then, they were soaked at 550° C. for about 5 hours, and when the temperature decreased to 400° C., the ingots were made into rolled plates having a thickness of 2.7 mm by using a hot roller. Further, heating treatment was conducted at 500° C. using a continuous annealing machine, then, the annealed plates were made into aluminum alloy plates having a thickness of 0.24 mm by a cold rolling machine. In cold rolling, a rolling roll having given pattern was used, and the average surface roughness along the transverse direction (Ral) was 0.17 and the average surface roughness along the longitudinal direction (Ras) was 0.16 (Ral/Ras=1.06).

Aluminum alloy plate produced in the same manner as in Example 2-1 was subjected to alkali etching treatment and Death matt treatment. Then, electrochemical roughening treatment was conducted at an electricity quantity of 300 C/dm$^2$ on the front surface of the aluminum alloy plate. This treatment was so conducted that a part of electric force line reached to the reverse surface, and electrochemical roughening treatment was effected to light extent in the form of a belt of given width from both ends of the reverse surface along the longitudinal direction. Further, roughened width on the reverse surface was changed variously by changing thickness condition of spaces in which an electrolyte was present on the reverse surface. As a result of the electrochemical roughening treatment, the surface had an average surface roughness of 0.40 μm, and the given region at the end on the reverse surface had an average surface roughness Ra of 0.30 μm.

Figure 4:
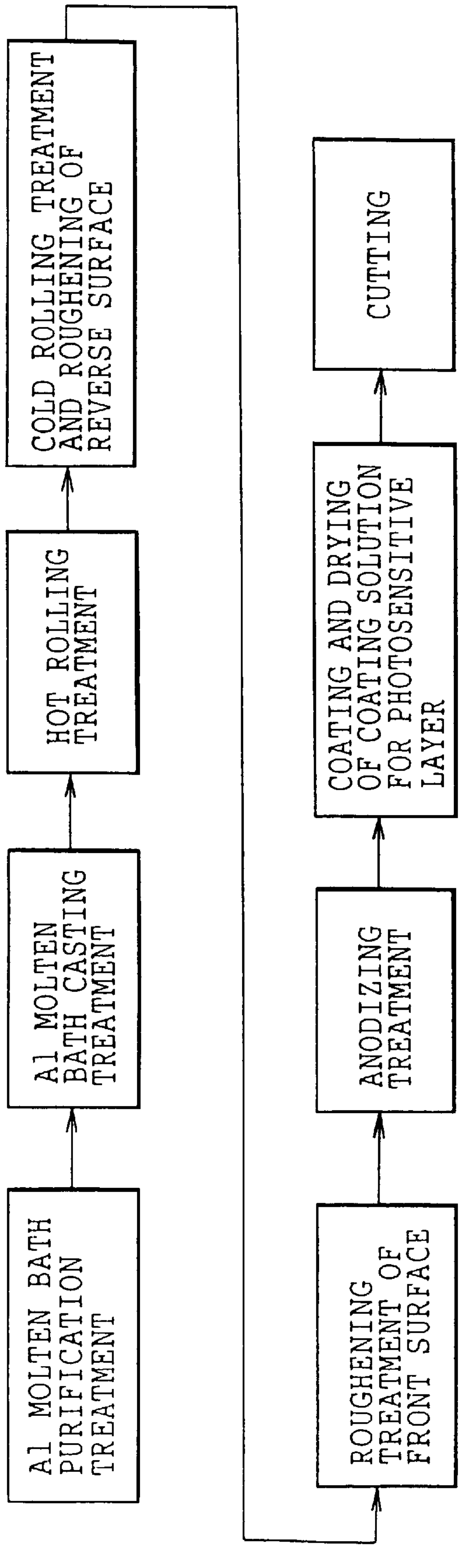
FIG. 4 is a flow chart showing one example of a process for producing the planographic printing plate precursor of the present invention.

Again, alkali etching treatment (aluminum solution amount: 0.2 g/m$^2$), and Death matt treatment by nitric acid spray were conducted. Further, an anodized film was formed on the front surface and the reverse surface of the aluminum alloy using an anodizing treatment apparatus having constitution shown in FIG. 4 (film amount on front surface: 2.6 g/m$^2$, film amount on reverse surface: 0.1 g/m$^2$) Then, interface treatment was conducted using sodium silicate, then, a primer layer was formed on the front surface using a polymer containing an onium group and an acid group (according to a method described in EP0904954A2).

Thus, substrates for planographic printing plate precursors were produced, the reverse surface of the substrate having lightly roughened region of various widths.

A photosensitive layer was formed in the same manner as in Example 2-1, and evaluations of slipping and meander were conducted in the same manner as in Example 2-1. The evaluation results are shown in the following Table 2-2.

TABLE 2-2

| | Reverse surface roughening | | | |
|---|---|---|---|---|
| | Width (mm) | Average surface roughness (Ra) μm | Evaluation of slipping | Evaluation of meander |
| Example 2-9 | 10 | 0.30 | ○ | ○ |
| Example 2-10 | 25 | 0.31 | ○ | ○ |
| Example 2-11 | 50 | 0.30 | ○ | ○ |
| Comparative Example 2-3 | 0.5 | 0.30 | X | X |

Then, planographic printing plate precursors were made in the same manner as in Example 2-1 and Example 2-9, not cut, and wound again in the form of a coil and stored for two weeks. Separately, planographic printing plate precursors (Example 2-1' and Example 2-9') which had been made in the same manner as in Example 2-1 and Example 2-9 except that an amount of the oxide film on the reverse surface was 0.05 g/$m^2$ were also, not cut, and wound again in the form of a coil and stored for two weeks.

Figure 5:
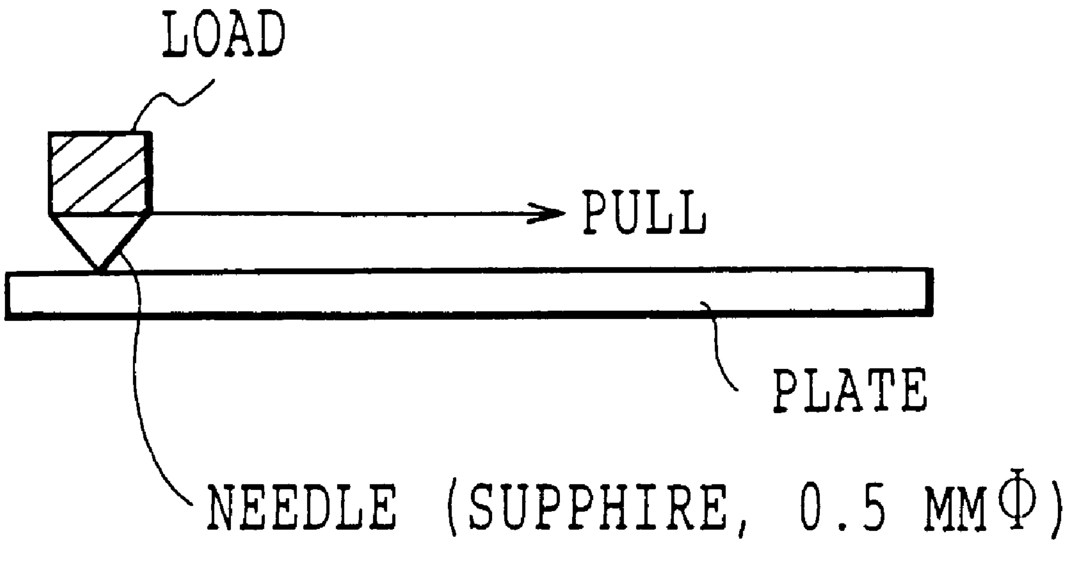
FIG. 5 is a schematic view showing the basic structure of a scratch tester.

The photosensitive layers of the above-described four kinds of planographic printing plate precursors were tested by a scratch tester having the same constitution as shown in FIG. 5, as a result, visually recognizable scratch generated at a load of 30 g.

After storing for two weeks, they were unwound again, cut along the longitudinal direction at a size of 800 mm, and 1000 sheets of the planographic printing plate precursor were made. The surface of the photosensitive layer was observed on each sheet, as a result, scratch ratio averaged on 1000 sheets was 0.1/sheet in sheets (Example 1 and Example 9) which the oxide film amount on the reverse surface was 0.1 g/$m^2$, and was 4.8/sheet in sheets (Example 2-1' and Example 2-9') which the oxide film amount on the reverse surface was 0.05 g/$m^2$.

Consequently, it was demonstrated that it is effective to form an anodized film of 0.1 g/$m^2$ or more on the reverse surface of a substrate to prevent scratch on a photosensitive layer by the reverse surface of the substrate in storage.

Example 3

Examples 3-1 to 3-4 and Comparative Examples 3-1,3-2

Preparation Method of the Substrate

Molten baths were prepared using an alloy mainly composed of Al containing Si: 0.07% by weight, Fe: 0.30% by weight, Cu: 0.17% by weight, Mn: 0.001% by weight, Mg: 0.001% by weight, Zn: 0.001% by weight, Ti: 0.03% by weight, and remaining amount of Al and inescapable impurities, and molten bath-treated and filtrated, then, ingots having a thickness of 500 mm and a width of 1200 mm were made by a DC casting method, then, the surfaces of the resulted ingots were cut by a facing machine at an average size of 10 mm, then, they were soaked at 550° C. for about 5 hours, and when the temperature decreased to 400° C., the ingots were made into rolled plates having a thickness of 2.7 mm by using a hot roller, further, heating treatment was conducted at 500° C. using a continuous annealing machine, then, the annealed plates were made into aluminum alloy plates having a thickness of 0.24 mm by cold rolling. The width of this aluminum plate was controlled to 1030 mm, then, the following surface treatment was conducted continuously.

(a) Mechanical Roughening Treatment

Figure 6:
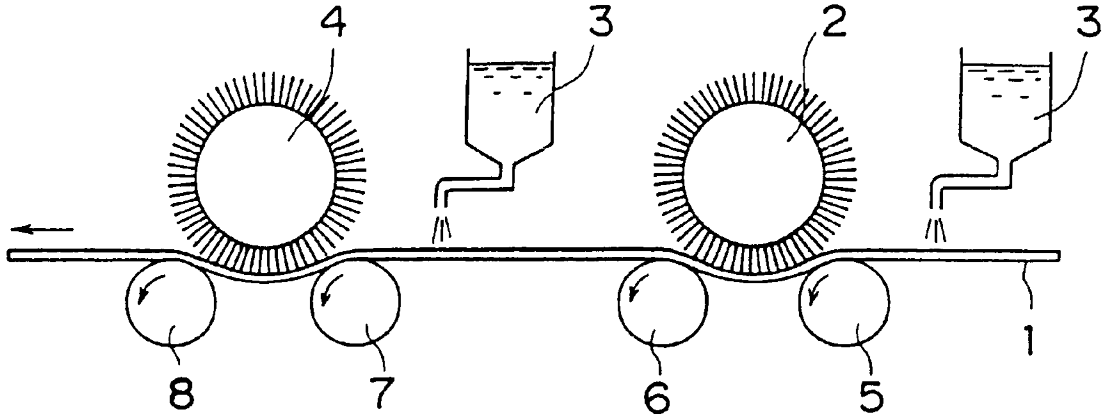
FIG. 6 is a schematic structural view showing one example of a mechanical roughening apparatus used for fabricating a substrate for the planographic printing plate precursor of the present invention.

Mechanical roughening was conducted by a rotating nylon brush in the form of a roller, using an apparatus as shown in FIG. 6, while feeding a suspension of a polishing agent (pumice or silica sand) having a specific gravity of 1.12 and water as a polishing slurry solution to the surface of the aluminum plate. The polishing agent had an average particle size from 40 to 45 $\mu$m and a maximum particle size of 200 $\mu$m. 6·10 nylon was used as a material of the nylon brush, and a hair having a length of 50 mm had a diameter of 0.3 mm. In the nylon brush, hairs were implanted in dense condition in pores made on a $\phi$300 mm stainless tube. Three rotation brushes were used. The distance between two supporting rollers ($\phi$200 mm) situated at lower part of the brush was 300 mm. The brush roller was pressed until the load of a driving motor to rotate the brush became 7 KW higher than the load before the brush roller was pressed onto the aluminum plate. The rotation direction of the brush was the same as moving direction of the aluminum, and the rotation was 3.3 revolutions per second.

(b) Etching Treatment With an Alkali Agent

An aluminum plate was etched by a spray at a temperature of 70° C., and a sodium hydroxide concentration of 2.6% by weight and an aluminum ion concentration of 6.5% by weight, to solve the aluminum plate in an amount of 13 g/$m^2$. Then, water-washing by spray was conducted.

(c) Death Matt Treatment

Death matt treatment was conducted by spray with a 1% by weight aqueous nitric acid solution (containing 0.5% by weight of an aluminum ion) at a temperature of 30° C., and then, water-washing with spray was conducted. As the above-described aqueous nitric acid solution used in the desmatt treatment, a waste solution from a process in which electrochemical roughening is conducted using alternating current in an aqueous nitric acid solution was used.

(d) Electrochemical Roughening Treatment

Figure 2A:
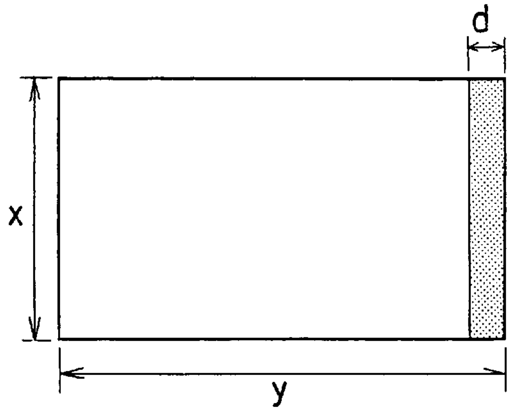
FIGS. 2A and 2B are schematic views showing the reverse surface of a planographic printing plate precursor of the present invention.
Figure 2B:
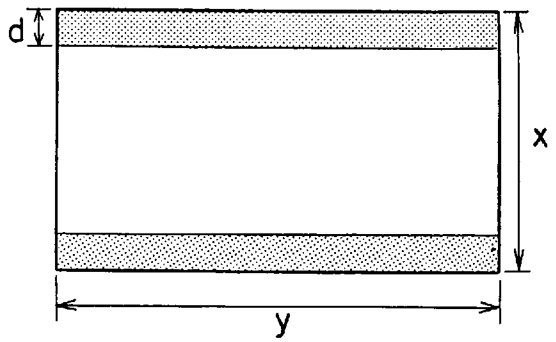
Figure 3:
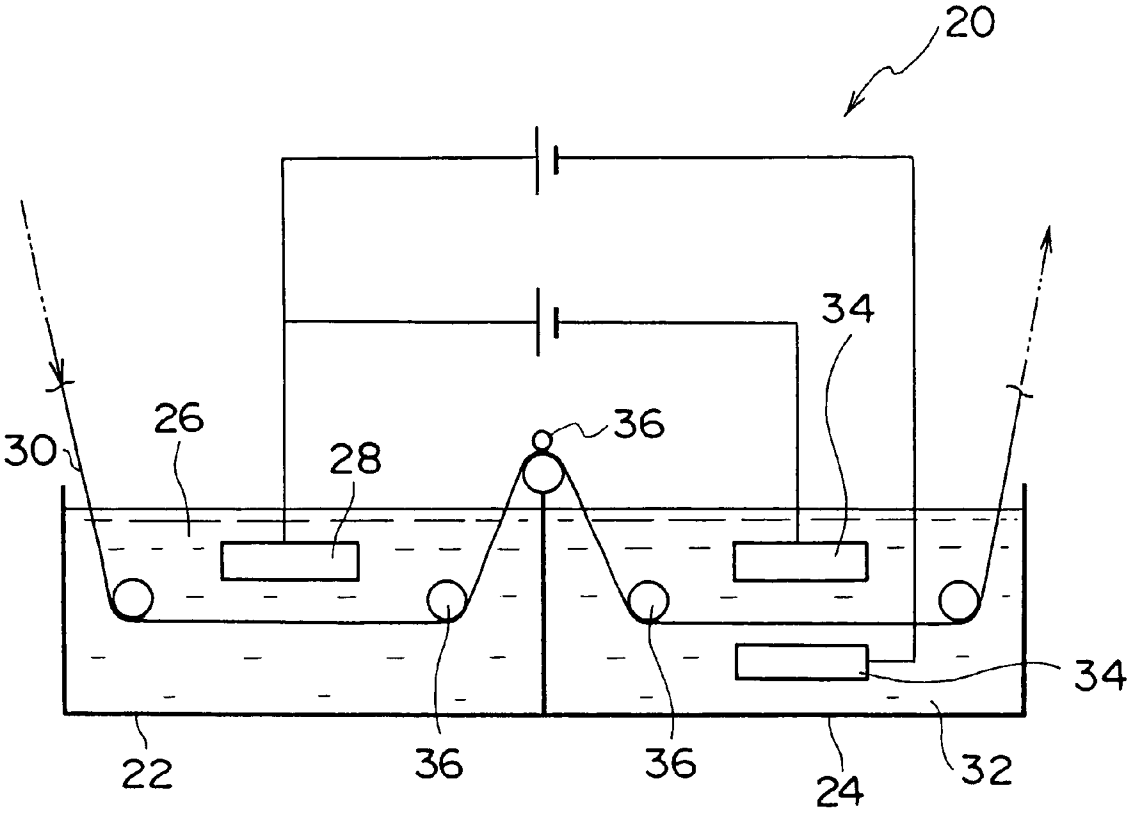
FIG. 3 is a schematic view showing one example of an anodizing apparatus used in a process for producing the planographic printing plate precursor of the present invention.

Electrochemical roughening treatment was conducted continuously using an alternating current of 60 Hz. The electrolyte in this treatment was a 1% by weight aqueous nitric acid solution (containing 0.5% by weight of an aluminum ion and 0.007% by weight of an ammonium ion) having a temperature of 50° C. The alternating current electric source waveform was as shown in FIG. 2, time TP during which current value increased from zero to peak was 2 msec, duty ratio was 1:1, trapezoid short wave alternating current was used, and a carbon electrode was used as a counter electrode: under these conditions, electrochemical roughening treat was conducted. As an auxiliary anode, ferrite was used. Two electrolysis vessels as shown in FIG. 3 were used.

The current density was 30 A/$dm^2$ at current peak, and the sum of electricity quantity was 250 C/$dm^2$ when an aluminum plate was used as an anode. In the auxiliary anode, 5% of current from the electric source was partially passed.

Then water-washing with spray was conducted.

(e) Etching Treatment

An aluminum plate was etched by a spray at a temperature of 70° C., and a sodium hydroxide concentration of 2.6% by weight and an aluminum ion concentration of 6.5% by weight, to solve the aluminum plate in an amount of 13 g/$m^2$, and a smut component mainly composed of aluminum hydroxide produced in conducting electrochemical roughening using alternating current in the above-described stage was removed, and edge portions of produced pits were dissolved to make the edge portions smooth. Then water-washing was conducted by spray.

(f) Death Matt Treatment

Death matt treatment was conducted by spray with a 25% by weight aqueous sulfuric acid solution (containing 0.5% by weight of an aluminum ion) at a temperature of 60° C., and then, water-washing with spray was conducted.

(g) Anodizing Treatment

Figure 7:
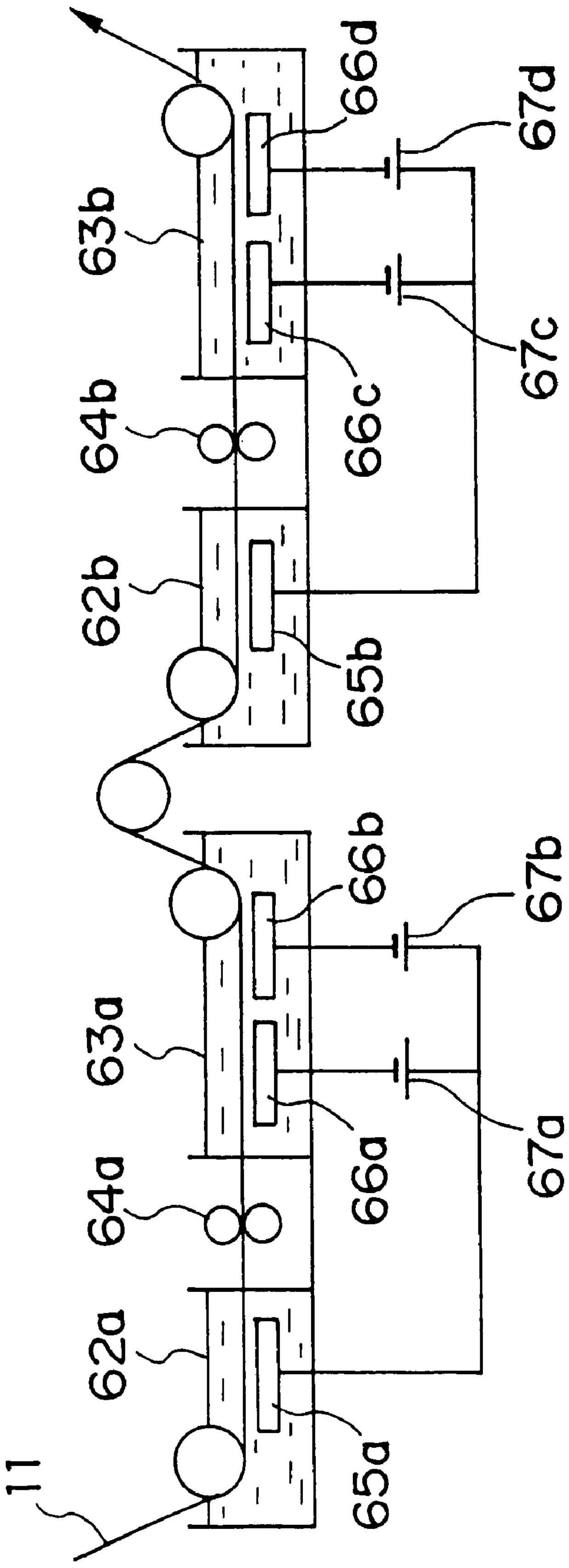
FIG. 7 is a schematic view showing an electrolytic apparatus in a two-stage power feeding electrolysis method which is applicable to fabrication of the substrate for a planographic printing plate precursor of the present invention.

Anodizing treatment was conducted by using a two-step feeding electrolysis mode anodizing apparatus having a structure shown in FIG. 7 (lengths of first and second electrolysis parts: each 6 m, length of first feeding part: 3 m, length of second feeding part: 3 m, lengths of first and second feeding electrodes: each 2.4 m) at a sulfuric acid concentration at electrolysis portion of 100 g/liter (containing 0.5% by weight of an aluminum ion), a temperature of 50° C., a specific gravity of 1.1, and an electric conductivity of 0.39 S/cm. Then, water-washing with spray was conducted.

In this procedure, in the anodizing apparatus, current from electric sources 67*a* and 67*b* flows to a first feeding electrode 65*a* mounted on a first feeding part 62*a*, flows to plate aluminum via the electrolyte, forms an oxide film on the surface of the plate aluminum at a first electrolysis part 63*a*, and passes through electrolysis electrodes 66*a* and 66*b* mounted on the first feeding part 63, returns to the electric source.

On the other hand, current from electric sources 67*c* and 67*d* flows to a second feeding electrode 65*b* mounted on a second feeding part 62*b*, and in the same manner, flows to plate aluminum via the electrolyte, forms an oxide film on the surface of the plate aluminum at a second electrolysis part 63*b*, and electricity quantity fed from the electric sources 67*a* and 67*b* to the first feeding part 2*a* is identical to electricity quantity fed from the electric sources 67*c* and 67*d* to the second feeding part 2*b*, and feeding current density on the oxide film at the second feeding part 62*b* was about 23 (D/dm$^2$). At the second feeding part 62*b*, current was fed via the surface of the oxide film of 1.2 g/m$^2$. The final oxide film amount was 2.4 g/m$^2$.

The substrate received the treatment until this stage is called [A].

In the substrate [A], a substrate made without the brush polishing process (a) is called a substrate [B].

In the substrate [A], a substrate in which hair diameter of the brush was 0.48 mm is called a substrate [C].

In the substrate [B], a substrate obtained at an electricity quantity at cathode in conducting electrochemical roughening treatment of 100 C/dm$^2$ is called a substrate [D].

Post treatment to control surface area was conducted under conditions described in the following Table 3-1, on the above-described resulted substrate, to make substrates in which the surface are is controlled to 2 to 30 times the unit area, and photosensitive layers as shown in Table 3-1 were made on the resulted substrates, to produce planographic printing plate precursors in Examples 3-1 to 3-4.

The surface area of the substrate was calculated from adsorbed amount of a mixed gas of helium and 0.1% krypton by KantaSorb (trade name) manufactured by Yuasa Ionics Inc., with the presupposition of physical adsorption.

Specifically, the substrate sample on which the above-described treatment had been performed was cut into 25 pieces each having a size of 60 mm×2 mm, which were placed in a U shape tube and heated at 180° C. for 60 minutes under dry nitrogen atmosphere, for deaeration. Then, the U shape tube containing the sample was set at measuring position, and immersed into liquid nitrogen and cooled while passing the above-described adsorption gas at constant flow. After the adsorption gas flow became constant, the U shaped tube was immersed into tap water at room temperature, and the amount of an adsorption gas generated when the sample temperature is returned to atmospheric temperature was detected as an electrical signal on flow change, and the surface area was calculated by a BET one point method using a calibration curve. For example, when one surface of an aluminum substrate was treated, in the case of the above-described sample area, the apparent area (unit area) of the measured sample was 60 mm×2 mm×25×3000 mm$^2$, and if the measured and calculated area as described above is represented by S (mm$^2$), the specific surface area is (S/3000). The specific surface area was calculated as described above from this really measures surface area and the apparent surface area, and described in the following Table 3-1.

Formation of Primer Layer

The following primer solution was coated, the coated film was dried at 80° C. for 15 seconds to obtain a substrate. The coated amount of the coated film after drying was 15 mg/m$^2$.

Primer Solution

| | |
|---|---|
| Polymer compound described below | 0.3 g |
| Methanol | 100 g |
| Water | 1 g |

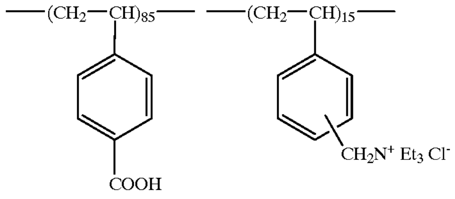

Molecular weight: 28000

Next, the following photosensitive layer coating solution 1 was prepared, and applied on primed substrates so that a coated amount was 1.8 g/m$^2$, to obtain planographic printing plate precursors of Examples 3-1 to 3-4. Further, on the above-described substrates [A] and [D], the same photosensitive layer was formed, without conducting post treatment to control surface treatment, to obtain planographic printing plate precursors of comparative Examples 3-1 and 3-2.

Photosensitive Layer Coating Solution 1

| | |
|---|---|
| Capric acid | 0.03 g |
| Specific copolymer 1 described below | 0.75 g |
| m, p-Cresol novolak resin (m, p ratio = 6/4, weigh-average molecular weight 3500, containing 0.5% by weight of unreacted cresol) | 0.25 g |
| p-Toluenesulfonic acid | 0.003 g |
| Tetrahydrophthalic anhydride | 0.03 g |
| Cyanine dye A (having a structure described below) | 0.017 g |
| Dye in which counter ion of Victoria Pure Blue BOH is 1-naphthalenesulfonic anion | 0.015 g |
| Fluorine surfactant (surfactant, tradename Megafack F-177, manufactured by Dainippon Ink & Chemicals Inc.) | 0.05 g |
| γ-Butyrolactone | 10 g |
| Methyl ethyl ketone | 10 g |
| 1-Methoxy-2-propanol | 1 g |

-continued

Cyanine dye A

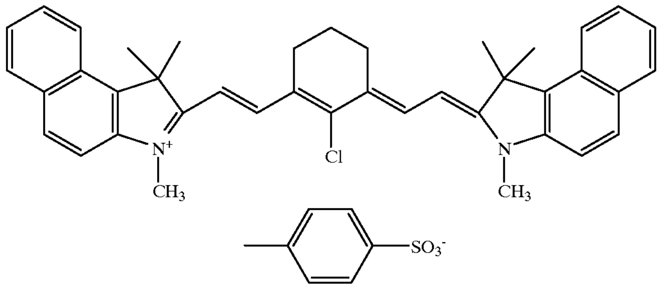

Synthesis of Specific Copolymer 1

Into a 500 ml three-necked flask equipped with a stirrer, condenser and dropping funnel was charged 31.0 g (0.36 mol) of methacrylic acid, 39.1 g (0.36 mol) of ethyl chloroformate and 200 ml of acetonitrile, and the mixture was stirred while cooling by an ice water bath. To this mixture was added 36.4 g (0.36 mol) of triethylamine dropwise over 1 hour from a dropping funnel. After completion of the addition, the ice water bath was removed, and the mixture was stirred for 30 minutes at room temperature.

To this reaction mixture was added 51.7 g (0.30 mol) of p-aminobenzenesulfoneamide, and the mixture was stirred for 1 hour while warming at 70° C. by an oil bath. After completion of the reaction, this mixture was poured into 1 liter of water while stirring this water, and the resulted mixture was stirred for 30 minutes. This mixture was filtrated to remove a deposit which was made into a slurry with 500 ml of water, then, this slurry was filtrated, and the resulted solid was dried to obtain white solid of N-(p-aminosulfonylphenyl)methacrylamide (yield, 46.9 g).

Then, into a 20 ml three-necked flask equipped with a stirrer, condenser and dropping funnel was charged 4.61 g (0.0192 mol) of N-(p-aminosulfonylphenyl) methacrylamide, 2.94 g (0.0258 mol) of ethyl methacrylate, 0.80 g (0.015 mol) of acrylonitrile and 20 g of N,N-dimethylacetamide, and the mixture was stirred while heating by a hot water bath. To this mixture was added 0.15 g of V-65 (manufactured by Wako Pure Chemical Industries Ltd.) and the mixture was stirred for 2 hours under nitrogen flow while maintaining at 65° C. To this reaction mixture was further added a mixture of 4.61 g of N-(p-aminosulfonylphenyl)methacrylamide, 2.94 g of ethyl methacrylate, 0.80 g of acrylonitrile and 0.15 g of "V-65 over" over 2 hours from a dropping funnel. After completion of the addition, the resulted mixture was further stirred at 65° C. for 2 hours. After completion of the reaction, 40 g of methanol was added to the mixture and cooled, the resulted mixture was poured into 2 liter of water while stirring this water, and the mixture was stirred for 30 minutes, then, the deposit was removed by filtration, and dried to obtain 15 g of white solid. The weigh-average molecular weight (polystyrene standard) of a specific copolymer 1 was measured by gel permeation chromatography, to find it was 3000.

TABLE 3-1

| | Substrate | Ra ($\mu$m) | Specific surface area | Sensitivity |
|---|---|---|---|---|
| Example 3-1 | Substrate obtained by performing compresses vapor micropore sealing treatment described in JP-A No. 4-176690, Example 1 on a substrate B | 0.30 | 15 | 120 mJ/cm$^2$ |
| Example 3-2 | Substrate obtained by immersing a substrate B in boiling water under atmospheric pressure of ion exchanged water for 30 seconds | 0.30 | 10 | 110 mJ/cm$^2$ |
| Example 3-3 | Substrate obtained by performing compresses vapor micropore sealing treatment described in JP-A No. 4-176690, Example 1 on a substrate A | 0.48 | 10 | 100 mJ/cm$^2$ |
| Example 3-4 | Substrate obtained by performing compresses vapor micropore sealing treatment described in JP-A No. 4-176690, Example 1 on a substrate C | 0.23 | 10 | 100 mJ/cm$^2$ |
| Comparative Example 3-1 | Substrate B | 0.30 | 50 | 150 mJ/cm$^2$ |
| Comparative Example 3-2 | Substrate D | 0.55 | 50 | 140 mJ/cm$^2$ |

Evaluation of Sensitivity

A planographic printing plate precursor obtained as described above was exposed by using a semiconductor laser having an output of 500 mW, a wavelength of 830 nm and a beam diameter of 17 μm ($1/e^2$) at a main operation speed of 5 m/s, then, developed for 30 seconds by a diluted (1:8) aqueous solution of PS plate developer (trade name: DP-4) manufactured by Fuji Photo Film Co., Ltd.

After image formation as described above, positive deletion liquid PR-1S (trade name) manufactured by Fuji Photo Film Co., Ltd. was placed on solid image parts, left for 1 minute at 25° C. before water-washing for deletion, difference of binder remaining amount between the deleted parts and non-image parts by developing processing was measured as difference of absorption by scattering reflection at 280 nm, and this was defined as a remaining film. The minimum plate surface energy immediately before steep increase in the amount of the remaining film was defined as sensitivity. The results are described together in the above-described Table 3-1.

As apparent from the results in Table 3-1, in any of planographic printing plate precursors of the present invention in which the surface area of an aluminum substrate has been controlled, sensitivity is excellent, a remaining film is not generated, and an excellent image is formed.

Examples 3-5, 3-6, Comparative Example 3-3

Post treatment to control surface area was conducted under conditions described in the following Table 3-2, on the substrate [A] and the substrate [B] obtained in Example 3-1, to obtain substrates in which the surface area had been controlled to 2 to 30 times the unit area, and photosensitive layers described below were formed to produce planographic printing plate precursors of Examples 3-5 and 3-6. A recording layer described below was directly formed on the substrate [A] to give a planographic printing plate precursor of Comparative Example 3-3.

Formation of Primer Layer

The following primer solution was coated on an aluminum plate, and dried at 80° C. for 30 seconds. The coated amount after drying was 10 $mg/m^2$.

Primer Solution

| | |
|---|---|
| β-alanine | 0.1 g |
| phenylphosphonic acid | 0.05 g |
| Methanol | 40 g |
| Pure water | 60 g |

Next, the following photosensitive layer coating solution 2 was prepared, and this solution was applied on the above-described primed aluminum plate, dried at 100° C. for 1 minute, to obtain a negative planographic printing plate precursor [G-1]. The coated amount after drying was 1.5 $mg/m^2$.

Photosensitive Layer Coating Solution 2

| | |
|---|---|
| Fluorine-containing copolymerized polymer (P-8) | 0.05 g |
| Acid generator [SH-1] | 0.3 g |
| Crosslinking agent | 0.5 g |
| Binder polymer [BP-1] | 1.5 g |
| Infrared absorbing agent [IK-1] | 0.07 g |
| AIZEN SPILON BLUE C-RH (trade name, manufactured by Hodogaya Chemical Co., Ltd.) | 0.035 g |
| Fluorine surfactant (tradename "Megafack F-177", manufactured by Dainippon Ink & Chemicals Inc.) | 0.01 g |
| Methyl ethyl ketone | 12 g |
| Methyl alcohol | 10 g |
| 1-Methoxy-2-propanol | 8 g |

The binder polymer [BP-1] used in the photosensitive layer coating solution 2 is an exemplified compound [BP-1] of the above-described polymer compound, and structures of the fluorine-containing copolymerized polymer (P-8), acid generator [SH-1] and infrared absorbing agent [IK-1] used are shown below.

P-8

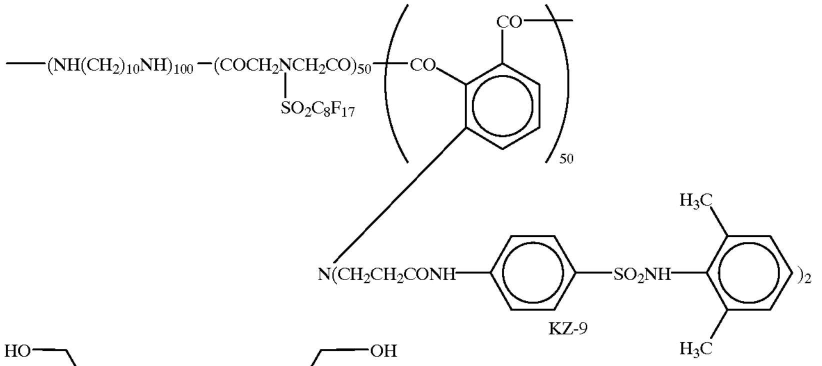

KZ-9

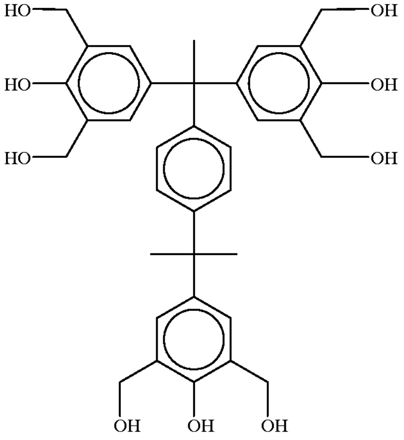

[SH-1]

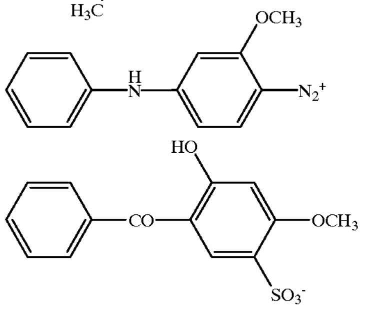

-continued

[IK-1]

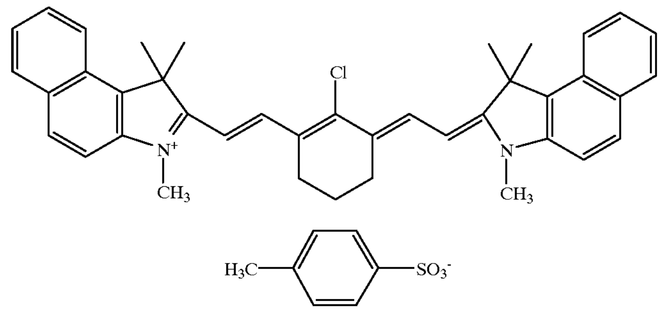

TABLE 3-2

| | Substrate | Ra (μm) | Specific surface area | Sensitivity |
|---|---|---|---|---|
| Example 3-5 | Substrate obtained by performing compresses vapor micropore sealing treatment described in JP-A No. 4-176690, Example 1 on a substrate A | 0.48 | 15 | 90 mJ/cm$^2$ |
| Example 3-6 | Substrate obtained by immersing a substrate B in boiling water under atmospheric pressure of ion exchanged water for 30 seconds | 0.30 | 10 | 80 mJ/cm$^2$ |
| Comparative Example 3-2 | Substrate A | 0.48 | 50 | 120 mJ/cm$^2$ |

Evaluation of Sensitivity

The resulted negative planographic printing plate precursor [G-1] was scanned and exposed by a semiconductor laser emitting infrared ray having a wavelength of about 820 to 850 nm. After exposure, the plate was heated at 110° C. for 30 seconds, then, developed by a developing solution DP-4 (trade name, 1:8 diluted solution) manufactured by Fiji Photo Film Co., Ltd. In this procedure, the minimum plate surface energy amount by which uniform formation of solid image parts over the entire surface can be visually recognized was defined as sensitivity. The results are shown in Table 3-2.

As apparent from the results in Table 3-2, in any of planographic printing plate precursors of the present invention in which the surface area of an aluminum substrate has been controlled, sensitivity is excellent, a remaining film is not generated, and an excellent image is formed.

Example 4

An Al molten bath composed of the following components was prepared, treated and filtrated, then, an ingot having a thickness of 500 mm and a width of 1200 mm was made by a DC casting method, then, the surface of the resulted ingot was cut by a facing machine at an average size of 10 mm, then, it was soaked at 550° C. for about 5 hours, and when the temperature decreased to 400° C., the ingot was made into a rolled plate having a thickness of 2.7 mm by using a hot roller, further, heating treatment was conducted at 500° C. using a continuous annealing machine, then, the annealed plate was made into an aluminum alloy plate having a thickness of 0.24 mm by cold rolling. This aluminum plate was used in the following examples of the present invention and comparative examples. The basic components of the used Al were as shown in Table 4-1. Percentages in the following examples are all by weight unless otherwise stated.

TABLE 4-1

| Component | Si | Fe | Cu | Mn | Mg | Zn | Ti |
|---|---|---|---|---|---|---|---|
| | 0.06 | 0.30 | 0.017 | 0.001 | 0.015 | 0.001 | 0.03 |

The aluminum plate having a thickness of 0.24 mm and a width of 1030 mm prepared as described above was treated continuously.

(a) Mechanical roughening was conducted by a rotating nylon brush in the form of a roller, using a known mechanical roughening apparatus, while feeding a suspension of a polishing agent (pumice) having a specific gravity of 1.12 and water as a polishing slurry solution to the surface of the aluminum plate. The polishing agent had an average particle size from 40 to 45 μm and a maximum particle size of 200 μm. 6·10 nylon was used as a material of the nylon brush, and the hair had a length of 50 mm and a diameter of 0.3 mm. In the nylon brush, hairs were implanted in dense condition in pores made on a ϕ300 mm stainless tube. Three rotation brushes were used. The distance between two supporting rollers (ϕ200 mm) situated at lower part of the brush was 300 mm. The brush roller was pressed until the load of a driving motor to rotate the brush became 7 KW higher than the load before the brush roller was pressed onto the aluminum plate. The rotation direction of the brush was the same as moving direction of the aluminum, and the rotation was 3.3 revolutions per second.

(b) An aluminum plate was etched by a spray at a temperature of 70° C., and a sodium hydroxide concentration of 2.6% by weight and an aluminum ion concentration of 6.5% by weight, to solve the aluminum plate in an amount of 13 g/m$^2$. Then, water-washing by spray was conducted.

(c) Death matt treatment was conducted by spray with a 1% by weight aqueous nitric acid solution (containing 0.5% by weight of an aluminum ion) at a temperature of 30° C., and then, water-washing with spray was conducted. As the above-described aqueous nitric acid solution used in the desmatt treatment, a waste solution from a process in which electrochemical roughening is conducted using alternating current in an aqueous nitric acid solution was used.

(d) Electrochemical roughening treatment was conducted continuously using an alternating current of 60 Hz. The electrolyte in this treatment was a 1% by weight aqueous nitric acid solution (containing 0.5% by weight of an aluminum ion and 0.007% by weight of an ammonium ion) having a temperature of 40° C. The alternating current electric source revealed a time TP during which current value increased from zero to peak of 2 msec, duty ratio was 1:1, trapezoid short wave alternating current was used, and a carbon electrode was used as a counter electrode: under these conditions, electrochemical roughening treat was conducted. As an auxiliary anode, ferrite was used.

The current density was 30 A/$dm^2$ at current peak, and the sum of electricity quantity was 255 C/$dm^2$ when an aluminum plate was used as an anode. In the auxiliary anode, 5% of current from the electric source was partially passed.

Then water-washing with spray was conducted.

(e) An aluminum plate was etched by a spray at a temperature of 32° C., and a sodium hydroxide concentration of 2.6% by weight and an aluminum ion concentration of 6.5% by weight, to solve the aluminum plate in an amount of 0.2 g/$m^2$, and a smut component mainly composed of aluminum hydroxide produced in conducting electrochemical roughening using alternating current in the above-described stage was removed, and edge portions of produced pits were dissolved to make the edge portions smooth. Then water-washing was conducted by spray.

(f) Death matt treatment was conducted by spray with a 25% by weight aqueous sulfuric acid solution (containing 0.5% by weight of an aluminum ion) at a temperature of 60° C., and then, water-washing with spray was conducted.

(g) Anodizing treatment was conducted by using a previously-known two-step feeding electrolysis mode anodizing apparatus (lengths of first and second electrolysis parts: each 6 m, length of first feeding part: 3 m, length of second feeding part: 3 m, lengths of first and second feeding electrodes: each 2.4 m) at a sulfuric acid concentration at electrolysis portion of 170 g/liter (containing 0.5% by weight of an aluminum ion), and a temperature of 38° C. Then, water-washing with spray was conducted.

In this procedure, in the anodizing apparatus, current from electric sources flows to a first feeding electrode mounted on a first feeding part, flows to plate aluminum via the electrolyte, forms an oxide film on the surface of the plate aluminum at a first electrolysis part, and passes through electrolysis electrodes mounted on the first feeding part, returns to the electric source.

On the other hand, current from electric sources flows to a second feeding electrode mounted on a second feeding part, and in the same manner, flows to plate aluminum via the electrolyte, forms an oxide film on the surface of the plate aluminum at a second electrolysis part, and electricity quantity fed from the electric sources to the first feeding part is identical to electricity quantity fed from the electric sources to the second feeding part, and feeding current density on the oxide film at the second feeding part was about 25 (D/$dm^2$) At the second feeding part, current was fed via the surface of the oxide film of 1.35 g/$m^2$. The final oxide film amount was 2.7 g/$m^2$. The substrate received the treatment until this stage is called [A].

In the substrate [A], a substrate made without the brush polishing process (a) is called a substrate [B].

In the substrate [B], a substrate made according to the above-described procedure in which the treating temperature was 50° C. and the feeding current density was 5 (A/$dm^2$) in the anodizing treatment (g) is called a substrate [C].

In the substrate [B], a substrate made according to the above-described procedure in which the treating solution temperature was 10° C., the feeding current density was 40 (A/$dm^2$) and the sulfuric acid concentration was 80 g/liter in the anodizing treatment (g) is called a substrate [D].

In the substrate [B], a substrate made according to the above-described procedure in which the treating solution temperature was 60° C., the feeding current density was 1 (A/$dm^2$) and the sulfuric acid concentration was 350 g/liter in the anodizing treatment (g) is called a substrate [E].

In the substrate [B], a substrate which was immersed in a NaOH aqueous solution of pH 12 at 40° C. for 10 seconds is called a substrate [F].

In the substrate [B], a substrate made according to the above-described procedure in which the treating solution temperature was 50° C., the feeding current density was 10 (A/$dm^2$) and the sulfuric acid concentration was 300 g/liter in the anodizing treatment (g) is called a substrate [G].

In the substrate [B], a substrate made according to the above-described procedure in which the treating solution temperature was 5° C., the feeding current density was 50 (A/$dm^2$) and the sulfuric acid concentration was 50 g/liter in the anodizing treatment (g) is called a substrate [H].

Image Formation Layer

First, a liquid composition (sol solution) of SG method was prepared according to the following procedure. The following composition was weighed into a beaker, and stirred for 20 second at 25° C.

| | |
|---|---|
| Si $(OC_2H_5)_4$ | 38 g |
| 3-methacryloxypropyltrimethoxysilane | 13 g |
| 85% phosphoric acid aqueous solution | 12 g |
| Ion exchanged water | 15 g |
| Methanol | 100 g |

The solution was transferred to a three-necked flask which was then equipped with a reflux condenser and immersed into an oil bath at room temperature. Then content of the three-necked flask was heated up to 50° C. over 30 minutes while stirring with a magnetic stirrer. It was further reacted while maintaining the bath temperature at 50° C., to obtain a liquid composition (sol solution). This sol liquid was diluted with methanol/ethylene glycol=20/1 (ratio by weight) to 0.5% by weight, and coated by a wheeler on a substrate, and dried at 100° C. for 1 minute. The coated amount was 3.5 mg/$m^2$. Also regarding this coated amount, Si element amount was measured according to a fluorescent X ray analysis method, and used as a coated amount value.

A photosensitive composition having the following composition was coated on the aluminum plate thus treated, so that the coated amount after drying would be 1.3 g/$m^2$, and dried at 80° C. for 2 seconds to form a photosensitive layer.

Photosensitive composition

| | |
|---|---|
| Pentaerythritol tetraacrylate | 1.5 g |
| Benzyl methacrylate/methacrylic acid copolymer (copolymerization molar ratio 75/25) | 2.0 g |
| Sensitizing pigment of the following formula | 0.07 g |
| Titanocene compound of the following formula | 0.03 g |

-continued

| | |
|---|---|
| Fluorine nonionic surfactant Megafak F-177P (trade name, manufactured by Dainippon Ink & Chemicals, Inc.) | 0.03 g |
| Heat polymerization inhibitor (N-nitrosophenylhydroxylamine aluminum salt) | 0.01 g |
| Pigment composition of the following composition | 2.0 g |
| Methyl ethyl ketone | 20 g |
| Propylene glycol monomethyl ether | 20 g |
| Sensitizing pigment | |

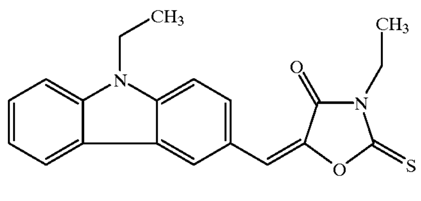

Titanocene compound

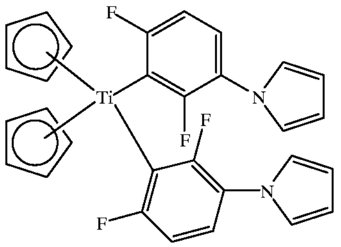

| | |
|---|---|
| Pigment dispersion composition | 30 g |
| Pigment P-18 of the following formula (average particle size 0.13 μm, size relation of transmittance: 400 nm > 500 nm) | |
| Allyl methacrylate/methacrylic acid copolymer (copolymerization ratio 80/20, weight-average molecular weight: 40000) | 20 g |
| Cyclohexanone | 35 g |
| Methoxypropyl acetate | 115 g |
| Pigment | |

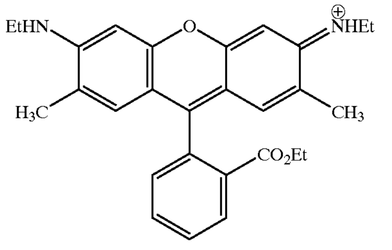

$O_3P_2O_5/_xWO_3/yMoO_3$

Preparation of Protective Layer

A 3% by weight aqueous solution of polyvinyl alcohol (saponification degree 98 mol %, polymerization degree 550) was coated on this photosensitive layer so that coated amount after drying would be 2 g/m$^2$, and dried at 100° C. for 2 seconds.

A photosensitive planographic printing plate precursor obtained as described above was exposed in halftone imagewise, by using a 400 nm monochromatic light as a light source, while controlling exposure power so that plate surface exposure energy density was 150 μJ, at 10% interval from 10 to 90% of 175 line/inch. Then, the plate was heated at 120° C. for 20 second to perform post heating treatment.

Development was conducted by immersing the plate into a development solution described below at 25° C. for 30 seconds.

Development Solution

| | |
|---|---|
| 1K potassium silicate | 30 g |
| Potassium hydroxide | 15 g |
| $C_{12}H_{25}$—$C_6H_4$—O—$C_6H_4$—$SO_3Na$ | 3 g |
| Water | 1000 g |

Then, gum liquid FP-2W (trade name) manufactured by Fuji Photo Film Co., Ltd. was diluted to 2-fold with water, and a plate surface was treated according to usage. For ability to withstand repeated printings measurement, Dia 1F-2 (trade name) manufactured by Mitsubishi Heavy Industries, Ltd. was used as a printer, and Graph G(N) (trade name) manufactured by Dainippon Ink & Chemicals, Inc. was used as an ink. A print was sampled at every 5000 pieces from the start of printing, and printing was continued until 150000 pieces.

Number of pieces when the concentration of ink at solid image parts began to decrease was defined as ability to withstand repeated printings.

Halftone % on print was calculated according to Mary Devis formula from the concentration of halftone parts, as an index of bold halftone.

The results awe shown in the following Table 4-2.

TABLE 4-2

| | Substrate | Pore diameter | Pore density | Ability to withstand repeated printings | Halftone dot area ratio (%) at 50% setting |
|---|---|---|---|---|---|
| Example 4-1 | A | 8 nm | 1.1 × $10^{16}$/m$^2$ | 100000 pieces | 70 |
| Example 4-2 | B | 8 nm | 1.1 × $10^{16}$/m$^2$ | 90000 pieces | 68 |
| Example 4-3 | C | 6 nm | 2.0 × $10^{16}$/m$^2$ | 90000 pieces | 68 |
| Example 4-4 | D | 10 nm | 9.0 × $10^{15}$/m$^2$ | 110000 pieces | 75 |
| Comparative Example 4-1 | E | 4 nm | 4.0 × $10^{16}$/m$^2$ | 70000 pieces | 85 |
| Comparative Example 4-2 | F | 13 nm | 1.0 × $10^{16}$/m$^2$ | 120000 pieces | 90 |
| Comparative Example 4-3 | G | 5 nm | 3.0 × $10^{16}$/m$^2$ | 850000 pieces | 85 |
| Comparative Example 4-4 | H | 12 nm | 7.0 × $10^{15}$/m$^2$ | 105000 | 84 |

Pore diameter and pore density were calculated on SEM photographs, observing the surface of a substrate at a magnification of 150000 by an accelerating voltage of 12 kV without vapor deposition, using a scanning type electron microscope S-900 (trade name) manufactured by Hitachi, Ltd. The pore diameter is defined as an average value of 50 pores selected randomly, and the pore density was calculated from the number of pores in 600 nm×600 nm.

As shown in the above-described Table 4-2, dot gain due to scattered lights can be suppressed without deteriorating ability to withstand repeated printings by controlling the pore diameter and pore density of an anodized film within constant ranges.

The photosensitive planographic printing plate precursor of the present invention shows high sensitivity to oscillating wavelength of a cheap short wave semiconductor laser and can be handled under bright safe light since the diameter and the density of micropores present in an anodized film on a substrate are controlled in given ranges and a photopolymerizable layer containing a pigment having an optical property that transmittance at 500 nm is smaller than transmittance at 400 nm is used as photosensitive layer. The photosensitive planographic printing plate precursor of the present invention is excellent in ability to withstand repeated printings since close contact between the photosensitive layer and the substrate does not lower. Further, the photosensitive planographic printing plate precursor of the present invention is excellent in reproducibility of halftone dots since formation of bold halftone dots by scattered lights ascribed to the substrate is not easily deteriorated.

What is claimed is:

1. A planographic printing plate precursor comprising:

an aluminum substrate which has been subjected to a roughening treatment and an anodizing treatment; and a photosensitive layer which is provided on a surface of said substrate, and which contains an infrared absorbing agent and a water-insoluble and alkali aqueous solution-soluble polymer compound, and whose solubility in an alkali developing solution varies by infrared laser exposure, wherein said substrate is obtained by electrochemically roughening an aluminum alloy plate which contains 0.05 to 0.5% by weight of Fe, 0.03 to 0.15% by weight of Si, 60 to 300 ppm of Cu, 100 to 400 ppm of Ti and 10 to 200 ppm of Mg, contains 1 to 100 ppm of at least one element selected from the group of elements consisting of K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po, and has an aluminum purity of 99.0% by weight or more.

2. The planographic printing plate precursor according to claim 1, wherein said substrate has at least one feature of following features (a) and (b):

(a) said substrate has an average roughness Ra at the center line of 0.5 μm or less, and has a surface area of 2 times to 30 times a unit surface area, (b) micropores present in an anodized film on said substrate have a pore diameter of 1 to 5 nm and a pore density of $8\times10^{15}$ to $2\times10/m^2$.

3. The planographic printing plate precursor according to claim 1, wherein a reverse surface of said substrate has different average surface roughnesses Ra along a longitudinal direction and a transverse direction, and given that the average surface roughness Ra along a direction of larger average surface roughness is represented by Ral and the average surface roughness Ra along a direction of smaller average surface roughness is represented by Ras, Ral and Ras satisfy the following relational formula:

$$1.1\leqq Ral/Ras\leqq 5.0.$$

4. The planographic printing plate precursor according to claim 3, wherein the reverse surface of said substrate is subjected to a light degree of surface treatment performed at least in a region located from the end of one side of the reverse surface of the substrate and having a width of 1 mm or more and 50 mm or less.

5. The planographic printing plate precursor according to claim 3, wherein said photosensitive layer is a photosensitive layer having a surface which has been obtained by scratching in a test using a scratch tester provided with sapphire needles having a diameter of 0.5 mmΦ using a load of 30 g, and wherein an anodized film of 0.1 $g/m^2$ or more has been obtained by forming on the reverse surface of the substrate.

6. The planographic printing plate precursor according to claim 4, wherein said photosensitive layer is a photosensitive layer having a surface which has been obtained by scratching in a test using a scratch tester provided with sapphire needles having a diameter of 0.5 mmΦ using a load of 30 g, and wherein an anodized film of 0.1 $g/m^2$ or more has been obtained by forming on the reverse surface of the substrate.

7. A planographic printing plate precursor comprising:

an aluminum substrate which has been subjected to a roughening treatment and an anodizing treatment; and a photosensitive layer which is provided on a surface of said substrate, and which contains an infrared absorbing agent and a water-insoluble and alkali aqueous solution-soluble polymer compound, and whose solubility in an alkali developing solution varies by infrared laser exposure, wherein said substrate is obtained by electrochemically roughening an aluminum alloy plate which contains 0.05 to 0.5% by weight of Fe, 0.03 to 0.15% by weight of Si, 60 to 300 ppm of Cu, 100 to 400 ppm of Ti and 10 to 200 ppm of Mg, contains 1 to 100 ppm of at least one element selected from the group of elements consisting of Li, Na, K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po, and has an aluminum purity of 99.0% by weight or more wherein a reverse surface of said substrate has different average surface roughnesses Ra along a longitudinal direction and a transverse direction, and given that the average surface roughness Ra along a direction of larger average surface roughness is represented by Ral and the average surface roughness Ra along a direction of smaller average surface roughness is represented by Ras, Ral and Ras satisfy the following relational formula:

$$1.1\leqq Ral/Ras\leqq 5.0.$$

8. The planographic printing plate precursor according to claim 7, wherein the reverse surface of said substrate has been obtained by subjecting to a light degree of surface treatment performed at least in a region located from the end of one side of the reverse surface of the substrate and having a width of 1 mm or more and 50 mm or less.

9. The planographic printing plate precursor according to claim 8, wherein said photosensitive layer is a photosensitive layer having a surface which has been obtained by scratching in a test using a scratch tester provided with sapphire needles having a diameter of 0.5 mmΦ using a load of 30 g, and wherein an anodized film of 0.1 $g/m^2$ or more has been obtained by forming on the reverse surface of the substrate.

10. The planographic printing plate precursor according to claim 7, wherein said photosensitive layer is a photosensitive layer having a surface which has been obtained by scratching in a test using a scratch tester provided with sapphire needles having a diameter of 0.5 mmΦ using a load of 30 g, and wherein an anodized film of 0.1 $g/m^2$ or more has been obtained by forming on the reverse surface of the substrate.

11. A planographic printing plate precursor comprising:

an aluminum substrate which has been subjected to a roughening treatment and an anodizing treatment; and a photosensitive layer which is provided on a surface of said substrate, and which contains an infrared absorbing agent, a water-insoluble and alkali aqueous solution-soluble polymer compound, and whose solubility in an alkali developing solution varies by infrared laser exposure, wherein said substrate is obtained by electrochemically roughening an aluminum alloy plate which contains 0.05 to 0.5% by weight of Fe, 0.03 to 0.15% by weight of Si, 60 to 300 ppm of Cu, 100 to 400 ppm of Ti and 10 to 200 ppm of Mg, contains 1 to 100 ppm of at least one element selected from the group of elements consisting of K, Rb, Cs, Ca, Sr, Ba, Sc, Y, Nb, Ta, Mo, W, Tc, Re, Ru, Os, Co, Rh, Ir, Pd, Pt, Ag, Au, C, Ge, P, As, S, Se, Te and Po, and has an aluminum purity of 99.0% by weight or more, wherein micropores present in an anodized film on said substrate have a pore diameter of 1 to 5 nm and a pore density of $8\times10^{15}$ to $2\times10^{16}/m^2$.

* * * * *

UNITED STATES PATENT AND TRADEMARK OFFICE

CERTIFICATE OF CORRECTION

PATENT NO. : 6,638,686 B2
DATED : October 28, 2003
INVENTOR(S) : Hirokazu Sawada et al.

It is certified that error appears in the above-identified patent and that said Letters Patent is hereby corrected as shown below:

Title page,
Item [75], Inventors, fourth inventor's name should read:
-- Hirokazu Sakaki --

Signed and Sealed this

Twenty-fifth Day of May, 2004

JON W. DUDAS
*Acting Director of the United States Patent and Trademark Office*